(12) United States Patent
Kozuma et al.

(10) Patent No.: US 11,908,947 B2
(45) Date of Patent: Feb. 20, 2024

(54) SEMICONDUCTOR DEVICE

(71) Applicant: SEMICONDUCTOR ENERGY LABORATORY CO., LTD., Atsugi (JP)

(72) Inventors: Munehiro Kozuma, Kanagawa (JP); Takahiko Ishizu, Kanagawa (JP); Takeshi Aoki, Kanagawa (JP); Masashi Fujita, Tokyo (JP); Kazuma Furutani, Kanagawa (JP); Kousuke Sasaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/628,091

(22) PCT Filed: Jul. 27, 2020

(86) PCT No.: PCT/IB2020/057051
§ 371 (c)(1),
(2) Date: Jan. 18, 2022

(87) PCT Pub. No.: WO2021/024083
PCT Pub. Date: Feb. 11, 2021

(65) Prior Publication Data
US 2022/0262953 A1 Aug. 18, 2022

(30) Foreign Application Priority Data

Aug. 8, 2019 (JP) .................... 2019-146209
Aug. 30, 2019 (JP) .................... 2019-157623
(Continued)

(51) Int. Cl.
*G11C 7/10* (2006.01)
*H01L 29/786* (2006.01)
(Continued)

(52) U.S. Cl.
CPC ........ *H01L 29/7869* (2013.01); *G06F 7/5443* (2013.01); *G11C 7/1069* (2013.01);
(Continued)

(58) Field of Classification Search
CPC ............... H01L 29/7869; H01L 21/822; H01L 21/8234; H01L 27/04; H01L 27/088;
(Continued)

(56) References Cited

U.S. PATENT DOCUMENTS

2002/0032891 A1* 3/2002 Yada .................... G06F 11/1068
714/766
2008/0170028 A1* 7/2008 Yoshida .................... G09G 3/20
345/100
(Continued)

FOREIGN PATENT DOCUMENTS

JP 2019-036280 A 3/2019
JP 2019-046199 A 3/2019
(Continued)

OTHER PUBLICATIONS

International Search Report (Application No. PCT/IB2020/057051) dated Oct. 27, 2020.
(Continued)

*Primary Examiner* — Michael T Tran
(74) *Attorney, Agent, or Firm* — NIXON PEABODY LLP; Jeffrey L. Costellia

(57) ABSTRACT

A semiconductor device having a novel structure is provided. The semiconductor device includes a CPU and an accelerator. The accelerator includes a first memory circuit and an arithmetic circuit. The first memory circuit includes a first transistor. The first transistor includes a semiconductor layer containing a metal oxide in a channel formation region. The arithmetic circuit includes a second transistor. The second transistor includes a semiconductor layer containing
(Continued)

US 11,908,947 B2

Page 2 silicon in a channel formation region. The first transistor and the second transistor are provided to be stacked. The CPU includes a CPU core including a flip-flop provided with a backup circuit. The backup circuit includes a third transistor. The third transistor includes a semiconductor layer containing a metal oxide in a channel formation region.

15 Claims, 45 Drawing Sheets

(30) Foreign Application Priority Data

| | | |
|---|---|---|
| Nov. 29, 2019 | (JP) | 2019-216244 |
| Mar. 6, 2020 | (JP) | 2020-038446 |
| May 19, 2020 | (JP) | 2020-087645 |

(51) Int. Cl.
  *G06F 7/544* (2006.01)
  *G11C 7/12* (2006.01)
  *G11C 7/14* (2006.01)
  *H10B 12/00* (2023.01)
  *H01L 27/12* (2006.01)

(52) U.S. Cl.
  CPC ............. *G11C 7/1096* (2013.01); *G11C 7/12* (2013.01); *G11C 7/14* (2013.01); *H10B 12/50* (2023.02); *H01L 27/1225* (2013.01)

(58) Field of Classification Search
  CPC ... H01L 21/82; H01L 27/1225; G06F 7/5443; G06F 9/38; G06F 12/00; G11C 7/1069; G11C 7/1096; G11C 7/12; G11C 7/14; G11C 11/005; G11C 2211/5641; G11C 11/404; G11C 11/405; G11C 11/409; G11C 11/54; G11C 14/00; G11C 16/10; G11C 16/26; H10B 12/50; H10B 2/00; H03K 3/037; H03K 3/356
  USPC .......................................... 365/185.2, 189.05
  See application file for complete search history.

(56) References Cited

U.S. PATENT DOCUMENTS

| | | | |
|---|---|---|---|
| 2012/0063209 A1* | 3/2012 | Koyama | H10B 12/50 |
| | | | 365/230.06 |
| 2012/0269013 A1 | 10/2012 | Matsuzaki | |
| 2012/0287702 A1 | 11/2012 | Fujita | |
| 2012/0292613 A1 | 11/2012 | Shionoiri et al. | |
| 2012/0294070 A1 | 11/2012 | Matsuzaki et al. | |
| 2013/0162305 A1 | 6/2013 | Watanabe | |
| 2013/0191673 A1 | 7/2013 | Koyama et al. | |
| 2013/0261835 A1 | 10/2013 | Takahashi et al. | |
| 2013/0262828 A1 | 10/2013 | Yoneda | |
| 2014/0021474 A1 | 1/2014 | Ikeda | |
| 2014/0118378 A1 | 5/2014 | Koyama et al. | |
| 2014/0177345 A1 | 6/2014 | Yamazaki et al. | |
| 2014/0269014 A1 | 9/2014 | Ohmaru | |
| 2014/0340116 A1 | 11/2014 | Okamoto et al. | |
| 2014/0340134 A1 | 11/2014 | Shionoiri | |
| 2015/0187778 A1 | 7/2015 | Maehashi | |
| 2015/0256177 A1* | 9/2015 | Kozuma | G06F 1/16 |
| | | | 361/679.01 |
| 2015/0340094 A1 | 11/2015 | Tamura | |
| 2016/0028544 A1* | 1/2016 | Hyde | H04L 9/0662 |
| | | | 711/112 |
| 2016/0072621 A1* | 3/2016 | Oshida | G06F 21/554 |
| | | | 713/194 |
| 2016/0093557 A1* | 3/2016 | Nishikizawa | H01L 23/49562 |
| | | | 257/676 |
| 2016/0180019 A1* | 6/2016 | Van Rooyen | G16B 50/30 |
| | | | 702/19 |
| 2016/0191058 A1* | 6/2016 | Bisht | H01L 23/5286 |
| | | | 257/773 |
| 2016/0233866 A1 | 8/2016 | Ishizu et al. | |
| 2016/0253236 A1 | 9/2016 | Tsutsui | |
| 2017/0186364 A1* | 6/2017 | Okamoto | H01L 27/1225 |
| 2017/0205925 A1* | 7/2017 | Yamazaki | G02F 1/1368 |
| 2017/0221429 A1 | 8/2017 | Kobayashi et al. | |
| 2017/0221800 A1* | 8/2017 | Nishikizawa | H01L 23/4952 |
| 2017/0270882 A1 | 9/2017 | Mori et al. | |
| 2017/0285404 A1* | 10/2017 | Kubota | G02F 1/133553 |
| 2018/0031927 A1* | 2/2018 | Ikeda | G02F 1/1368 |
| 2018/0061335 A1* | 3/2018 | Fujita | G09G 3/3688 |
| 2018/0212610 A1* | 7/2018 | Bae | H03L 3/00 |
| 2018/0253818 A1* | 9/2018 | John | G06N 20/00 |
| 2019/0065253 A1* | 2/2019 | Bernat | G06F 9/50 |
| 2019/0205244 A1* | 7/2019 | Smith | G06F 3/065 |
| 2019/0373195 A1* | 12/2019 | Minagawa | H04N 25/75 |
| 2020/0126991 A1* | 4/2020 | Yamazaki | G11C 5/025 |
| 2020/0201603 A1 | 6/2020 | Kozuma et al. | |
| 2020/0303000 A1* | 9/2020 | Takahashi | G11C 16/26 |
| 2021/0073612 A1* | 3/2021 | Vahdat | G06N 3/048 |
| 2021/0081353 A1* | 3/2021 | Eno | G06F 15/781 |
| 2021/0090961 A1* | 3/2021 | Tanemura | H01L 29/78648 |
| 2021/0134801 A1 | 5/2021 | Harada et al. | |
| 2021/0142836 A1* | 5/2021 | Kurokawa | G06F 12/14 |
| 2021/0151486 A1 | 5/2021 | Kobayashi et al. | |
| 2021/0217891 A1* | 7/2021 | Kobayashi | H01L 29/78648 |
| 2021/0226063 A1* | 7/2021 | Yamazaki | H01L 29/78648 |
| 2021/0384353 A1 | 12/2021 | Endo et al. | |
| 2022/0085020 A1* | 3/2022 | Nagatsuka | G11C 11/405 |
| 2022/0188965 A1* | 6/2022 | Li | G06F 9/5077 |
| 2023/0053530 A1* | 2/2023 | Hammarlund | G06F 13/161 |

FOREIGN PATENT DOCUMENTS

| | | | | |
|---|---|---|---|---|
| JP | 2019-047006 A | 3/2019 | | |
| WO | WO-2016180977 A1 * | 11/2016 | ....... | G06K 19/07327 |
| WO | WO-2019/038664 | 2/2019 | | |
| WO | WO-2019055307 A1 * | 3/2019 | ............ | G06F 21/87 |
| WO | WO-2019/078924 | 4/2019 | | |
| WO | WO-2021/053453 | 3/2021 | | |

OTHER PUBLICATIONS

Written Opinion (Application No. PCT/IB2020/057051) dated Oct. 27, 2020.

* cited by examiner 910
(3 IGZO-FETs
1 MIM-Capacitor)

This work
FIG. 43B
Conventional
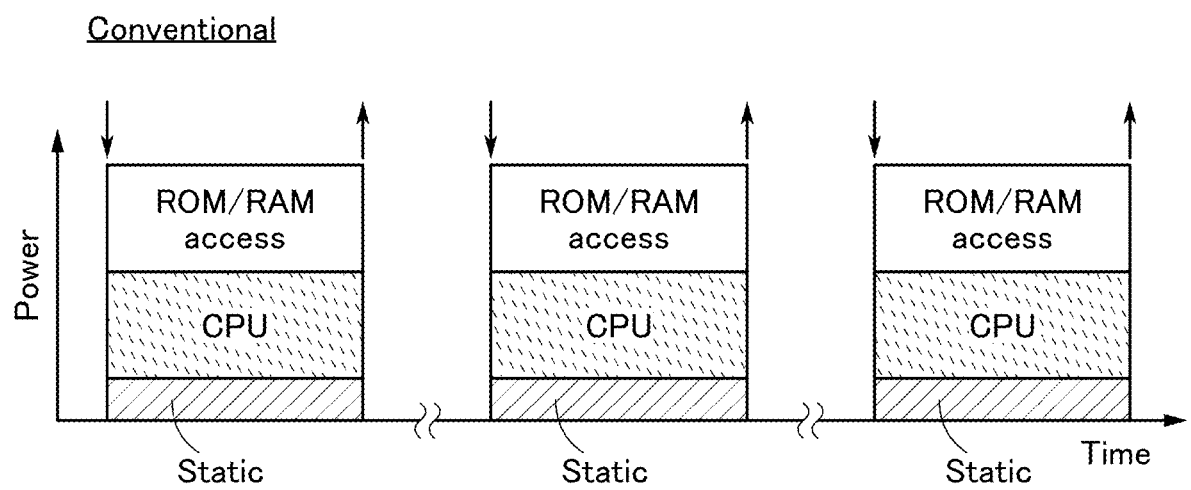

941

942

SEMICONDUCTOR DEVICE

TECHNICAL FIELD

In this specification, a semiconductor device and the like are described.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a storage device, a display system, an electronic device, a lighting device, an input device, an input/output device, a driving method thereof, and a manufacturing method thereof.

BACKGROUND ART

Electronic devices each including a semiconductor device including a CPU (Central Processing Unit) or the like have been widely used. In such electronic devices, techniques for improving the performance of the semiconductor devices have been actively developed to process a large volume of data at high speed. As a technique for achieving high performance, what is called an SoC (System on Chip) is given in which an accelerator such as a GPU (Graphics Processing Unit) and a CPU are tightly coupled. In the semiconductor device having higher performance by adopting an SoC, heat generation and an increase in power consumption become problems.

AI (Artificial Intelligence) technology requires a large amount of calculation and a large number of parameters and thus the amount of arithmetic operations is increased. An increase in the amount of arithmetic operations causes heat generation and an increase in power consumption. Thus, architectures for reducing the amount of arithmetic operations have been actively proposed. Typical architectures are Binary Neural Network (BNN) and Ternary Neural Network (TNN), which are effective especially in reducing circuit scale and power consumption (see Patent Document 1, for example). For example, in BNN, data that is originally expressed with 32-bit or 16-bit precision is compressed to binary data of "+1" or "−1", whereby the amount of calculation and the number of parameters can be greatly reduced. For another example, in TNN, data that is originally expressed with 32-bit or 16-bit precision is compressed to ternary data of "+1", "0", or "−1", whereby the amount of calculation and the number of parameters can be greatly reduced. BNN and TNN are effective in reducing circuit scale and power consumption and thus thought to be compatible with applications that are required to have low power consumption in limited hardware resources such as embedded chips.

REFERENCE

Patent Document

[Patent Document 1] PCT International Publication No. 2019/078924

SUMMARY OF THE INVENTION

Problems to be Solved by the Invention

Ternary data is used for a TNN arithmetic operation. In the case where ternary data is stored in an SRAM (Static RAM), the number of transistors in a memory cell is increased. Thus, miniaturization of a semiconductor device might be difficult. Furthermore, in an accelerator included in a semiconductor device, data stored in a memory is changed between binary data and ternary data in some cases. In that case, the number of transistors in a memory cell is increased if memory cells for data are prepared. Therefore, miniaturization of a semiconductor device might be difficult. The number of times of data transfer of a CPU dominates power consumption of a semiconductor device. Thus, it is important to inhibit an increase in the number of times of data transfer to suppress power consumption or heat generation of the semiconductor device.

An object of one embodiment of the present invention is to downsize a semiconductor device. Another object of one embodiment of the present invention is to reduce power consumption of a semiconductor device. Another object of one embodiment of the present invention is to suppress heat generation of a semiconductor device. Another object of one embodiment of the present invention is to reduce the number of times of data transfer between a CPU and a semiconductor device functioning as a memory. Another object is to provide a semiconductor device with a novel structure.

One embodiment of the present invention does not necessarily achieve all the above objects and only needs to achieve at least one of the objects. The descriptions of the above-described objects do not preclude the existence of other objects. Objects other than these objects will be apparent from the descriptions of the specification, the claims, the drawings, and the like, and objects other than these objects can be derived from the descriptions of the specification, the claims, the drawings, and the like.

Means for Solving the Problems

One embodiment of the present invention is a semiconductor device including a CPU and an accelerator. The accelerator includes a first memory circuit and an arithmetic circuit. The first memory circuit includes a first transistor. The first transistor includes a semiconductor layer containing a metal oxide in a channel formation region. The arithmetic circuit includes a second transistor. The second transistor includes a semiconductor layer containing silicon in a channel formation region. The first transistor and the second transistor are provided to be stacked.

One embodiment of the present invention is a semiconductor device including a CPU and an accelerator. The accelerator includes a first memory circuit, a driver circuit, and an arithmetic circuit. The first memory circuit includes a first transistor. The first transistor includes a semiconductor layer containing a metal oxide in a channel formation region. The driver circuit includes a writing circuit and a reading circuit. The writing circuit has a function of switching data to be written to the first memory circuit to a binary or ternary voltage value in accordance with a switching signal, a writing control signal, and a data signal and outputting the voltage value. The reading circuit has a function of switching the voltage value to binary or ternary data corresponding to the voltage level retained in the first memory circuit in accordance with a first reference voltage and a second reference voltage and reading out the data. The driver circuit and the arithmetic circuit each include a second transistor. The second transistor includes a semiconductor layer containing silicon in a channel formation region. The first transistor and the second transistor are provided to be stacked.

One embodiment of the present invention is a semiconductor device including a CPU and an accelerator. The accelerator includes a first memory circuit and an arithmetic circuit. The first memory circuit includes a first transistor. The first transistor includes a semiconductor layer containing a metal oxide in a channel formation region. The arithmetic circuit includes a second transistor. The second transistor includes a semiconductor layer containing silicon in a channel formation region. The CPU includes a CPU core including a flip-flop provided with a backup circuit. The backup circuit includes a third transistor. The third transistor includes a semiconductor layer containing a metal oxide in a channel formation region. The first transistor and the second transistor are provided to be stacked.

One embodiment of the present invention is a semiconductor device including a CPU and an accelerator. The accelerator includes a first memory circuit, a driver circuit, and an arithmetic circuit. The first memory circuit includes a first transistor. The first transistor includes a semiconductor layer containing a metal oxide in a channel formation region. The driver circuit includes a writing circuit and a reading circuit. The writing circuit has a function of switching data to be written to the first memory circuit to a binary or ternary voltage value in accordance with a switching signal, a writing control signal, and a data signal and outputting the voltage value. The reading circuit has a function of switching the voltage value to binary or ternary data corresponding to the voltage level retained in the first memory circuit in accordance with a first reference voltage and a second reference voltage and reading out the data. The arithmetic circuit includes a second transistor. The second transistor includes a semiconductor layer containing silicon in a channel formation region. The CPU includes a CPU core including a flip-flop provided with a backup circuit. The backup circuit includes a third transistor. The third transistor includes a semiconductor layer containing a metal oxide in a channel formation region. The first transistor and the second transistor are provided to be stacked.

In the semiconductor device of one embodiment of the present invention, the backup circuit preferably has a function of retaining data retained in the flip-flop in a state where supply of a power supply voltage is stopped when the CPU does not operate.

In the semiconductor device of one embodiment of the present invention, the arithmetic circuit is preferably a circuit that performs a product-sum operation.

In the semiconductor device of one embodiment of the present invention, the metal oxide preferably contains In, Ga, and Zn.

In the semiconductor device of one embodiment of the present invention, the first transistor is preferably electrically connected to a read bit line, and the read bit line is preferably electrically connected to the arithmetic circuit through a wiring provided substantially perpendicular to a surface of a substrate provided with the second transistor.

Note that other embodiments of the present invention will be shown in the description of the following embodiments and the drawings.

Effect of the Invention

One embodiment of the present invention can downsize a semiconductor device. Another embodiment of the present invention can reduce power consumption of a semiconductor device. Another embodiment of the present invention can suppress heat generation of a semiconductor device. Another embodiment of the present invention can reduce the number of times of data transfer between a CPU and a semiconductor device functioning as a memory. Alternatively, a semiconductor device with a novel structure can be provided.

The description of a plurality of effects does not disturb the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 43A and FIG. 43B are conceptual diagrams illustrating a change in power consumption during operation of semiconductor devices.

MODE FOR CARRYING OUT THE INVENTION

Figure 1A:
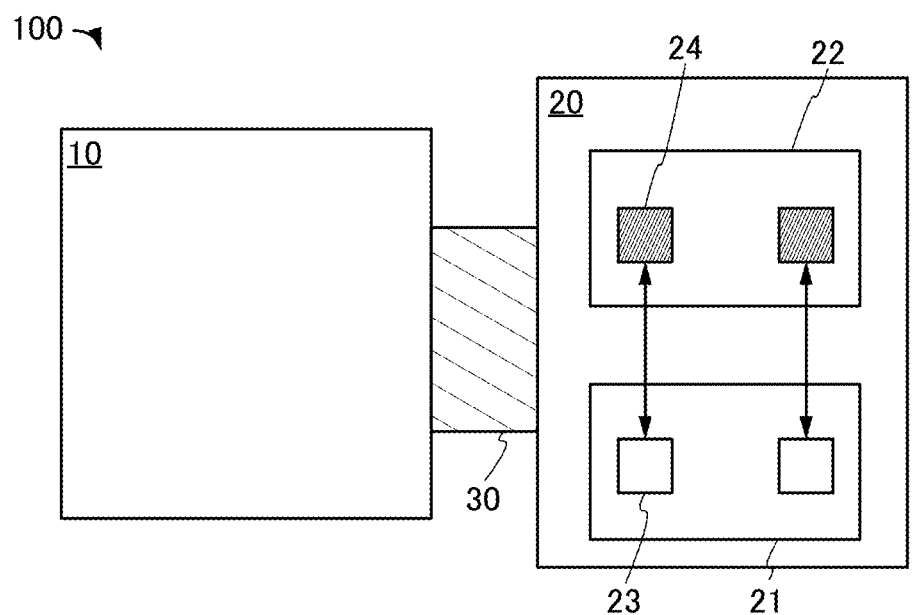
FIG. 1A and FIG. 1B are diagrams illustrating a structure example of a semiconductor device.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

The same components, components having similar functions, components made of the same material, components formed at the same time, and the like in the drawings are denoted by the same reference numerals, and repeated description thereof is skipped in some cases.

In this specification, for example, a power supply potential VDD may be abbreviated to a potential VDD, VDD, or the like. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "[n]", or "[m,n]" is sometimes added to the reference numerals. For example, a second wiring GL is referred to as a wiring GL[2].

Embodiment 1

Structures, operations, and the like of semiconductor devices of embodiments of the present invention will be described.

Note that in this specification and the like, a semiconductor device generally means a device that can function by utilizing semiconductor characteristics. A semiconductor element such as a transistor, a semiconductor circuit, an arithmetic device, and a storage device are each one embodiment of a semiconductor device. It can be sometimes said that a display device (a liquid crystal display device, a light-emitting display device, or the like), a projection device, a lighting device, an electro-optical device, a power storage device, a storage device, a semiconductor circuit, an imaging device, an electronic device, and the like include a semiconductor device.

Figure 1B:
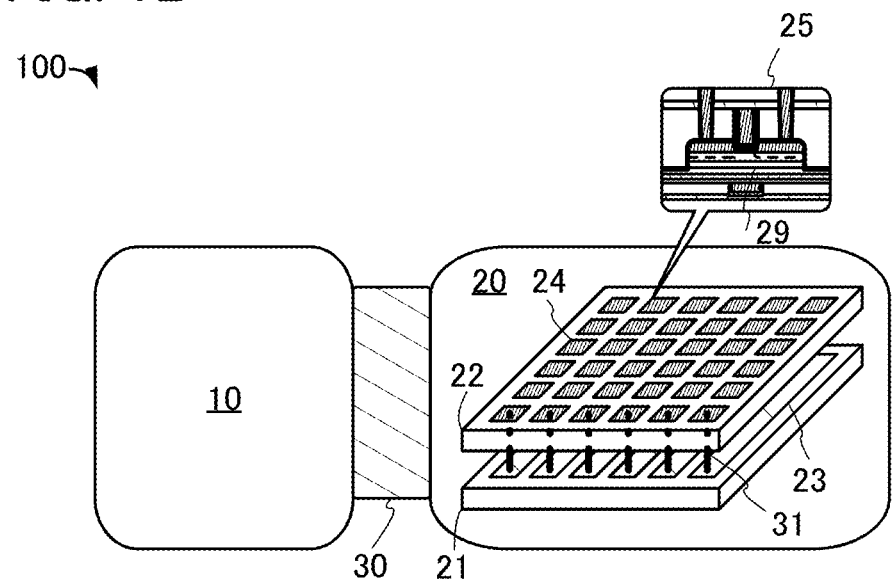

FIG. 1A and FIG. 1B are diagrams illustrating a semiconductor device 100 of one embodiment of the present invention. The semiconductor device 100 includes a CPU 10, an accelerator 20, and a bus 30. The accelerator 20 includes an arithmetic processing unit 21 and a memory unit 22. The arithmetic processing unit 21 includes an arithmetic circuit 23. The memory unit 22 includes a memory circuit 24. The memory unit 22 is referred to as a device memory or a shared memory in some cases. The memory circuit 24 includes a transistor 25 including a semiconductor layer 29 including a channel formation region. The arithmetic circuit 23 and the memory circuit 24 are electrically connected to each other through a wiring 31.

The CPU 10 has a function of performing general-purpose processing such as execution of an operating system, control of data, and execution of various arithmetic operations and programs. The CPU 10 includes one or a plurality of CPU cores. Each CPU core includes a data retention circuit capable of retaining data even when supply of a power supply voltage is stopped. The supply of a power supply voltage can be controlled by electric isolation by a power switch or the like from a power domain. Note that a power supply voltage is referred to as a drive voltage in some cases. As the data retention circuit, for example, a memory including a transistor (an OS transistor) containing an oxide semiconductor in a channel formation region is suitable. Note that an oxide semiconductor is also referred to as a metal oxide. The structure of the CPU core including the data retention circuit including the OS transistor is described in Embodiment 5.

The accelerator 20 has a function of executing a program (also referred to as kernel or a kernel program) called from a host program. The accelerator 20 can perform parallel processing of a matrix operation in graphics processing, parallel processing of a product-sum operation of a neural network, and parallel processing of a floating-point operation in a scientific computation, for example.

The memory unit 22 has a function of storing data to be processed by the accelerator 20. Specifically, the memory unit 22 can store data, such as weight data used for parallel processing of a product-sum operation of a neural network, input to or output from the arithmetic processing unit 21.

The memory circuit 24 is electrically connected to the arithmetic circuit 23 included in the arithmetic processing unit 21 through the wiring 31 and has a function of retaining a binary or ternary digital value. In the memory circuit 24, the semiconductor layer 29 of the transistor 25 is an oxide semiconductor. That is, the transistor 25 is an OS transistor. A memory including an OS transistor (hereinafter, also referred to as an OS memory) is suitable for the memory circuit 24.

A metal oxide has a band gap of 2.5 eV or wider; thus, an OS transistor has an extremely low off-state current. For example, the off-state current per micrometer in channel width at a source-drain voltage of 3.5 V and room temperature (25° C.) can be lower than $1 \times 10^{-20}$ A, lower than $1 \times 10^{-22}$ A, or lower than $1 \times 10^{-24}$ A. That is, the on/off ratio of drain current can be greater than or equal to 20 digits and less than or equal to 150 digits. Therefore, in an OS memory, the amount of electric charge that leaks from a retention node through the OS transistor is extremely small. Accordingly, the OS memory can function as a nonvolatile memory circuit; thus, power gating of the accelerator is enabled.

A highly integrated semiconductor device generates heat due to circuit drive in some cases. This heat makes the temperature of a transistor rise to change the characteristics of the transistor, and the field-effect mobility thereof might change or the operation frequency thereof might decrease, for example. Since an OS transistor has a higher heat resistance than a Si transistor, the field-effect mobility is less likely to change and the operation frequency is less likely to decrease due to a temperature change. Even when an OS transistor has a high temperature, it is likely to keep a property of the drain current increasing exponentially with respect to a gate-source voltage. Thus, the use of an OS transistor enables stable operation in a high-temperature environment.

A metal oxide used for an OS transistor is Zn oxide, Zn—Sn oxide, Ga—Sn oxide, In—Ga oxide, In—Zn oxide, In-M-Zn oxide (M is Ti, Ga, Y, Zr, La, Ce, Nd, Sn, or Hf), or the like. The use of a metal oxide containing Ga as M for the OS transistor is particularly preferable because the electrical characteristics such as field-effect mobility of the transistor can be made excellent by adjusting a ratio of elements. In addition, an oxide containing indium and zinc may contain one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical characteristics of the OS transistor, it is preferable that the metal oxide used in the semiconductor layer is a metal oxide having a crystal portion such as CAAC-OS, CAC-OS, or nc-OS. CAAC-OS is an abbreviation for c-axis-aligned crystalline oxide semiconductor. CAC-OS is an abbreviation for Cloud-Aligned Composite oxide semiconductor. In addition, nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. The function of allowing electrons to flow and the function of not allowing electrons to flow are separated, whereby both functions can be heightened to the maximum. In other words, when CAC-OS is used for a channel formation region of an OS transistor, a high on-state current and an extremely low off-state current can be both achieved.

Avalanche breakdown or the like is less likely to occur in some cases in an OS transistor than in a general Si transistor because, for example, a metal oxide has a wide band gap and thus electrons are less likely to be excited, and the effective mass of a hole is large. Therefore, for example, it may be possible to inhibit hot-carrier degradation or the like that is caused by avalanche breakdown. Since hot-carrier degradation can be inhibited, an OS transistor can be driven with a high drain voltage.

An OS transistor is an accumulation transistor in which electrons are majority carriers. Therefore, DIBL (Drain-Induced Barrier Lowering), which is one of short-channel effects, affects an OS transistor less than an inversion transistor having a pn junction (typically a Si transistor). In other words, an OS transistor has higher resistance against short channel effects than a Si transistor.

Owing to its high resistance against short channel effects, an OS transistor can have a reduced channel length without deterioration in reliability, which means that the use of an OS transistor can increase the degree of integration in a circuit. Although a reduction in channel length enhances a drain electric field, avalanche breakdown is less likely to occur in an OS transistor than in a Si transistor as described above.

Since an OS transistor has a high resistance against short-channel effects, a gate insulating film can be made thicker than that of a Si transistor. For example, even in a minute OS transistor whose channel length and channel width are less than or equal to 50 nm, a gate insulating film as thick as approximately 10 nm can be provided in some cases. When the gate insulating film is made thick, parasitic capacitance can be reduced and thus the operating speed of a circuit can be improved. In addition, when the gate insulating film is made thick, leakage current through the gate insulating film is reduced, resulting in a reduction in static current consumption.

As described above, the accelerator 20 can retain data owing to the memory circuit 24 that is an OS memory even when supply of a power supply voltage is stopped. Thus, the power gating of the accelerator 20 is possible and power consumption can be reduced greatly.

The memory circuit 24 formed using an OS transistor can be stacked over the arithmetic circuit 23 that can be formed using a Si CMOS. Consequently, the memory circuit 24 can be provided without an increase in the circuit area. The memory circuit 24 and the arithmetic circuit 23 are electrically connected to each other through the wiring 31 provided to extend in the direction substantially perpendicular to a surface of the substrate provided with the arithmetic circuit 23. Note that "substantially perpendicular" refers to a state where an arrangement angle is greater than or equal to 85° and less than or equal to 95°.

The memory circuit 24 can have a circuit structure of a NOSRAM. "NOSRAM (registered trademark)" is an abbreviation for "Nonvolatile Oxide Semiconductor RAM". A NOSRAM is a memory in which its memory cell is a 2-transistor (2T) or 3-transistor (3T) gain cell, and its access transistor is an OS transistor. An OS transistor has an extremely low current that flows between a source and a drain in an off state, that is, leakage current. The NOSRAM can be used as a nonvolatile memory by retaining electric charge corresponding to data in the memory circuit, using characteristics of an extremely low leakage current. In particular, the NOSRAM is capable of reading out retained data without destruction (non-destructive reading), and thus is suitable for parallel processing of a product-sum operation of a neural network in which only data reading operation is repeated many times.

The arithmetic processing unit 21 has a function of performing arithmetic processing using a digital value. The digital value is unlikely to be affected by noise. Thus, the accelerator 20 is suitable for performing arithmetic processing that requires a highly accurate arithmetic result. Note that the arithmetic processing unit 21 is preferably formed using a Si CMOS, i.e., a transistor containing silicon in a channel formation region (Si transistor). With this structure, an OS transistor can be stacked.

The arithmetic circuit 23 has a function of performing any one of an integer arithmetic operation, a single precision floating-point arithmetic operation, a double precision floating-point arithmetic operation, and the like using data of the digital value retained in each memory circuit 24 of the memory unit 22. The arithmetic circuit 23 has a function of repeating the same processing such as a product-sum operation.

Note that one arithmetic circuit 23 is provided for one read bit line of the memory circuit 24, i.e., for one column (Column-Parallel Calculation). With this structure, data of one row (all bit lines at the maximum) of the memory circuit 24 can be subjected to arithmetic processing in parallel. As compared to a product-sum operation using the CPU 10, there is no limitation on the data bus size (e.g., 32 bits) between the CPU and the memory, and thus the parallelism of an arithmetic operation can be greatly increased in Column-Parallel Calculation. Accordingly, an arithmetic efficiency regarding an enormous amount of arithmetic processing such as learning of a deep neural network (deep learning) or a scientific computation that performs a floating-point arithmetic operation, which is the AI technology, can be improved. Additionally, data output from the memory circuit 24 can be read out after completion of the arithmetic operation, whereby power required for memory access (data transfer between a CPU and a memory and an arithmetic operation in a CPU) can be reduced and heat generation and an increase in power consumption can be suppressed. Furthermore, when the physical distance between the arithmetic circuit 23 and the memory circuit 24 is decreased, for example, a wiring distance can be shortened by stacking layers, parasitic capacitance generated in a signal line can be reduced and low power consumption can be achieved.

The bus 30 electrically connects the CPU 10 to the accelerator 20. That is, data can be transferred between the CPU 10 and the accelerator 20 through the bus 30.

In one embodiment of the present invention, a semiconductor device functioning as an accelerator used for the AI technology or the like with an enormous amount of calculation and an enormous number of parameters can be downsized. Alternatively, in one embodiment of the present invention, the power consumption of a semiconductor device functioning as an accelerator used for the AI technology or the like with an enormous amount of calculation and an enormous number of parameters can be reduced. Alternatively, in one embodiment of the present invention, heat generation can be suppressed in a semiconductor device functioning as an accelerator used for the AI technology or the like with an enormous amount of calculation and an enormous number of parameters. Alternatively, in one embodiment of the present invention, in a semiconductor device functioning as an accelerator used for the AI technology or the like with an enormous amount of calculation and an enormous number of parameters, the number of times of data transfer between a CPU and a semiconductor device functioning as a memory can be reduced. In other words, a semiconductor device functioning as an accelerator used for the AI technology or the like with an enormous amount of calculation and an enormous number of parameters has a non-von Neumann architecture, and can perform parallel processing with extremely low power consumption as compared with a von Neumann architecture, in which power consumption increases with increasing processing speed.

Figure 2A:
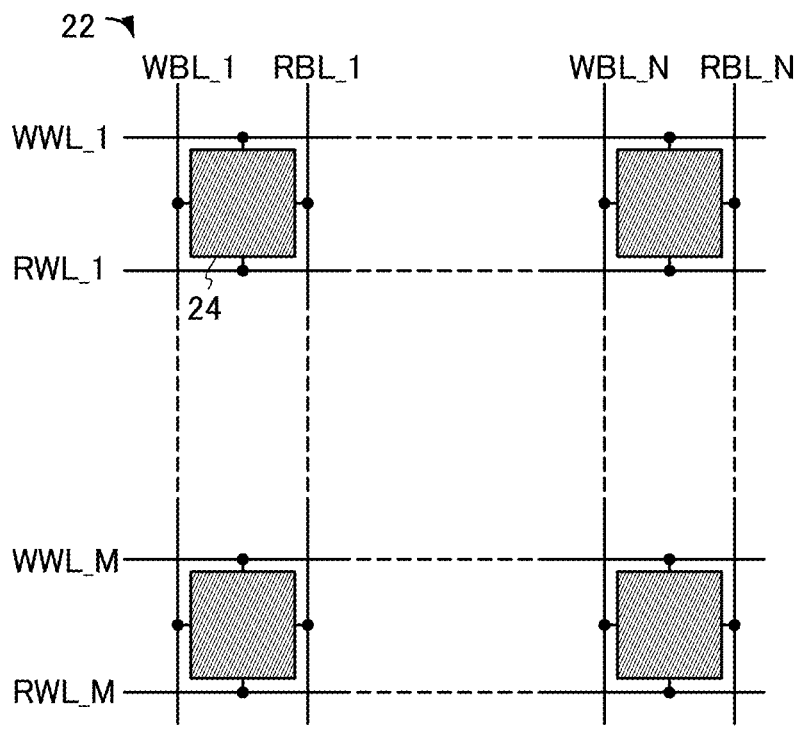
FIG. 2A and FIG. 2B are diagrams illustrating a structure example of a semiconductor device.

FIG. 2A is a diagram illustrating a circuit structure example applicable to the memory unit 22 included in the semiconductor device 100 of the present invention. FIG. 2A shows write word lines WWL_1 to WWL_M, read word lines RWL_1 to RWL_M, write bit lines WBL_1 to WBL_N, and read bit lines RBL_1 to RBL_N, which are arranged in a matrix of M rows and N columns (M and N are natural numbers greater than or equal to 2). The memory circuits 24 connected to the word lines and the bit lines are also shown.

Figure 2B:
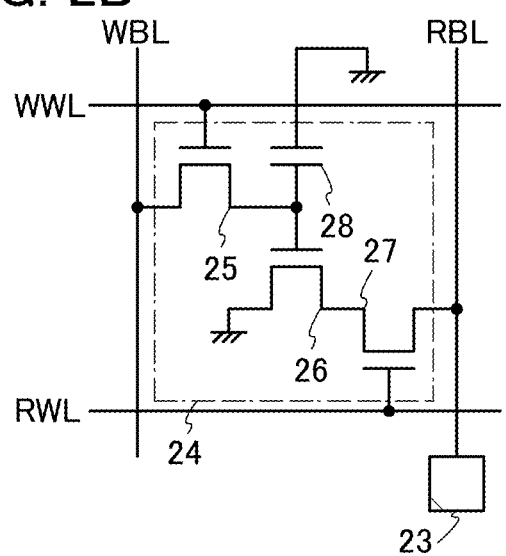

FIG. 2B is a diagram illustrating a circuit structure example applicable to the memory circuit 24. The memory circuit 24 includes the transistor 25, a transistor 26, a transistor 27, and a capacitor 28.

One of a source and a drain of the transistor 25 is connected to the write bit line WBL. A gate of the transistor 25 is connected to the write word line WWL. The other of the source and the drain of the transistor 25 is connected to one electrode of the capacitor 28 and a gate of the transistor 26. One of a source and a drain of the transistor 26 and the other electrode of the capacitor 28 are connected to a wiring for supplying a fixed potential such as a ground potential. The other of the source and the drain of the transistor 26 is connected to one of a source and a drain of the transistor 27. A gate of the transistor 27 is connected to the read word line RWL. The other of the source and the drain of the transistor 27 is connected to the read bit line RBL. As described above, the read bit line RBL is connected to the arithmetic circuit 23 through the wiring 31 or the like provided to extend in the direction substantially perpendicular to the surface of the substrate provided with the arithmetic circuit 23.

The circuit structure of the memory circuit 24 illustrated in FIG. 2B corresponds to a NOSRAM of a 3-transistor (3T) gain cell. The transistor 25 to the transistor 27 are OS transistors. An OS transistor has an extremely low current that flows between a source and a drain in an off state, that is, leakage current. The NOSRAM can be used as a nonvolatile memory by retaining electric charge corresponding to data in the memory circuit, using characteristics of an extremely low leakage current.

Figure 3A:
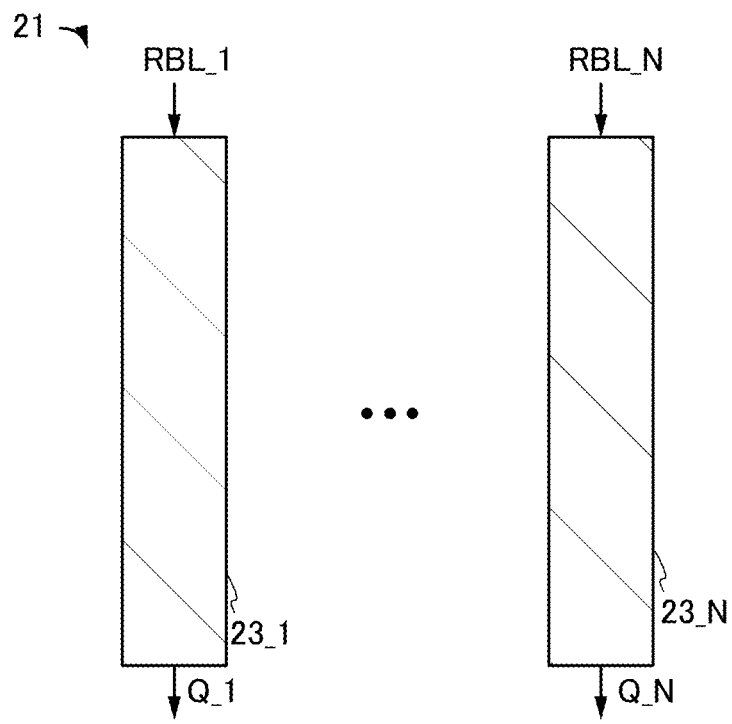
FIG. 3A and FIG. 3B are diagrams illustrating a structure example of a semiconductor device.

FIG. 3A is a diagram illustrating a circuit structure example applicable to the arithmetic processing unit 21 included in the semiconductor device 100 of the present invention. The arithmetic processing unit 21 includes N arithmetic circuits 23_1 to 23_N. The N arithmetic circuits 23_1 to 23_N are supplied with signals of the corresponding N read bit lines RBL_1 to RBL_N and output signals Q_1 to Q_N. The signals of the read bit lines RBL_1 to RBL_N may be amplified by a sense amplifier or the like and read out. The output signals Q_1 to Q_N correspond to data obtained by performing a product-sum operation using data retained in the memory circuit 24.

Figure 3B:
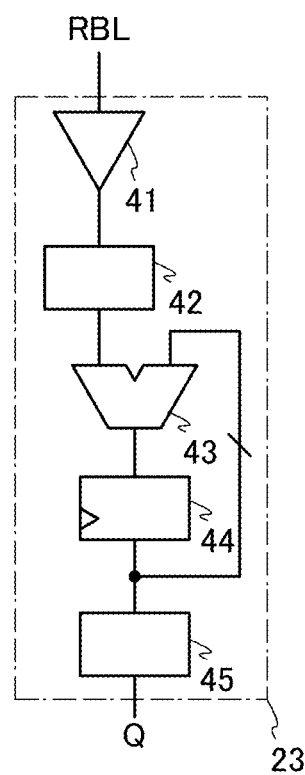
Figure 4:
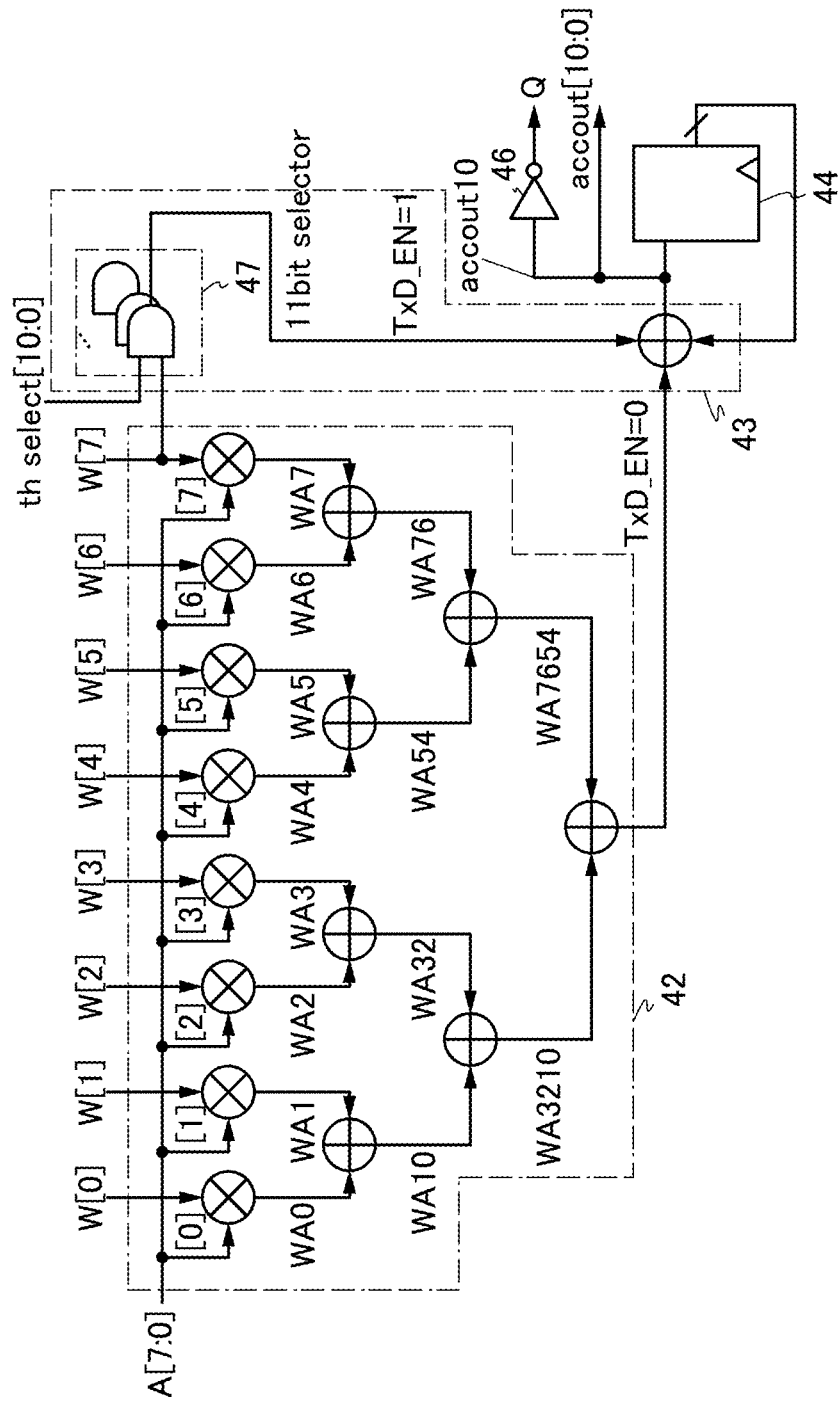
FIG. 4 is a diagram illustrating a structure example of a semiconductor device.

FIG. 3B is a diagram illustrating a circuit structure example of the arithmetic circuit 23 applicable to the arithmetic circuit 23_1 to the arithmetic circuit 23_N. FIG. 4 illustrates a circuit for executing arithmetic processing based on Binary Neural Network (BNN) architecture. The arithmetic circuit 23 includes a reading circuit 41 supplied with a signal of the read bit line RBL, a bit product-sum operation unit 42, an accumulator 43, a latch circuit 44, and an encoding circuit 45 for outputting the output signal Q.

FIG. 4 illustrates a detailed structure example of the structure of the arithmetic circuit 23 illustrated in FIG. 3B. FIG. 4 illustrates a structure example in which a product-sum operation of signals of eight bits (W[0] to W[7], A[0] to A[7]) is performed and a 1-bit output signal Q and an 11-bit output signal (accout[10:0]) are output. In FIG. 3B, one row is selected in one clock in memory access, so that calculation of addition of M products (=1 bit×M rows) is executed in M clocks. In the arithmetic circuit in FIG. 4, the same calculation of addition of M products can be executed by eight parallel operations×1 bit×M/8 rows, and thus M/8 clocks are needed. Accordingly, in the structure in FIG. 4, arithmetic operation time can be shortened by executing a product-sum operation in parallel, whereby arithmetic efficiency can be improved.

In FIG. 4, the bit product-sum operation unit 42 includes multipliers to which signals of eight bits (W[0] to W[7], A[0] to A[7]) are input and adders to which values obtained with the multipliers are input. As shown in FIG. 4, products of 1-bit signals calculated by eight parallel operations are denoted as WA0 to WA7, their sums are denoted as WA10, WA32, WA54, and WA76, and their sums are denoted as WA3210 and WA7654.

In FIG. 4, the accumulator 43 functioning as an adder outputs, to the latch circuit 44, the sum of a signal of the bit product-sum operation unit 42 and an output signal of the latch circuit 44. Note that in the accumulator 43, a signal input to the adder is changed depending on a control signal TxD_EN. When the control signal TxD_EN is 0 (TxD_EN=0), the sum of the signal of the bit product-sum operation unit 42 and the output signal of the latch circuit 44 is output to the latch circuit 44. When the control signal TxD_EN is 1 (TxD_EN=1), the sum of a signal of a logic circuit 47 (11-bit selector) and the output signal of the latch circuit 44 is output to the latch circuit 44.

In FIG. 4, after completion of the product-sum operation of the signals A[0] to A[7] and the signals W[0] to W[7], the logic circuit 47 formed using an AND circuit adds data for batch normalization. Specifically, the signal W[7] is added while switching signals (th select[10:0]) are changed. Note that as the data for batch normalization, any of the signals W[0] to W[6] other than the signal W[7] may be simultaneously read out and selected, for example. Batch normalization is an operation for adjusting the distribution of output data of each layer in a neural network to fit in a certain range. For example, as for image data frequently used in the arithmetic operation in a neural network, the distribution of data used in learning is likely to vary, and thus is different from the distribution of estimated data (input data) in some cases. In batch normalization, the distribution of input data to an intermediate layer of the neural network is normalized to Gaussian distribution with the mean 0 and the variance 1, whereby the learning accuracy in the neural network can be increased. In Binary Neural Network (BNN), an output result of each layer is binarized by activation; thus, when unbalanced data distribution with respect to the threshold value is inhibited, appropriate activation, i.e., data classification can be performed.

The latch circuit 44 retains an output signal (accout[10:0]) of the accumulator 43. By batch normalization, binary data to be transferred to a layer (NN layer) in the next neural network becomes the most significant bit of the product-sum operation result retained in the latch circuit 44. In the output signal (accout[10:0]), a signal of the most significant bit (accout10) denotes a sign of latch data obtained by an arithmetic operation with the two's complement, and in order to transfer a positive data thereof as 1 and a negative data as 0 to the next NN layer, the signal is inverted in an inverter circuit 46 functioning as an encoding circuit and output as the output signal Q. Since the signal Q is an output of the intermediate layer, the signal Q is temporarily retained in a buffer memory (also referred to as an input buffer) in the accelerator 20 and then used in an arithmetic operation in the next layer.

Figure 5A:
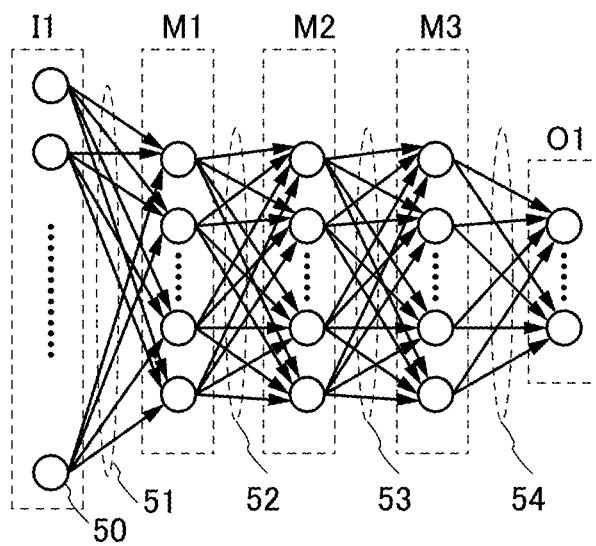
FIG. 5A and FIG. 5B are diagrams each illustrating a structure example of a semiconductor device.

FIG. 5A illustrates a hierarchical neural network based on the Binary Neural Network (BNN) architecture. FIG. 5A illustrates a fully connected neural network including neurons 50, one input layer (I1), three intermediate layers (M1 to M3), and one output layer (O1). Given that the number of neurons in the input layer I1 is 786, the number of neurons in each of the intermediate layers M1 to M3 is 256, and the number of neurons in the output layer O1 is 10, the number of connections in layers (a layer 51, a layer 52, a layer 53, and a layer 54) is (784×256)+(256×256)+(256×256)+(256× 10), i.e., 334336 in total. That is, the weight parameter required for the neural network calculation is approximately 330 K bits in total, whereby the memory capacity is adequate for a small system.

Figure 5B:
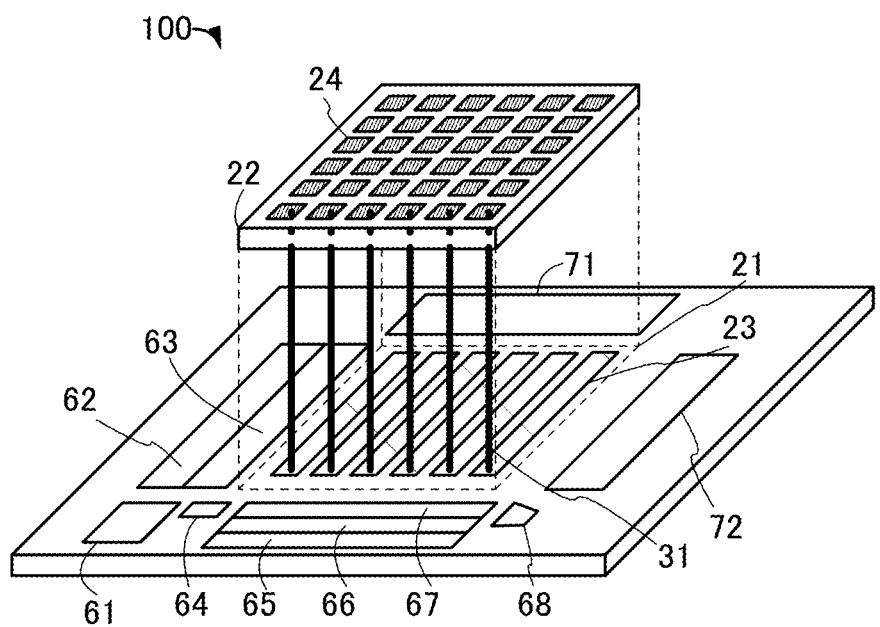

Next, FIG. 5B is a detailed block diagram of the semiconductor device 100 capable of the arithmetic operation of the neural network illustrated in FIG. 5A.

FIG. 5B illustrates structure examples of peripheral circuits for driving the structures illustrated in FIG. 1A and FIG. 1B, in addition to the arithmetic processing unit 21, the arithmetic circuit 23, the memory unit 22, the memory circuit 24, and the wiring 31 illustrated in FIG. 1A and FIG. 1B.

FIG. 5B illustrates a controller 61, a row decoder 62, a word line driver 63, a column decoder 64, a write driver 65, a precharge circuit 66, a sense amplifier 67, a selector 68, an input buffer 71, and an arithmetic control circuit 72.

Figure 6A:
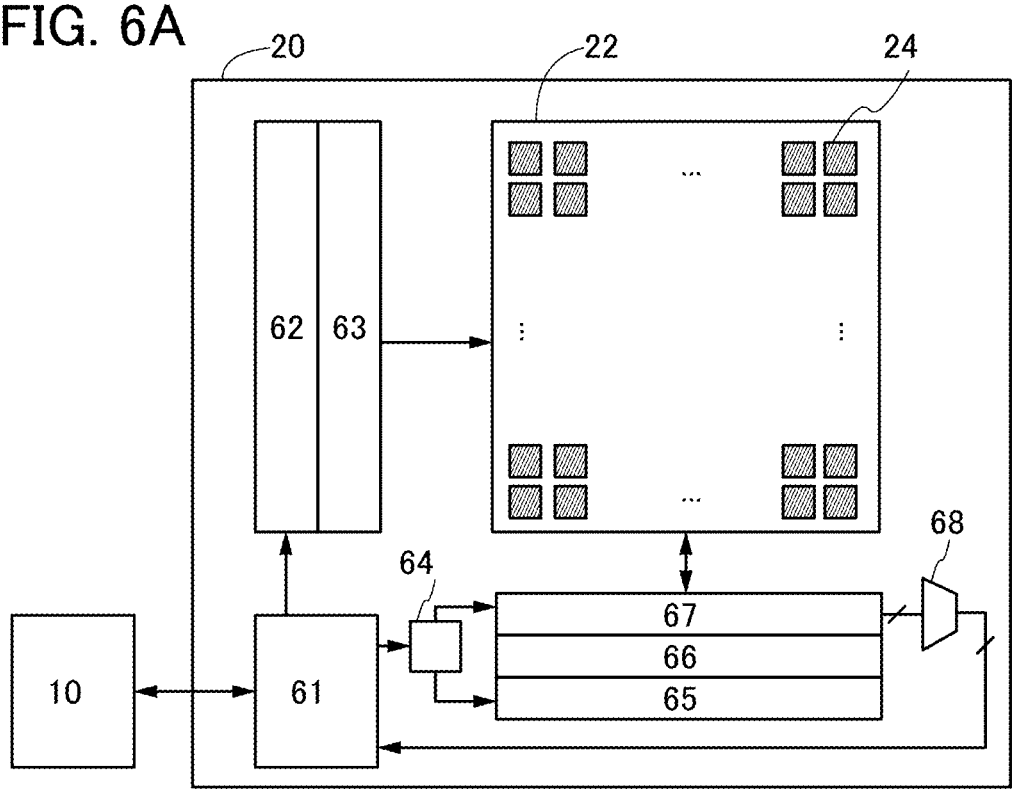
FIG. 6A and FIG. 6B are diagrams each illustrating a structure example of a semiconductor device.

FIG. 6A is a diagram of blocks for controlling the memory unit 22, which are extracted from the structure illustrated in FIG. 5B. FIG. 6A illustrates the controller 61, the row decoder 62, the word line driver 63, the column decoder 64, the write driver 65, the precharge circuit 66, the sense amplifier 67, and the selector 68.

The controller 61 processes an input signal from the outside and generates control signals of the row decoder 62 and the column decoder 64. The input signal from the outside is a control signal for controlling the memory unit 22, such as a write enable signal or a read enable signal. The controller 61 performs input and output of data written to the memory unit 22 or data read out from the memory unit 22 between the CPU 10 and the memory unit 22 through the bus.

The row decoder 62 generates a signal for driving the word line driver 63. The word line driver 63 generates signals to be supplied to the write word line WWL and the read word line RWL. The column decoder 64 generates signals for driving the sense amplifier 67 and the write driver 65. The sense amplifier 67 amplifies the potential of the read bit line RBL. The write driver generates signals for controlling the read bit line RBL and the write bit line WBL. The precharge circuit 66 has a function of precharging the read bit line RBL or the like. The signal read out from the memory circuit 24 of the memory unit 22 is input to the arithmetic circuit 23 and can be output through the selector 68. The selector 68 can sequentially read out data corresponding to the bus width and output necessary data to the CPU 10 or the like through the controller 61.

Figure 6B:
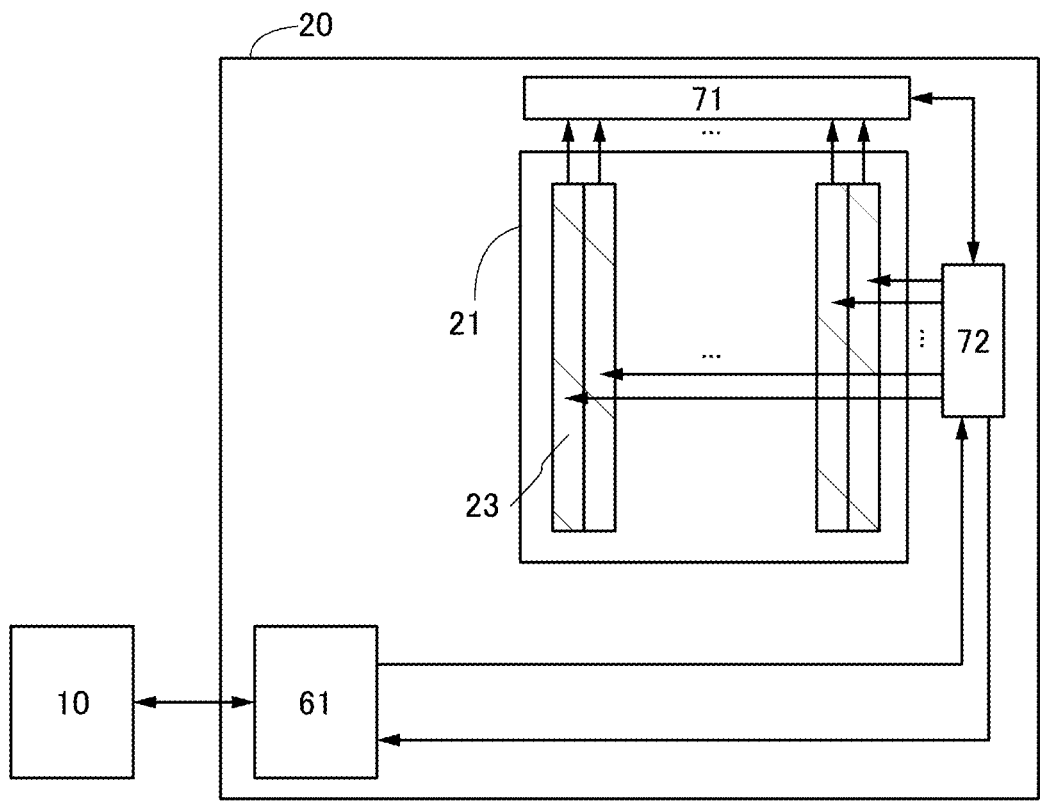

FIG. 6B is a diagram of blocks for controlling the arithmetic processing unit 21, which are extracted from the structure illustrated in FIG. 5B.

The controller 61 processes an input signal from the outside and generates a control signal of the arithmetic control circuit 72. The controller 61 generates a variety of signals for controlling the arithmetic circuit 23 included in the arithmetic processing unit 21. The controller 61 inputs and outputs data regarding the arithmetic result through the input buffer 71. With the use of the input buffer 71, parallel calculation of the number of bits greater than the data bus width of the CPU is possible. Furthermore, the number of times of transferring an enormous number of weight parameters between the CPU 10 and the accelerator 20 can be reduced, whereby power consumption can be reduced.

In one embodiment of the present invention, a semiconductor device functioning as an accelerator used for the AI technology or the like with an enormous amount of calculation and an enormous number of parameters can be downsized. Alternatively, in one embodiment of the present invention, the power consumption of a semiconductor device functioning as an accelerator used for the AI technology or the like with an enormous amount of calculation and an enormous number of parameters can be reduced. Alternatively, in one embodiment of the present invention, heat generation can be suppressed in a semiconductor device functioning as an accelerator used for the AI technology or the like with an enormous amount of calculation and an enormous number of parameters. Alternatively, in one embodiment of the present invention, in a semiconductor device functioning as an accelerator used for the AI technology or the like with an enormous amount of calculation and an enormous number of parameters, the number of times of data transfer between a CPU and a semiconductor device functioning as a memory can be reduced. In other words, a semiconductor device functioning as an accelerator used for the AI technology or the like with an enormous amount of calculation and an enormous number of parameters has a non-von Neumann architecture, and can perform parallel processing with extremely low power consumption as compared with a von Neumann architecture, in which power consumption increases with increasing processing speed.

Embodiment 2

Structures, operations, and the like of semiconductor devices of embodiments of the present invention will be described. Note that in this embodiment, structures denoted by the same reference numerals as those in the above embodiment are not repeatedly described in some cases.

Figure 7A:
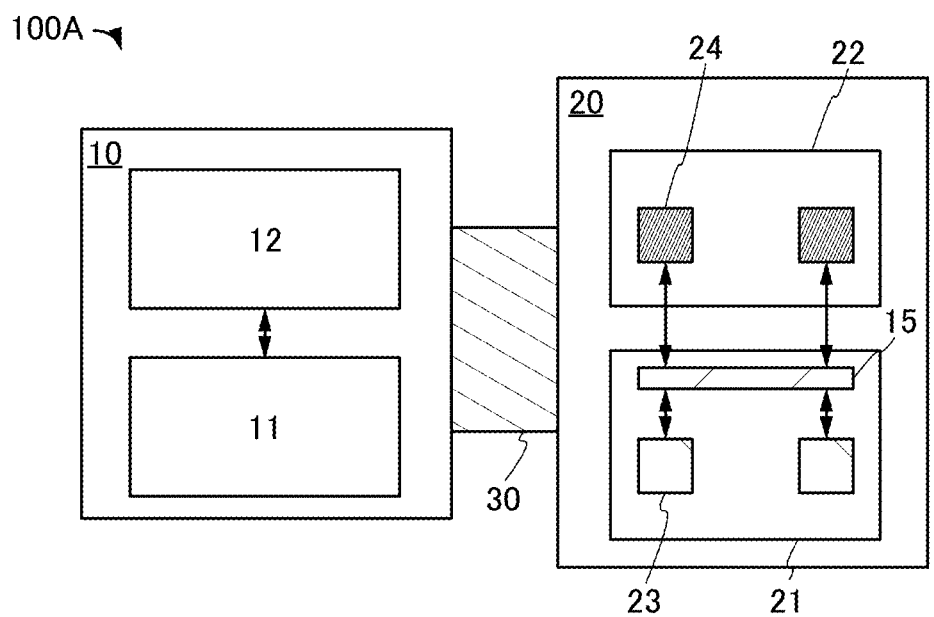
FIG. 7A and FIG. 7B are diagrams illustrating a structure example of a semiconductor device.
Figure 7B:
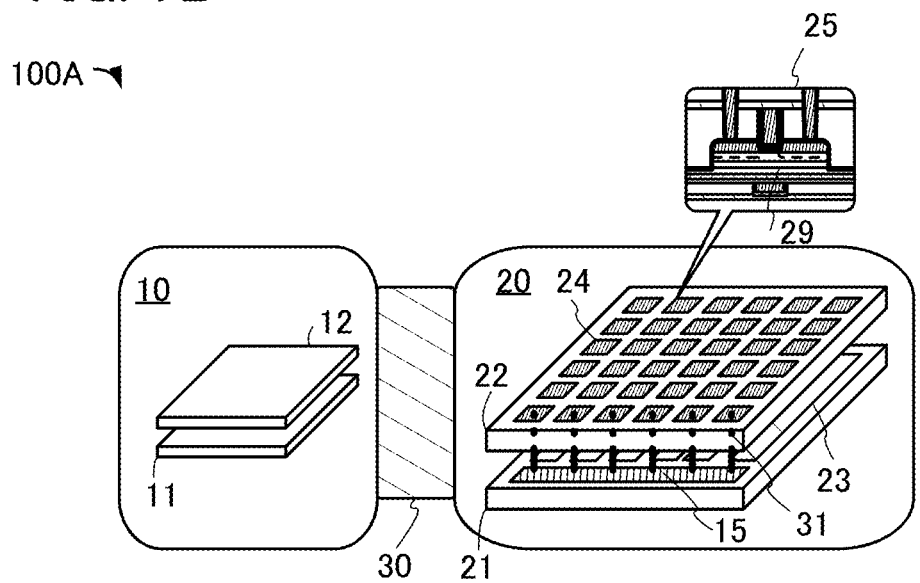

FIG. 7A and FIG. 7B are diagrams illustrating a semiconductor device 100A of one embodiment of the present invention. The semiconductor device 100A in FIG. 7A and FIG. 7B includes the CPU 10, the accelerator 20, and the bus 30, for example. The CPU 10 includes a CPU core 11 and a backup circuit 12. The accelerator 20 includes the arithmetic processing unit 21 and the memory unit 22. The arithmetic processing unit 21 includes a driver circuit 15 and the arithmetic circuit 23. The driver circuit 15 is a circuit for driving the memory unit 22. The memory unit 22 includes the memory circuit 24. The memory unit 22 is referred to as a device memory or a shared memory in some cases. The memory circuit 24 includes the transistor 25 including the semiconductor layer 29 including the channel formation region. The driver circuit 15 and the memory circuit 24 are electrically connected to each other through the wiring 31.

The memory circuit 24 is electrically connected to the arithmetic circuit 23 included in the arithmetic processing unit 21 through the wiring 31 and the driver circuit 15. The memory circuit 24 has a function of retaining binary or ternary data as an analog voltage value. With this structure, arithmetic processing based on the architecture such as Binary Neural Network (BNN) or Ternary Neural Network (TNN) can be efficiently performed in the arithmetic processing unit 21.

The driver circuit 15 includes a writing circuit for writing data to the memory unit 22 and a reading circuit for reading out data from the memory unit 22. The writing circuit has a function of switching data to be written to the memory circuit 24 of the memory unit 22 to a binary or ternary voltage value in accordance with a variety of signals such as a switching signal for switching writing of a binary or ternary data signal, a writing control signal, and a data signal. The writing circuit is formed using a logic circuit supplied with a plurality of signals. The reading circuit has a function of switching the voltage value retained in the memory circuit 24 of the memory unit 22 to a binary or ternary data signal in accordance with a plurality of reference voltages and reading out the signal. The reading circuit functions as a sense amplifier.

The memory circuit 24 formed using the OS transistor and the driver circuit 15 are electrically connected to each other through the wiring 31 provided to extend in the direction substantially perpendicular to the surface of the substrate provided with the driver circuit 15 and the arithmetic circuit 23. Note that "substantially perpendicular" refers to a state where an arrangement angle is greater than or equal to 85° and less than or equal to 95°. In the case where bit lines connected to the memory circuit 24 are a write bit line and a read bit line, these lines are preferably connected to the memory circuit 24 through different wirings. For example, the write bit line is connected to the writing circuit through a wiring (first wiring) provided substantially perpendicular to the surface of the substrate provided with the driver circuit 15 and the arithmetic circuit 23. For example, the read bit line is connected to the reading circuit through a wiring (second wiring) provided substantially perpendicular to the surface of the substrate provided with the driver circuit 15 and the arithmetic circuit 23.

Figure 8A:
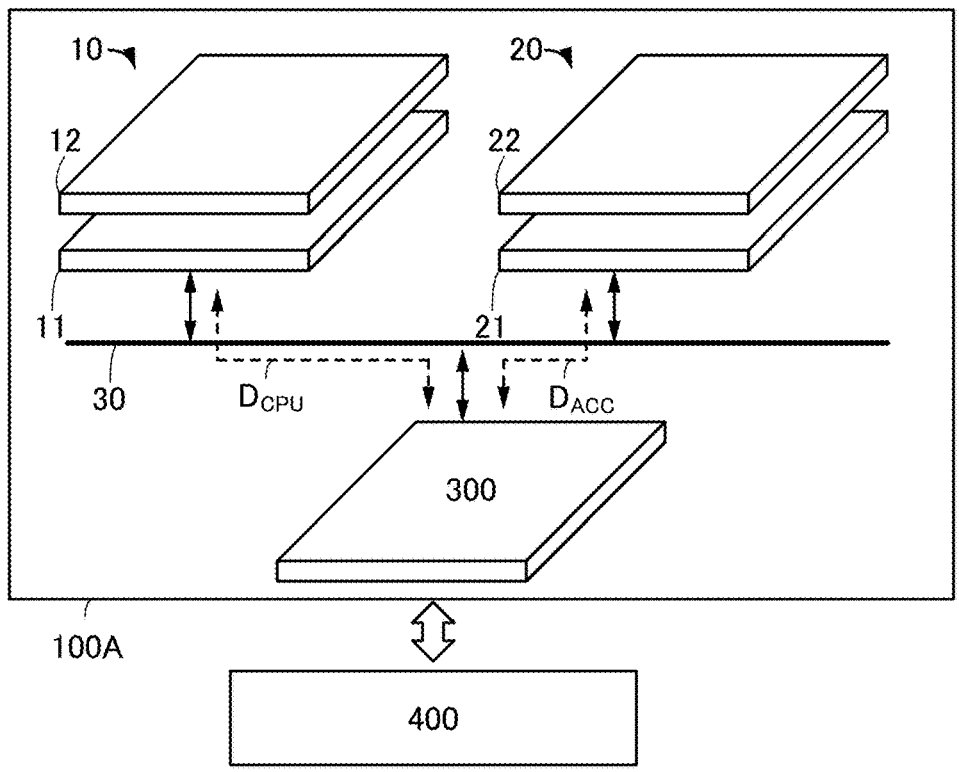
FIG. 8A and FIG. 8B are diagrams each illustrating a structure example of a semiconductor device.

Next, FIG. 8A illustrates an OS memory 300 connected to the bus 30 and a main memory 400 formed using a DRAM or the like, in addition to the structures of the semiconductor device 100A illustrated in FIG. 7A and FIG. 7B. In FIG. 8A, data transferred between the OS memory 300 and the CPU 10 is shown as data $D_{CPU}$. In FIG. 8A, data transferred between the OS memory 300 and the accelerator 20 is shown as data $D_{ACC}$.

As described above, in the structure of one embodiment of the present invention, the accelerator 20 can continuously retain a binary or ternary analog voltage value as data, and the arithmetic result obtained by an arithmetic operation in the arithmetic circuit can be output to the CPU 10. Thus, the data $D_{ACC}$ for the arithmetic processing from the OS memory 300 can be reduced. In addition, the amount of arithmetic processing of the CPU 10 can also be reduced, whereby the data $D_{CPU}$ transferred between the OS memory 300 and the CPU 10 can be reduced. That is, with the structure of one embodiment of the present invention, the number of access times through the bus 30 and the amount of transferred data can be reduced.

Note that the backup circuit 12 in the CPU 10 and the memory unit 22 in the accelerator 20 can be provided to stack with the CPU core 11 and the arithmetic processing unit 21, respectively, formed using a Si CMOS. Thus, these components can be provided without an increase in the circuit area.

A DOSRAM or a NOSRAM is preferable as a storage circuit that can be used for the OS memory 300. A DOSRAM (registered trademark) stands for "Dynamic Oxide Semiconductor Random Access Memory (RAM)", which is a RAM including a 1T (transistor) 1C (capacitor) memory cell. The DOSRAM, as well as the NOSRAM, is a memory utilizing a low off-state current of an OS transistor.

The DOSRAM is a DRAM formed using an OS transistor, and the DOSRAM is a memory that temporarily stores information sent from the outside. The DOSRAM includes a memory cell including an OS transistor and a reading circuit unit including a Si transistor (a transistor containing silicon in a channel formation region). Since the memory cell and the reading circuit unit can be provided in different layers that are stacked, the entire circuit area of the DOSRAM can be small. Furthermore, the DOSRAM can be efficiently placed, with a memory cell array being finely divided.

Figure 8B:
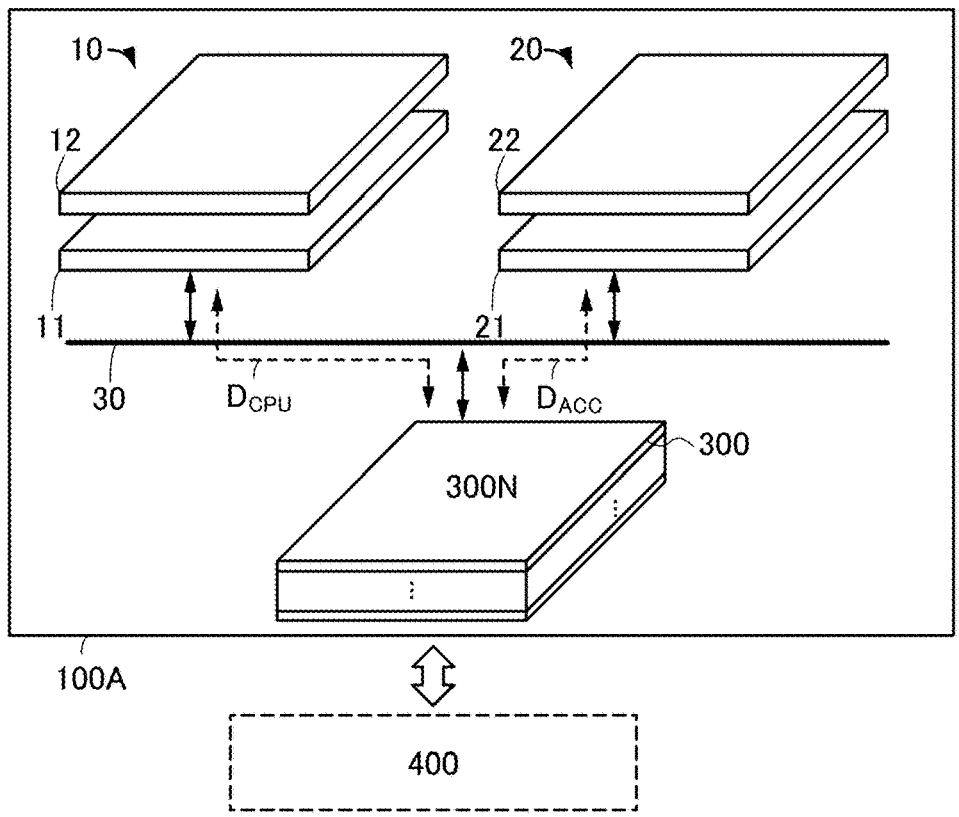

Note that as illustrated in FIG. 8B, layers including OS transistors as the OS memories 300 to form an OS memory 300N that is a highly integrated DOSRAM, whereby the memory capacity per unit area can be increased. In this case, the main memory 400 that is provided separately from the semiconductor device 100A can be omitted.

Figure 9:
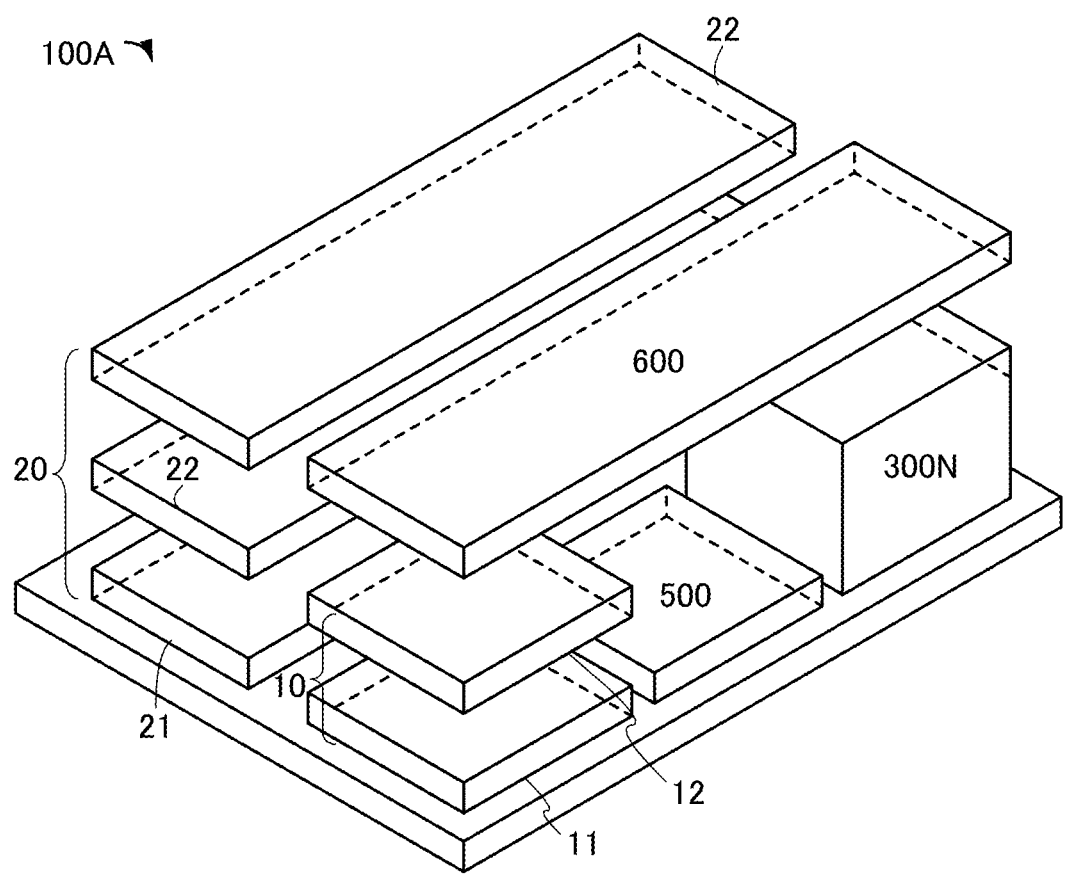
FIG. 9 is a diagram illustrating a structure example of a semiconductor device.

Parts of circuits included in the OS memory 300N, the CPU 10, and the accelerator 20 included in the semiconductor device 100A are formed using OS transistors, whereby the circuits can be integrated into one integrated circuit. FIG. 9 is a schematic view of the semiconductor device 100A functioning as an SoC in which the CPU 10, the accelerator 20, and the OS memory 300N are tightly coupled.

As illustrated in FIG. 9, in the CPU 10, the backup circuit 12 can be provided in the layer including an OS transistor over the CPU core 11. In addition, as illustrated in FIG. 9, in the accelerator 20, the memory unit 22 can be provided in the layer including an OS transistor over the arithmetic processing unit 21. Furthermore, as illustrated in FIG. 9, the stacked OS memory 300N like the memory unit 22 can be provided. In addition, a control circuit 500 including a Si transistor, a logic circuit 600 including an OS transistor, and the like can be provided. Note that the logic circuit 600 is preferably a simple logic circuit, such as a change-over switch, which can be replaced with an OS transistor, for example.

In the case of the SoC in which the circuits such as the CPU 10, the accelerator 20, and the memory 300N are tightly coupled as illustrated in FIG. 9, although heat generation is a problem, an OS transistor is preferable because the amount of change in the electrical characteristics due to heat is small as compared with a Si transistor. By integration of the circuits in the three-dimensional direction as illustrated in FIG. 9, parasitic capacitance can be reduced as compared with a stacked structure using a through silicon via (TSV), for example. Power consumption needed for charging and discharging wirings can be reduced. Consequently, the arithmetic processing efficiency can be improved.

Figure 10A:
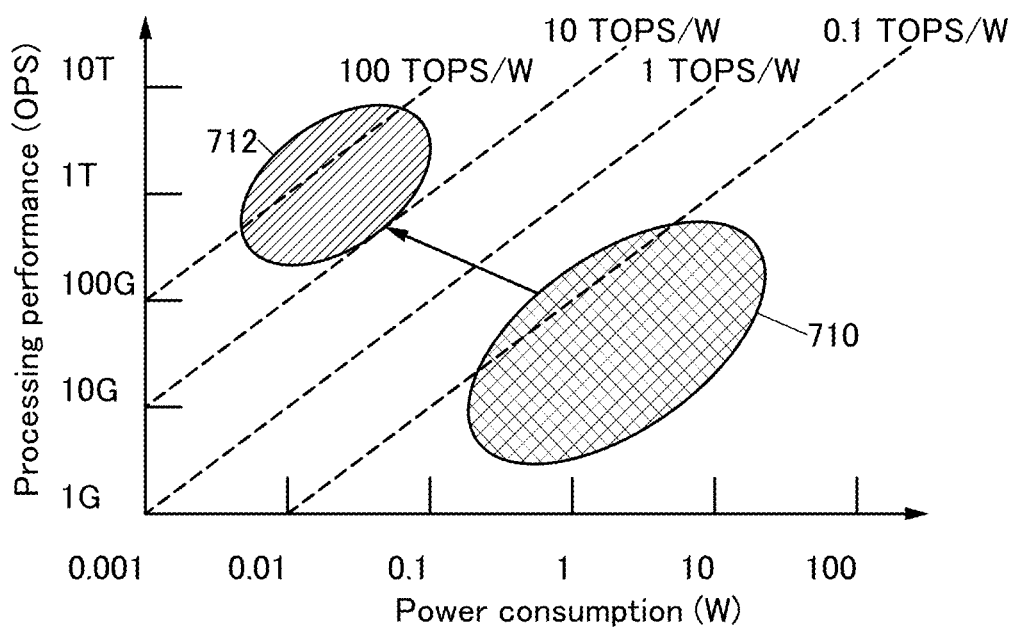
FIG. 10A, FIG. 10B, and FIG. 10C are diagrams showing relationships between processing performance and power consumption in semiconductor devices.

FIG. 10A illustrates the relationship between the processing performance (OPS: Operations Per Second) and the power consumption (W). In FIG. 10A, the vertical axis represents processing performance and the horizontal axis represents power consumption. Furthermore, in FIG. 10A, as indicators of the arithmetic efficiency, dashed lines indicating 0.1 TOPS/W (Tera Operations Per Second/W), 1 TOPS/W, 10 TOPS/W, and 100 TOPS/W are shown.

In FIG. 10A, a region 710 is a region including a conventional general-purpose AI accelerator (Neumann type) and a region 712 is a region including the semiconductor device of one embodiment of the present invention. Note that a CPU (Central Processing Unit), a GPU (Graphics Processing Unit), an FPGA (Field-Programmable Gate Array), and the like are included in the region 710, for example.

As shown in FIG. 10A, the power consumption of the semiconductor device of one embodiment of the present invention can be lower than that of the conventional general-purpose AI accelerator (Neumann type) by approximately two digits, and the processing performance can be increased greatly (e.g., 1000 times or more). Note that an arithmetic efficiency of 100 TOPS/W or more can be expected with the use of the semiconductor device of one embodiment of the present invention.

Figure 10B:
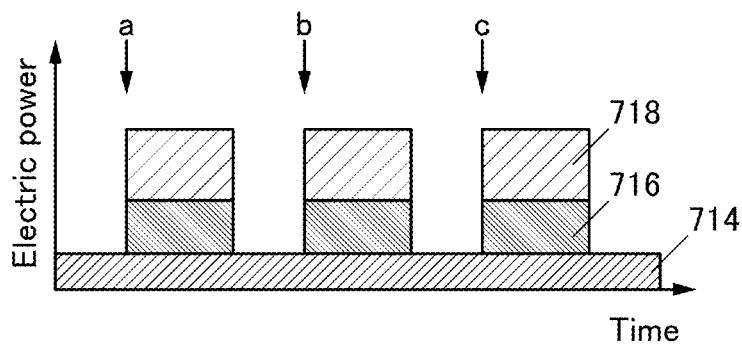

Here, specific examples of a conventional structure and a structure to which the semiconductor device of one embodiment of the present invention is applied are described with reference to FIG. 10B and FIG. 10C. FIG. 10B is an image diagram of power consumption of a semiconductor device having a conventional structure in image recognition, and FIG. 10C is an image diagram of power consumption of the semiconductor device having the structure of one embodiment of the present invention in image recognition.

Figure 10C:
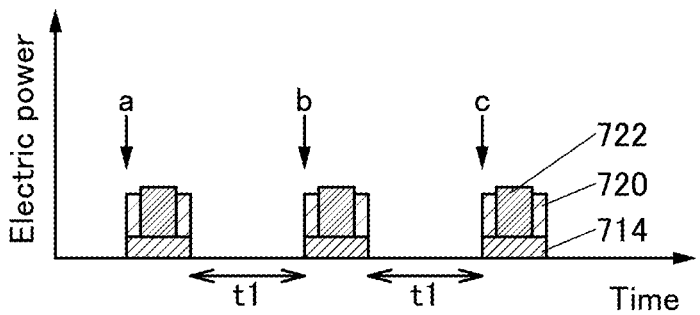

In each of FIG. 10B and FIG. 10C, the vertical axis represents electric power and the horizontal axis represents time. In FIG. 10B, electric power 714 indicates leakage electric power, electric power 716 indicates CPU electric power, and electric power 718 indicates memory electric power. In FIG. 10C, the electric power 714 indicates leakage electric power, electric power 720 indicates CPU electric power, and electric power 722 indicates accelerator electric power. Note that the electric power 722 includes electric power used by the arithmetic circuit and the memory circuit.

In each of FIG. 10B and FIG. 10C, an arrow a, an arrow b, and an arrow c indicate signals in image recognition. Note that it is assumed that input of the signals indicated by the arrow a, the arrow b, and the arrow c starts arithmetic processing such as image recognition in the semiconductor devices.

As shown in FIG. 10B, a certain amount of leakage electric power (the electric power 714) is generated with respect to time in the semiconductor device having the conventional structure. In contrast, as shown in FIG. 10C, in the case where the semiconductor device of one embodiment of the present invention is employed, leakage electric power (the electric power 714) is generated while CPU electric power (the electric power 720) and accelerator electric power (the electric power 722) are used, but normally-off drive without generation of leakage electric power (the electric power 714) is possible in a period where CPU electric power (the electric power 720) and accelerator electric power (the electric power 722) are not used (in a period t1 shown in FIG. 10C). Thus, power consumption can be greatly reduced. That is, an ultralow power semiconductor device can be provided.

Figure 11A:
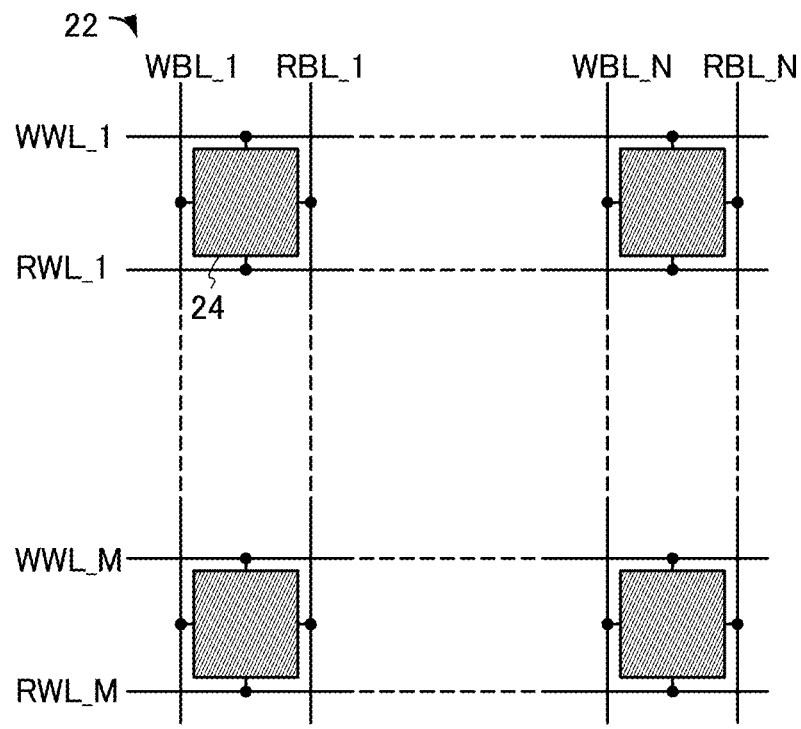
FIG. 11A and FIG. 11B are diagrams illustrating a structure example of a semiconductor device.

FIG. 11A is a diagram illustrating a circuit structure example applicable to the memory unit 22 included in the semiconductor device 100A of the present invention. FIG. 11A shows the write word lines WWL_1 to WWL_M, the read word lines RWL_1 to RWL_M, the write bit lines WBL_1 to WBL_N, and the read bit lines RBL_1 to RBL_N, which are arranged in a matrix of M rows and N columns (M and N are natural numbers greater than or equal to 2). The memory circuits 24 connected to the word lines and the bit lines are also shown.

Figure 11B:
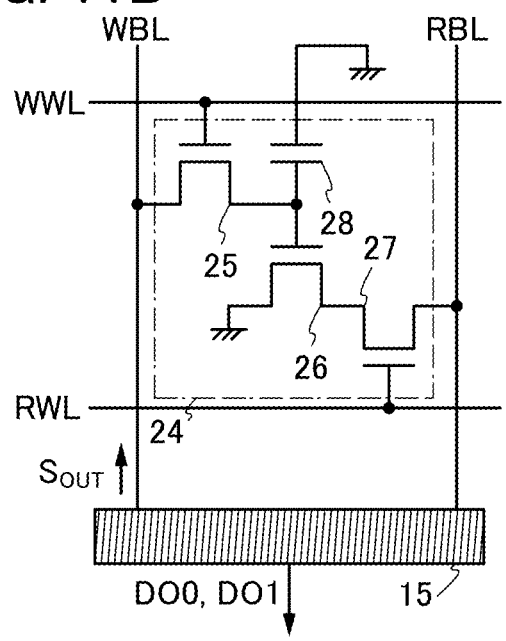

FIG. 11B is a diagram illustrating a circuit structure example applicable to the memory circuit 24. The memory circuit 24 includes the transistor 25, the transistor 26, the transistor 27, and the capacitor 28.

One of a source and a drain of the transistor 25 is connected to the write bit line WBL. A gate of the transistor 25 is connected to the write word line WWL. The other of the source and the drain of the transistor 25 is connected to one electrode of the capacitor 28 and a gate of the transistor 26. One of a source and a drain of the transistor 26 and the other electrode of the capacitor 28 are connected to a wiring for supplying a fixed potential such as a ground potential. The other of the source and the drain of the transistor 26 is connected to one of a source and a drain of the transistor 27. A gate of the transistor 27 is connected to the read word line RWL. The other of the source and the drain of the transistor 27 is connected to the read bit line RBL. As described above, the write bit line WBL and the read bit line RBL are connected to the driver circuit 15 through the wiring or the like provided to extend in the direction substantially perpendicular to the surface of the substrate provided with the arithmetic circuit 23. The driver circuit 15 outputs a data signal $S_{OUT}$ that is a binary or ternary analog voltage value. The driver circuit 15 is supplied with a voltage of the read bit line RBL corresponding to data read out from the memory circuit 24, and outputs data signals DO0 and DO1 corresponding to the voltage.

The circuit structure of the memory circuit 24 illustrated in FIG. 11B corresponds to a NOSRAM of a 3-transistor (3T) gain cell. The transistor 25 to the transistor 27 are OS transistors. An OS transistor has an extremely low current that flows between a source and a drain in an off state, that is, leakage current. The NOSRAM can be used as a nonvolatile memory by retaining electric charge corresponding to data in the memory circuit, using characteristics of an extremely low leakage current. Note that each transistor may have a structure with a back gate. With the back gate, the transistor characteristics can be improved.

Figure 12A:
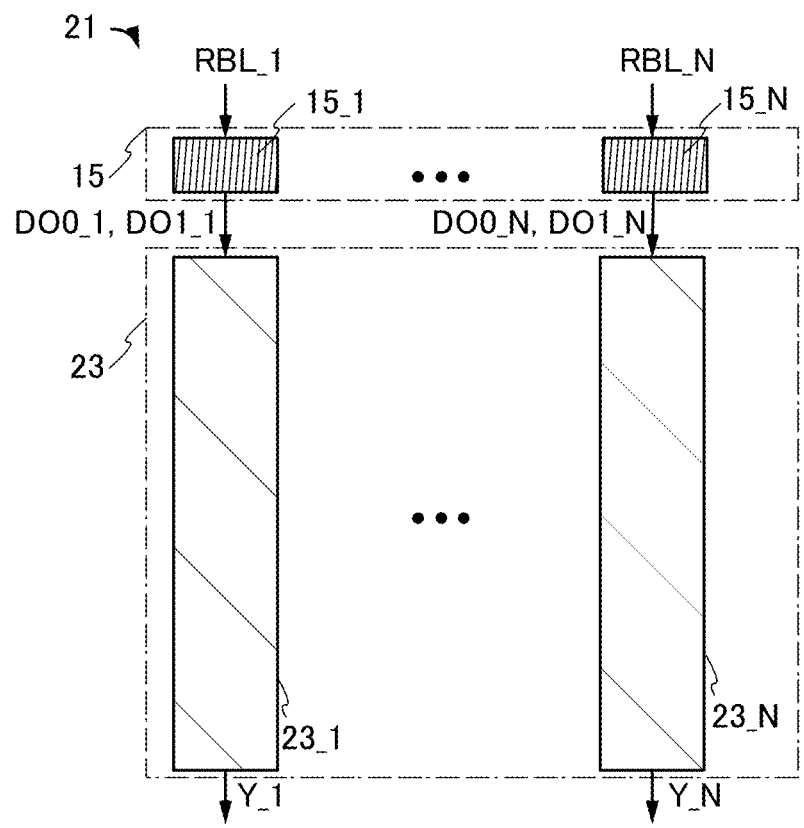
FIG. 12A and FIG. 12B are diagrams illustrating a structure example of a semiconductor device.

FIG. 12A is a diagram illustrating a circuit structure example applicable to the arithmetic processing unit 21 included in the semiconductor device 100A of the present invention. The arithmetic processing unit 21 includes the driver circuit 15 and the arithmetic circuit 23. The driver circuit 15 includes N driver circuits 15_1 to 15_N. The arithmetic circuit 23 includes N arithmetic circuits 23_1 to 23_N. The N driver circuits 15_1 to 15_N are supplied with signals of the corresponding N read bit lines RBL_1 to RBL_N and output data signals DO0_1 to DO0_N and/or data signals DO1_1 to DO1_N. The data signals DO0_1 to DO0_N and/or the data signals DO1_1 to DO1_N are input to the arithmetic circuits 23_1 to 23_N and output signals Y_1 to Y_N are obtained. The output signals Y_1 to Y_N correspond to data obtained by performing a product-sum operation using data retained in the memory circuit 24.

Figure 12B:
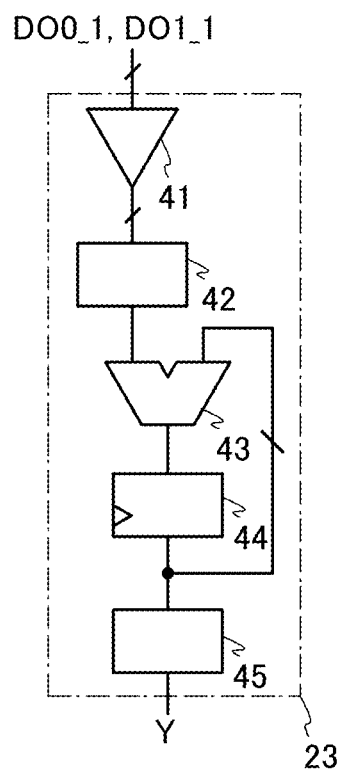
Figure 13:
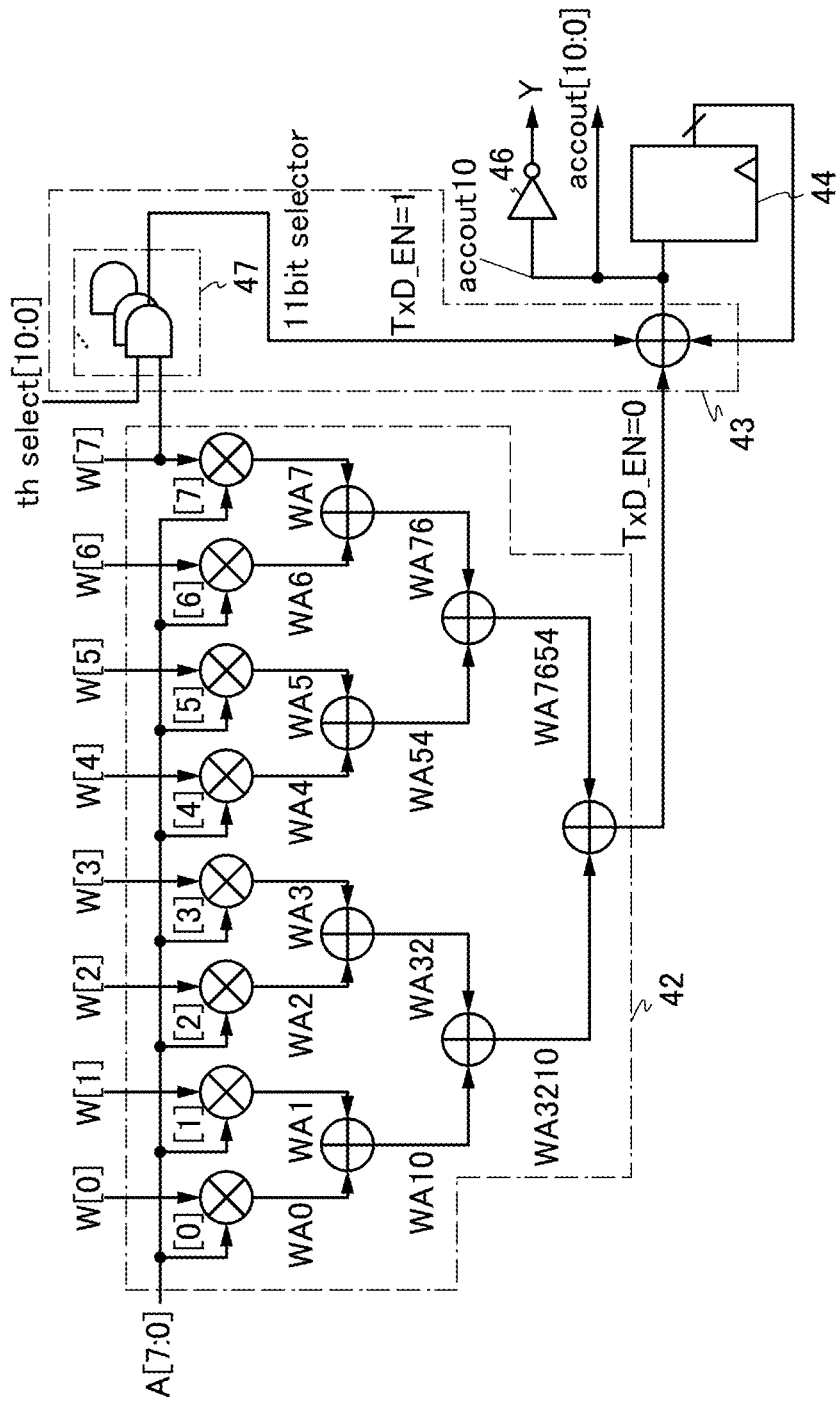
FIG. 13 is a diagram illustrating a structure example of a semiconductor device.

FIG. 12B is a diagram illustrating a circuit structure example of the arithmetic circuit 23 applicable to the arithmetic circuit 23_1 to the arithmetic circuit 23_N. FIG. 13 illustrates a circuit for executing arithmetic processing based on Binary Neural Network (BNN) or Ternary Neural Network (TNN) architecture. The arithmetic circuit 23 includes the reading circuit 41 supplied with the data signal DO0 and/or the data signal DO1, the bit product-sum operation unit 42, the accumulator 43, the latch circuit 44, and the encoding circuit 45 for outputting the output signal Y.

FIG. 13 illustrates a detailed structure example of the structure of the arithmetic circuit 23 illustrated in FIG. 12B. FIG. 13 illustrates a structure example in which a product-sum operation of signals of eight bits (W[0] to W[7], A[0] to A[7]) is performed and the output signal Y and an 11-bit output signal (accout[10:0]) are output. In FIG. 12B, one row is selected in one clock in memory access, so that calculation of addition of M products (=1 bit×M rows) is executed in M clocks. In the arithmetic circuit in FIG. 13, the same calculation of addition of M products can be executed by eight parallel operations×1 bit×M/8 rows, and thus M/8 clocks are needed. Accordingly, in the structure in FIG. 13, arithmetic operation time can be shortened by executing a product-sum operation in parallel, whereby arithmetic efficiency can be improved.

In FIG. 13, the bit product-sum operation unit 42 includes multipliers to which signals of eight bits (W[0] to W[7], A[0] to A[7]) are input and adders to which values obtained with the multipliers are input. As shown in FIG. 13, products of 1-bit signals calculated by eight parallel operations are denoted as WA0 to WA7, their sums are denoted as WA10, WA32, WA54, and WA76, and their sums are denoted as WA3210 and WA7654.

In FIG. 13, the accumulator 43 functioning as an adder outputs the sum of a signal of the bit product-sum operation unit 42 and an output signal of the latch circuit 44 to the latch circuit 44. Note that in the accumulator 43, a signal input to the adder is changed depending on the control signal TxD_EN. When the control signal TxD_EN is 0 (TxD_EN=0), the sum of the signal of the bit product-sum operation unit 42 and the output signal of the latch circuit 44 is output to the latch circuit 44. When the control signal TxD_EN is 1 (TxD_EN=1), the sum of the signal of the logic circuit 47 (11-bit selector) and the output signal of the latch circuit 44 is output to the latch circuit 44.

In FIG. 13, after completion of the product-sum operation of the signals A[0] to A[7] and the signals W[0] to W[7], the logic circuit 47 formed using an AND circuit adds data for batch normalization, specifically, the signal W[7] while switching signals (th select[10:0]) are changed. Note that as the data for batch normalization, any of the signals W[0] to W[6] other than the signal W[7] may be simultaneously read out and selected, for example. Batch normalization is an operation for adjusting the distribution of output data of each layer in a neural network to fit in a certain range. For example, as for image data frequently used in the arithmetic operation in a neural network, the distribution of data used in learning is likely to vary, and thus is different from the distribution of estimated data (input data) in some cases. In batch normalization, the distribution of input data to an intermediate layer of the neural network is normalized to Gaussian distribution with the mean 0 and the variance 1, whereby the learning accuracy in the neural network can be increased. In Binary Neural Network (BNN), an output result of each layer is binarized by activation; thus, when unbalanced data distribution with respect to the threshold value is inhibited, appropriate activation, i.e., data classification can be performed.

The latch circuit 44 retains the output signal (accout[10:0]) of the accumulator 43. By batch normalization, binary data to be transferred to a layer (NN layer) in the next neural network becomes the most significant bit of the product-sum operation result retained in the latch circuit 44. In the output signal (accout[10:0]), a signal of the most significant bit (accout10) denotes a sign of latch data obtained by an arithmetic operation with the two's complement, and in order to transfer a positive data thereof as 1 and a negative data as 0 to the next NN layer, the signal is inverted in the inverter circuit 46 functioning as an encoding circuit and output as the output signal Y. Since the signal Y is an output of the intermediate layer, the signal Y is temporarily retained in a buffer memory (also referred to as an input buffer) in the accelerator 20 and then used in an arithmetic operation in the next layer.

Figure 14A:
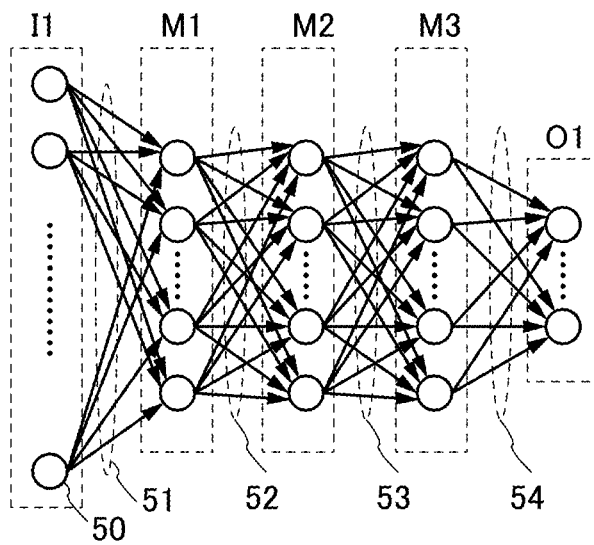
FIG. 14A and FIG. 14B are diagrams each illustrating a structure example of a semiconductor device.

FIG. 14A illustrates a hierarchical neural network based on the Binary Neural Network (BNN) or Ternary Neural Network (TNN) architecture. FIG. 14A illustrates a fully connected neural network including neurons 50, one input layer (I1), three intermediate layers (M1 to M3), and one output layer (O1). Given that the number of neurons in the input layer I1 is 786, the number of neurons in each of the intermediate layers M1 to M3 is 256, and the number of neurons in the output layer O1 is 10, in Binary Neural Network (BNN), for example, the number of connections in layers (a layer 51, a layer 52, a layer 53, and a layer 54) is (784×256)+(256×256)+(256×256)+(256×10), i.e., 334336 in total. That is, the weight parameter required for the neural network calculation is approximately 330 K bits in total, whereby the memory capacity is adequate for a small system.

Figure 14B:
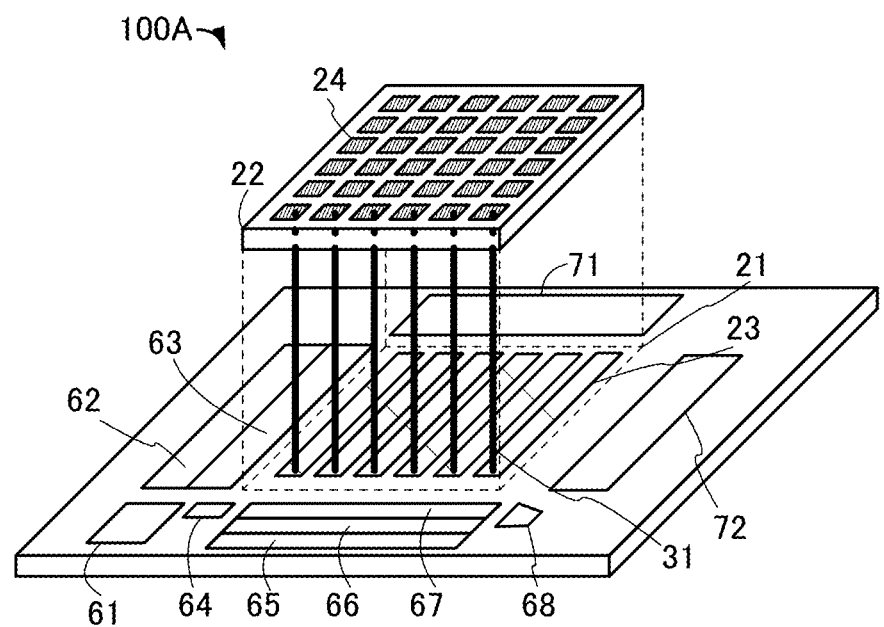

Next, FIG. 14B is a detailed block diagram of the semiconductor device 100A capable of the arithmetic operation of the neural network illustrated in FIG. 14A.

FIG. 14B illustrates structure examples of peripheral circuits for driving the structures illustrated in FIG. 7A and FIG. 7B, in addition to the arithmetic processing unit 21, the arithmetic circuit 23, the memory unit 22, the memory circuit 24, and the wiring 31 illustrated in FIG. 7A and FIG. 7B.

FIG. 14B illustrates the controller 61, the row decoder 62, the word line driver 63, the column decoder 64, the write driver 65, the precharge circuit 66, the sense amplifier 67, the selector 68, the input buffer 71, and the arithmetic control circuit 72.

Figure 15A:
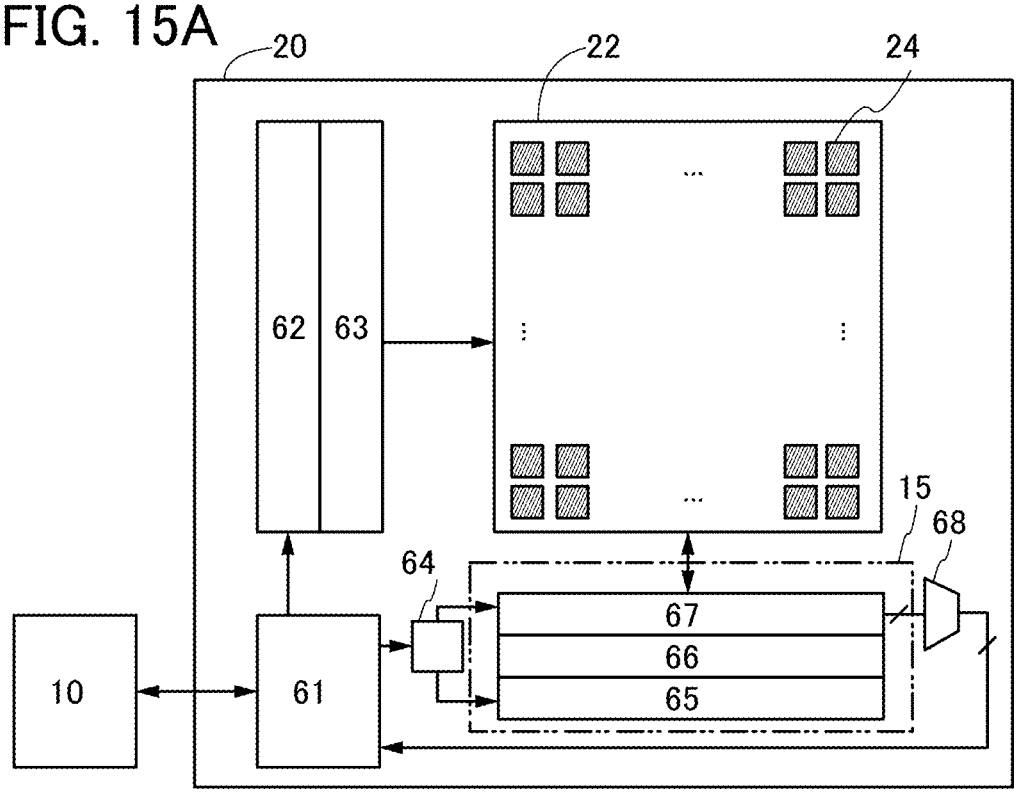
FIG. 15A and FIG. 15B are diagrams each illustrating a structure example of a semiconductor device.

FIG. 15A is a diagram of blocks for controlling the memory unit 22, which are extracted from the structure illustrated in FIG. 14B. FIG. 15A illustrates the controller 61, the row decoder 62, the word line driver 63, the column decoder 64, the write driver 65, the precharge circuit 66, the sense amplifier 67, and the selector 68. The driver circuit 15 illustrated in FIG. 7A and FIG. 7B corresponds to a block of the write driver 65, the precharge circuit 66, and the sense amplifier 67. Note that the driver circuit 15 may include the word line driver 63 and the column decoder 64.

The controller 61 processes an input signal from the outside and generates control signals of the row decoder 62 and the column decoder 64. The input signal from the outside is a control signal for controlling the memory unit 22, such as a write enable signal or a read enable signal. The controller 61 performs input and output of data written to the memory unit 22 or data read out from the memory unit 22 between the CPU 10 and the memory unit 22 through the bus.

The row decoder 62 generates a signal for driving the word line driver 63. The word line driver 63 generates signals to be supplied to the write word line WWL and the read word line RWL. The column decoder 64 generates signals for driving the sense amplifier 67 and the write driver 65. The precharge circuit 66 has a function of precharging the read bit line RBL or the like. The signal read out from the memory circuit 24 of the memory unit 22 is input to the arithmetic circuit 23 and can be output through the selector 68. The selector 68 can sequentially read out data corresponding to the bus width and output necessary data to the CPU 10 or the like through the controller 61.

Figure 15B:
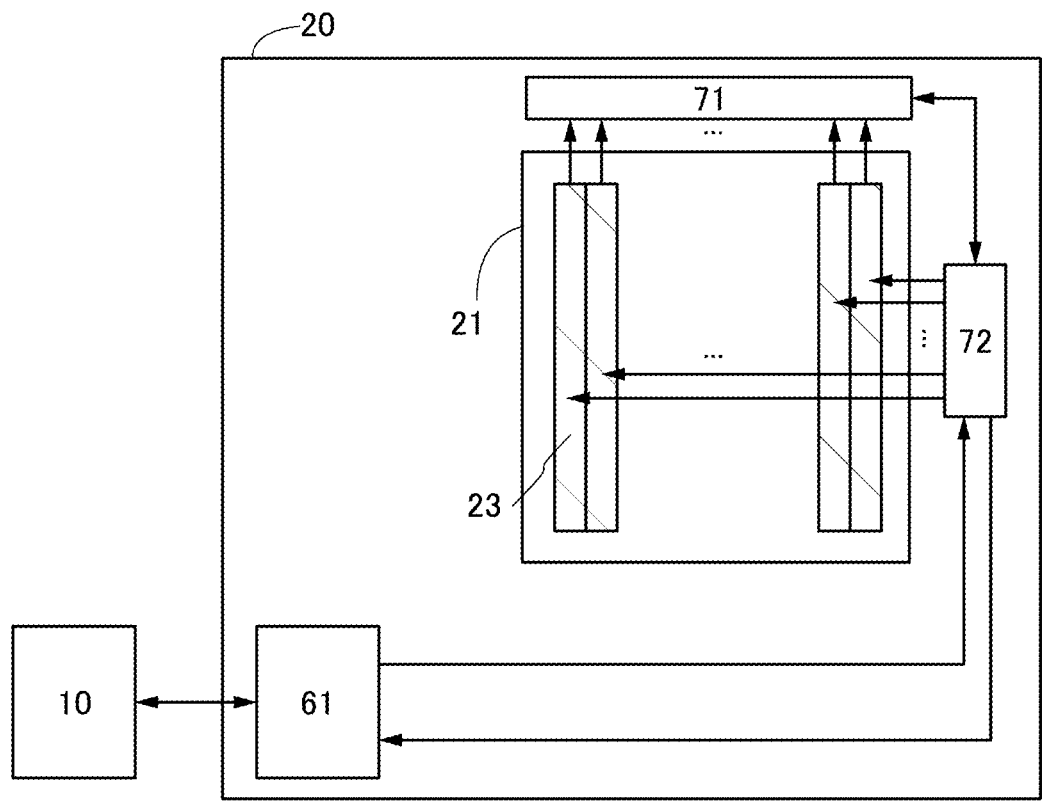

FIG. 15B is a diagram of blocks for controlling the arithmetic processing unit 21, which are extracted from the structure illustrated in FIG. 14B.

The controller 61 processes an input signal from the outside and generates a control signal of the arithmetic control circuit 72. The controller 61 generates a variety of signals for controlling the arithmetic circuit 23 included in the arithmetic processing unit 21. The controller 61 inputs and outputs data regarding the arithmetic result through the input buffer 71. With the use of the buffer memory, parallel calculation of the number of bits greater than the data bus width of the CPU is possible. Furthermore, the number of times of transferring an enormous number of weight parameters between the CPU 10 and the accelerator 20 can be reduced, whereby power consumption can be reduced.

Figure 16:
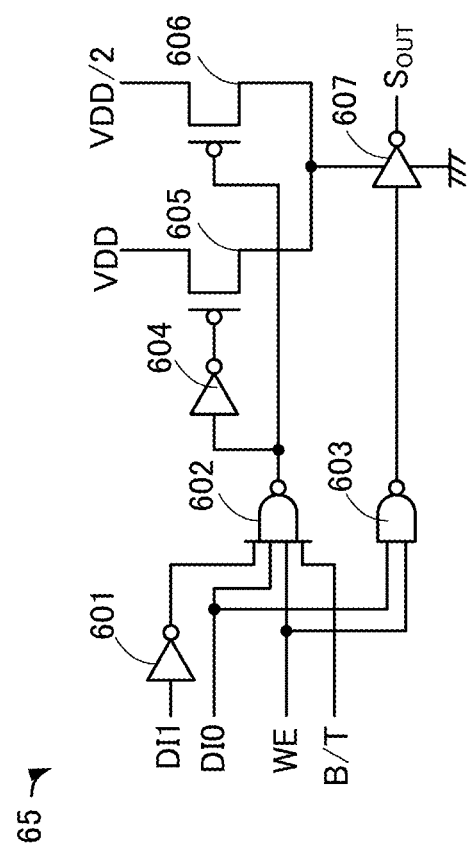
FIG. 16 is a diagram illustrating a structure example of a semiconductor device.

FIG. 16 illustrates a structure example of the write driver 65 for writing a data signal converted into a binary or ternary analog voltage value to the memory circuit. The write driver 65 includes an inverter circuit 601, a NAND circuit 602, a NAND circuit 603, an inverter circuit 604, a transistor 605, a transistor 606, and an inverter circuit 607. The transistors included in the write driver 65 is Si transistors. The transistor 605 and the transistor 606 are preferably p-channel transistors as illustrated in FIG. 16.

A potential VDD (>GND) or a potential VDD/2 (>GND) is supplied to one of a source and a drain of the transistor 605 and one of a source and a drain of the transistor 606 as illustrated in FIG. 16. A data signal DI1 that is input data is supplied to the inverter circuit 601. An output signal of the inverter circuit 601, a data signal DI0, a writing control signal WE for controlling data writing, and a switching signal B/T for switching writing of a binary or ternary data signal are input to the NAND circuit 602. The data signal DI0 and the writing control signal WE are input to the NAND circuit 603. The inverter circuit 607 outputs the data signal $S_{OUT}$ corresponding to the voltage value corresponding to binary or ternary data.

Table 1 is a truth table of the signals shown in FIG. 16.

TABLE 1

| WE | B/T | DI1 | DI0 | $S_{OUT}$ |
|----|-----|-----|-----|-----------|
| 1  | 0   | 1   | 1   | X         |
|    |     | 0   | 1   | VDD       |
|    |     | 0   | 0   | GND       |
|    | 1   | 1   | 1   | VDD       |
|    |     | 0   | 1   | VDD/2     |
|    |     | 0   | 0   | GND       |

That is, when binary data is written to the memory circuit, the data signal $S_{OUT}$ is switched to the voltage VDD or the voltage GND in accordance with the data signal DI0. When ternary data is written to the memory circuit, the data signal $S_{OUT}$ is switched to the voltage VDD, the voltage VDD/2, or the voltage GND in accordance with the data signals DI0 and DI1. The switched voltage can be written to the memory circuit through the write bit line WBL.

Figure 17:
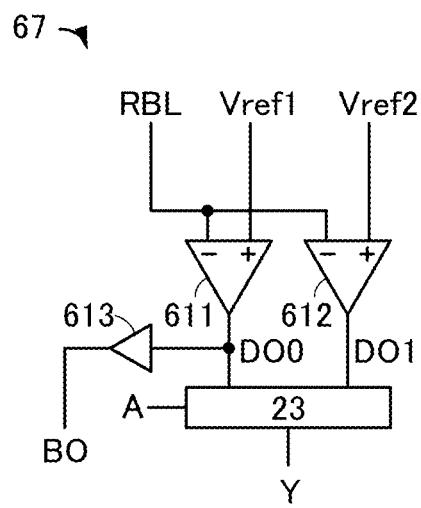
FIG. 17 is a diagram illustrating a structure example of a semiconductor device.

FIG. 17 shows an example of a structure including the sense amplifier 67 that outputs, to the arithmetic circuit 23, a data signal corresponding to a binary or ternary analog voltage value. In FIG. 17, a comparative circuit 611 and a comparative circuit 612 that generate the data signals DO0 and DO1 of output data from the potential of the read bit line RBL, which corresponds to the input signal, function as the sense amplifier 67. The potential of the potential of the read bit line RBL and a reference voltage Vref1 are supplied to the comparative circuit 611. The potential of the potential of the read bit line RBL and a reference voltage Vref2 are supplied to the comparative circuit 612. The reference voltage Vref2 is higher than the reference voltage Vref1 and lower than VDD. The reference voltage Vref1 is higher than GND and lower than VDD/2.

In the case of binary data, the data signal DO0 and a data signal BO that are binary output data output through a buffer circuit 613 are obtained. The data signal DO0 has the same logic value as the data signal BO. Table 2 is a truth table of the data signal DO0 and the data signal BO.

TABLE 2

| DO0 | BO |
|---|---|
| 0 | 0 |
| 1 | 1 |

In the case of ternary output data, the data signal Y output through the arithmetic circuit 23 can be obtained. Table 3 is a truth table of the data signal DO0, the data signal DO1, and the data signal Y.

TABLE 3

| DO1 | DO0 | W | A | Y = A*X |
|---|---|---|---|---|
| 1 | 1 | 0 | −1 | 0 |
| 0 | 1 | +1 | −1 | −1 |
| 0 | 0 | −1 | −1 | +1 |
| 1 | 1 | 0 | +1 | 0 |
| 0 | 1 | +1 | +1 | +1 |
| 0 | 0 | −1 | +1 | −1 |

As the data signal Y, a product-sum operation of weight data A and the data signals DO0 and DO1 (X) gives a product-sum signal Y (=A*X).

As described above, one embodiment of the present invention can provide a downsized semiconductor device including an accelerator and a CPU. Alternatively, one embodiment of the present invention can provide a low power semiconductor device including an accelerator and a CPU. Alternatively, one embodiment of the present invention can suppress heat generation of a semiconductor device including an accelerator and a CPU. Alternatively, one embodiment of the present invention can reduce the number of times of data transfer of a CPU of a semiconductor device. Alternatively, a semiconductor device having a novel structure can be provided. In other words, the semiconductor device of one embodiment of the present invention has a non-von Neumann architecture and can perform parallel processing with extremely low power consumption as compared with a von Neumann architecture, in which power consumption increases with increasing processing speed.

Embodiment 3

Structures, operations, and the like of semiconductor devices of embodiments of the present invention will be described. Note that in this embodiment, structures denoted by the same reference numerals as those in the above embodiment are not repeatedly described in some cases.

Figure 18A:
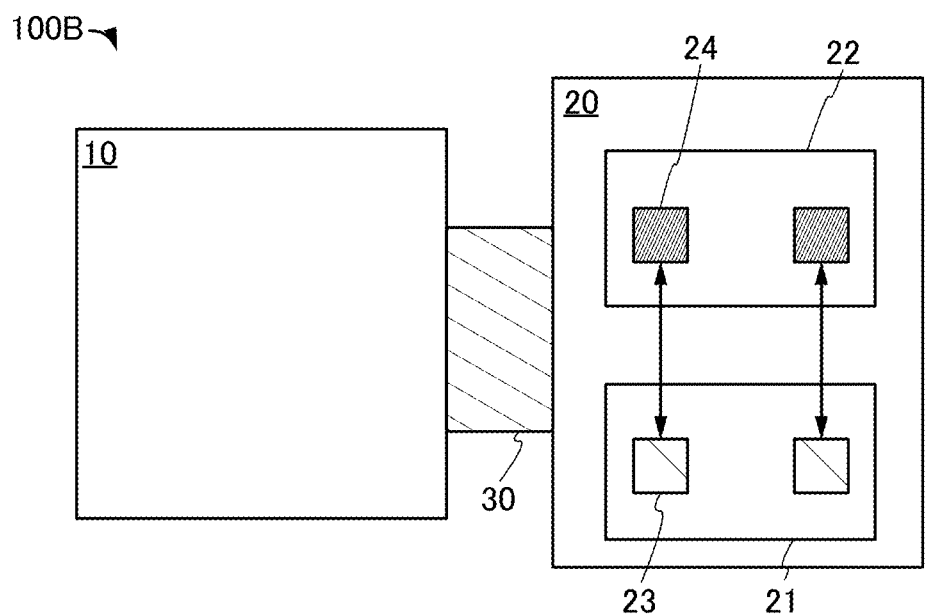
FIG. 18A and FIG. 18B are diagrams illustrating a structure example of a semiconductor device.
Figure 18B:
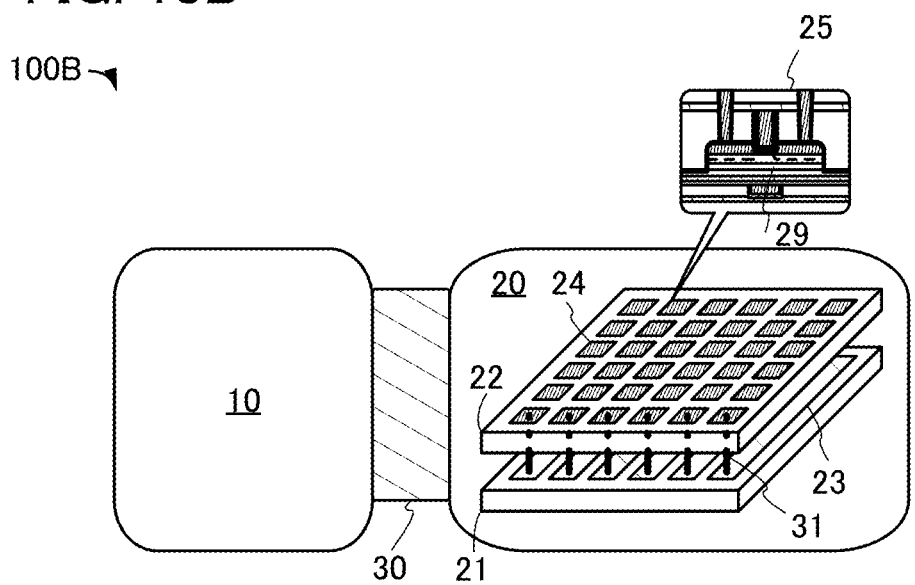

FIG. 18A and FIG. 18B are diagrams illustrating a semiconductor device 100B of one embodiment of the present invention. The semiconductor device 100B includes the CPU 10, the accelerator 20, and the bus 30. The accelerator 20 includes the arithmetic processing unit 21 and the memory unit 22. The arithmetic processing unit 21 includes the arithmetic circuit 23. The memory unit 22 includes the memory circuit 24. The memory unit 22 is referred to as a device memory or a shared memory in some cases. The memory circuit 24 includes the transistor 25 including the semiconductor layer 29 including a channel formation region. The arithmetic circuit 23 and the memory circuit 24 are electrically connected to each other through the wiring 31.

The memory unit 22 has a function of storing and generating data to be processed by the accelerator 20. Specifically, the memory unit 22 has a function of storing weight data (also referred to as a first data signal) used for parallel processing of a product-sum operation of a neural network. The memory unit 22 has a function of generating output data (a third data signal) in accordance with the result of multiplication with input data (also referred to as a second data signal). The memory unit has a function of inputting generated output data to the arithmetic processing unit 21.

The memory circuit 24 is electrically connected to the arithmetic circuit 23 included in the arithmetic processing unit 21 through the wiring 31 and has a function of retaining binary weight data, i.e., a 1-bit digital signal. The memory circuit has a function of generating a signal obtained by an exclusive OR operation, corresponding to the multiplication result of the weight data and the input data. Note that in the memory circuit 24, the semiconductor layer 29 of the transistor 25 is an oxide semiconductor. That is, the transistor 25 is an OS transistor. A memory including an OS transistor (hereinafter, also referred to as an OS memory) is suitable for the memory circuit 24.

Figure 19A:
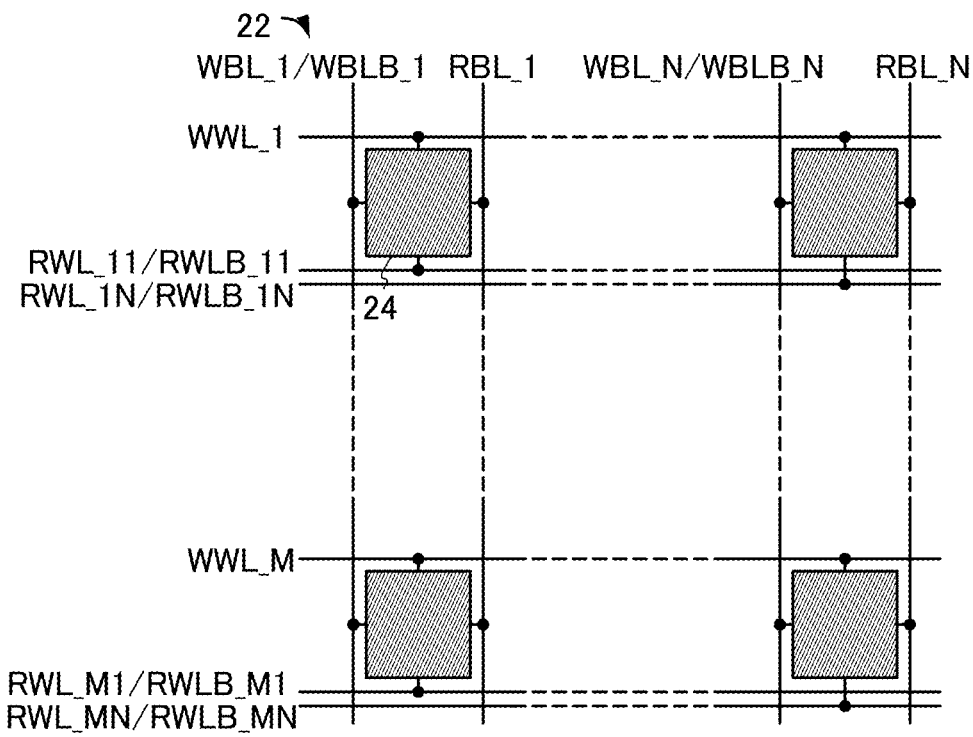
FIG. 19A and FIG. 19B are diagrams illustrating a structure example of a semiconductor device.

FIG. 19A is a diagram illustrating a circuit structure example applicable to the memory unit 22 included in the semiconductor device 100B of the present invention. FIG. 19A shows the write word lines WWL_1 to WWL_M, read word lines RWL_11 to RWL_MN, read inverting word lines RWLB_11 to RWLB_MN, the write bit lines WBL_1 to WBL_N, write inverting bit lines WBLB_1 to WBLB_N, and the read bit lines RBL_1 to RBL_N, which are arranged in a matrix of M rows and N columns (M and N are natural numbers greater than or equal to 2). A plurality of memory circuits 24 connected to the word lines and the bit lines are also shown.

Figure 19B:
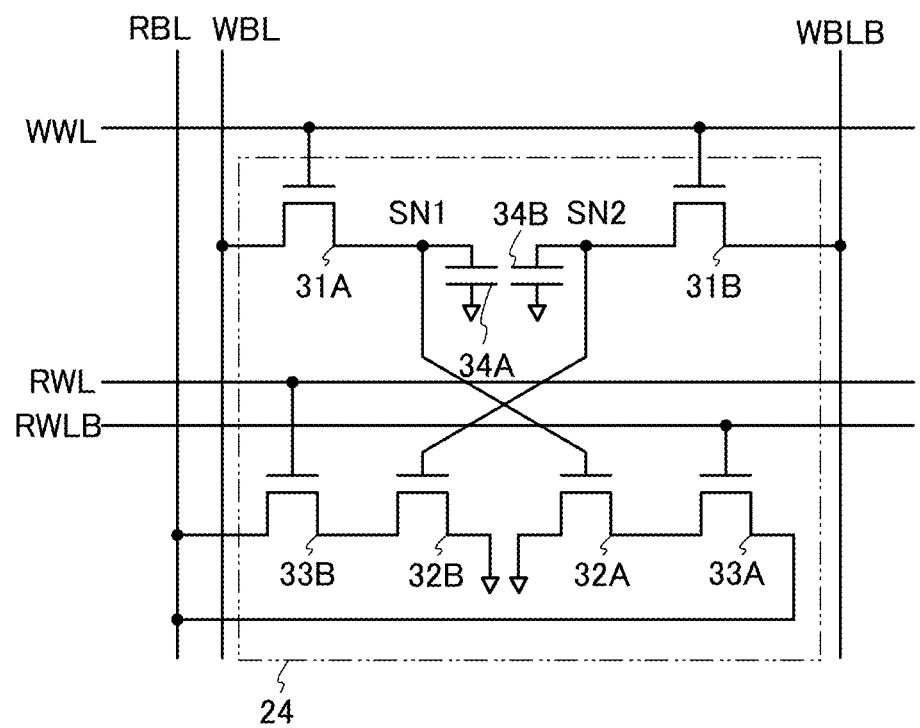

FIG. 19B illustrates a circuit structure example applicable to the memory circuit 24. The memory circuit 24 includes elements of transistors 31A and 31B, transistors 32A and 32B, transistors 33A and 33B, and capacitors 34A and 34B. As illustrated in FIG. 19B, each of the elements is connected to the write word line WWL, the read word line RWL, the read inverting word line RWLB, the write bit line WBL, the write inverting bit line WBLB, or the read bit line RBL.

One electrode of each of the capacitors 34A and 34B and one of a source and a drain of each of the transistors 32A and 32B are connected to a wiring for supplying a fixed potential such as a ground potential. As described above, the read bit line RBL is connected to the arithmetic circuit 23 through the wiring 31 or the like provided to extend in the direction substantially perpendicular to the surface of the substrate provided with the arithmetic circuit 23.

The circuit structure of the memory circuit 24 illustrated in FIG. 19B is a NOSRAM that includes 3-transistor (3T) gain cells of the transistor 31A, the transistor 32A, and the transistor 33A, and the transistor 31B, the transistor 32B, and the transistor 33B. The transistors 31A and 31B, the transistors 32A and 32B, and the transistors 33A and 33B are OS transistors. An OS transistor has an extremely low current that flows between a source and a drain in an off state, that is, leakage current. The NOSRAM can be used as a nonvolatile memory by retaining electric charge corresponding to data in the memory circuit, using characteristics of an extremely low leakage current. Electric charge supplied to nodes SN1 and SN2 can be retained by turning off the transistors 31A and 31B in FIG. 19B. Note that each transistor may have a structure with a back gate electrode.

Table 4 is a truth table of the memory circuit 24 in FIG. 19B. In Table 3, an H-level voltage and an L-level voltage are represented as logics "1" and "0". "RWL" and "RWLB" correspond to logics based on voltages of the read word line RWL and the read inverting word line RWLB supplied as input data. "SN1" and "SN2" correspond to logics based on voltages supplied as weight data from the write bit line WBL and the write inverting bit line WBLB to the nodes SN1 and SN2. "RBL" corresponds to a logic based on a voltage of the read bit line RBL generated as output data.

TABLE 4

| RWL | RWLB | SN1 | SN2 | RBL |
|---|---|---|---|---|
| 1 | 0 | 1 | 0 | 1 |
| 1 | 0 | 0 | 1 | 0 |
| 0 | 1 | 1 | 0 | 0 |
| 0 | 1 | 0 | 1 | 1 |

With the circuit structure of FIG. 19B, data shown in the truth table in Table 4 can be obtained. Thus, for example, an output signal (output data Y=W×A) based on an exclusive OR operation of the read word line RWL (input data A) and the node SN2 (weight data W) can be obtained as shown in Table 5. Note that as shown in Table 5, the logics "1" and "0" are binary data expressed as "+1" and "−1" used in a Binary Neural Network (BNN).

TABLE 5

| RWL (A) | SN1 (W) | RBL (Y = W × A) |
|---|---|---|
| −1 (0) | −1 (0) | +1 (1) |
| −1 (0) | +1 (1) | −1 (0) |
| +1 (1) | −1 (0) | −1 (0) |
| +1 (1) | +1 (1) | +1 (1) |

Figure 20A:
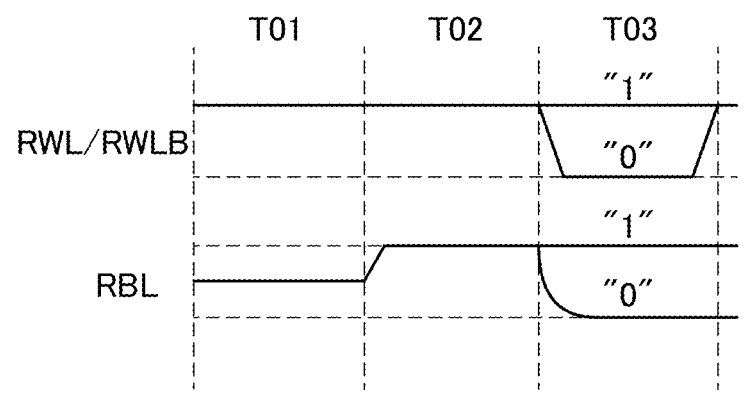
FIG. 20A and FIG. 20B are diagrams illustrating a structure example of a semiconductor device.

An operation of the case where data is read out to the read bit line RBL is described with reference to FIG. 20A. First, in a standby period T01, the read word line RWL and the read inverting word line RWLB are set at H level, and the read bit line RBL is set at an intermediate potential. Then, in a precharge period T02, the read word line RWL and the read inverting word line RWLB are set at H level and the read bit line RBL is set at H level to be brought into an electrically floating state. Then, in a reading period T03, the read word line RWL and the read inverting word line RWLB are set to a logic "1" or "0" depending on the input data, whereby the logic of the read bit line RBL is changed to the logic "1" or "0" and the output data can be generated.

Figure 20B:
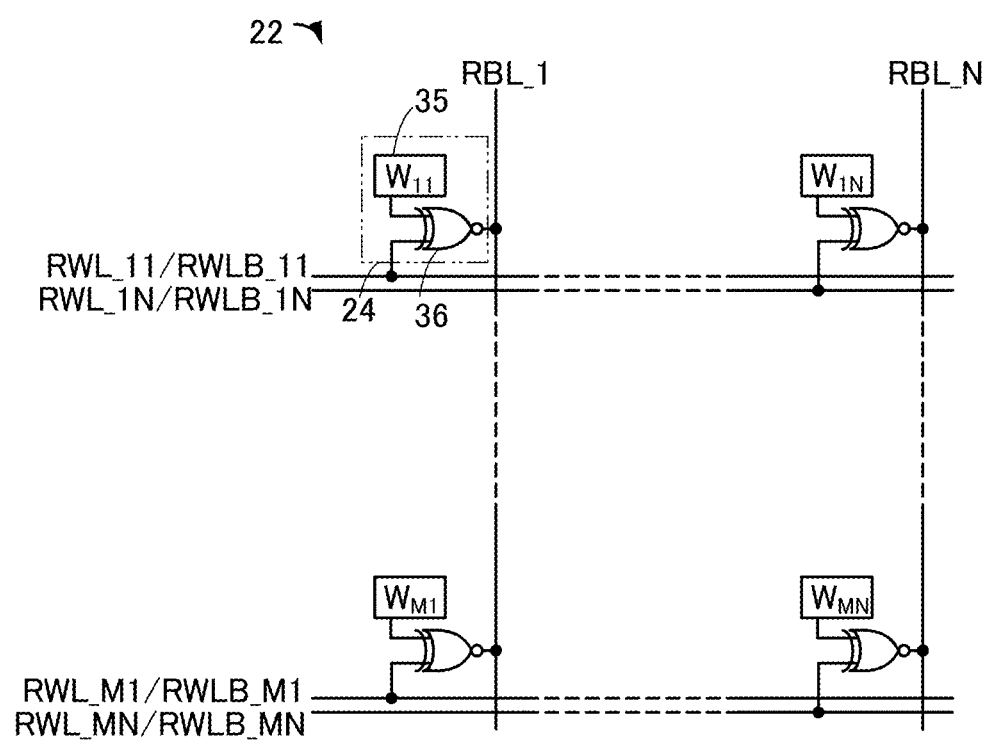

The memory unit 22 that can retain weight data and generate a signal based on an exclusive OR operation with input data can have a structure illustrated in FIG. 20B. That is, in the plurality of memory circuits 24, weight data $W_{11}$ to $W_{MN}$ are retained in storage units 35 and input data are supplied to exclusive OR units 36 (ExOR) through the read word lines RWL_11 to RWL_MN and the read inverting word lines RWLB_11 to RWLB_MN, whereby output data based on the exclusive OR operation of the weight data and the input data can be input to the read bit lines RBL_1 to RBL_N.

Figure 21:
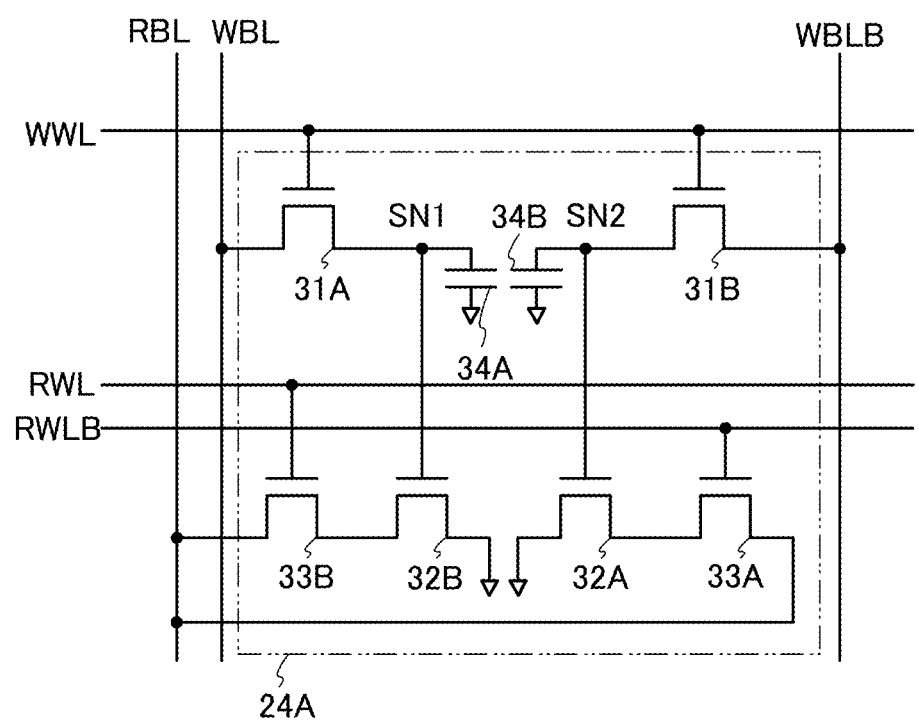
FIG. 21 is a diagram illustrating a structure example of a semiconductor device.

Note that the memory circuit 24 in FIG. 19B can be modified into a circuit structure in FIG. 21. A memory circuit 24A in FIG. 21 corresponds to a structure in which connections between the nodes SN1 and SN2 and gates of the transistors 32A and 32B are changed. A truth table in Table 6 can be obtained with the circuit structure in FIG. 21.

TABLE 6

| RWL | RWLB | SN1 | SN2 | RBL |
|---|---|---|---|---|
| 1 | 0 | 1 | 0 | 0 |
| 1 | 0 | 0 | 1 | 1 |
| 0 | 1 | 1 | 0 | 1 |
| 0 | 1 | 0 | 1 | 0 |

Figure 22A:
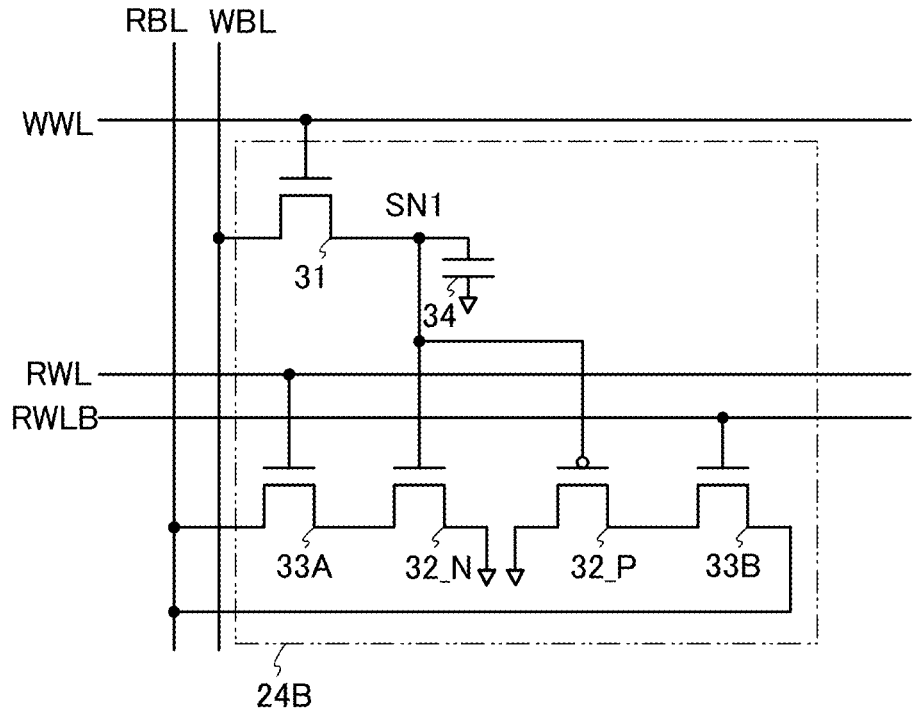
FIG. 22A and FIG. 22B are diagrams each illustrating a structure example of a semiconductor device.

Similarly, a memory circuit 24B in FIG. 22A corresponds to a structure in which the connection destination of the node SN1 is changed from the transistors having the same polarity to transistors 32_P and 32_N, a combination of a p-channel transistor and an n-channel transistor. Si transistors or the like can be used as the transistors 32_P and 32_N. With this structure, the transistor and the wiring connected to the node SN2 in FIG. 19B can be omitted. Data in a truth table in Table 7 can be obtained with the circuit structure in FIG. 22A.

TABLE 7

| RWL | RWLB | SN1 | RBL |
|---|---|---|---|
| 1 | 0 | 1 | 0 |
| 1 | 0 | 0 | 1 |
| 0 | 1 | 1 | 1 |
| 0 | 1 | 0 | 0 |

Figure 22B:
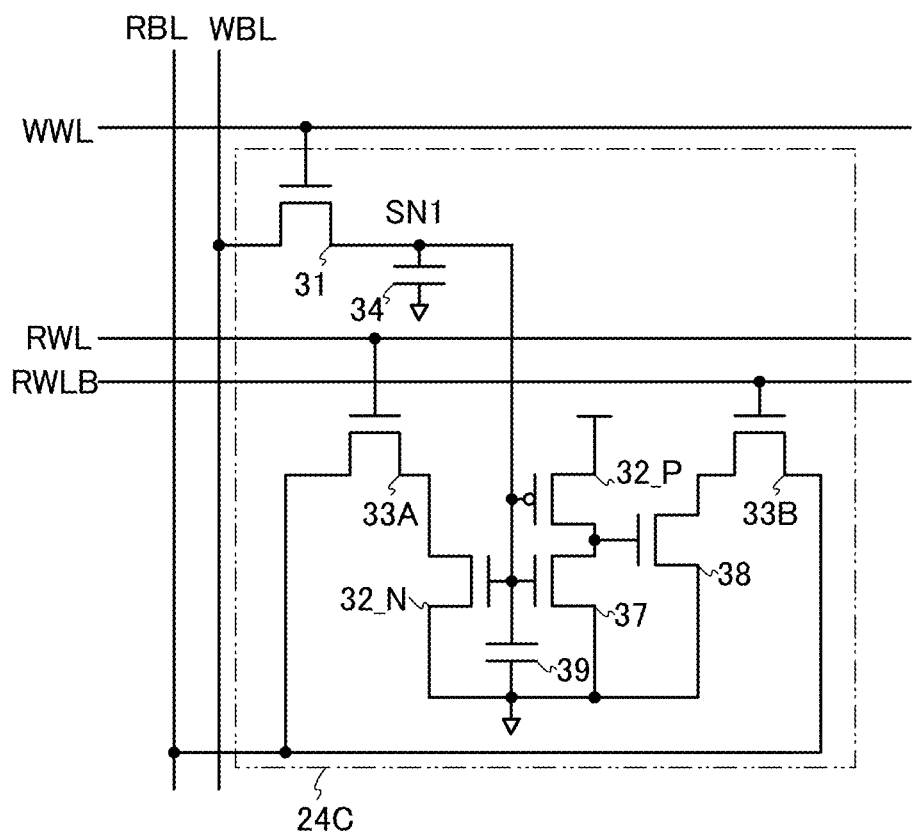

Similarly, a memory circuit 24C in FIG. 22B corresponds to a structure in which the connection destinations of the nodes SN1 and SN2 are changed from the transistors having the same polarity in FIG. 19B to the transistors 32_P and 32_N of different polarities and transistors 37 and 38 and a capacitor 39 are added. With this structure, the transistor and the wiring connected to the node SN2 can be omitted. A truth table of the circuit structure in FIG. 22B is the same as Table 7.

Figure 23:
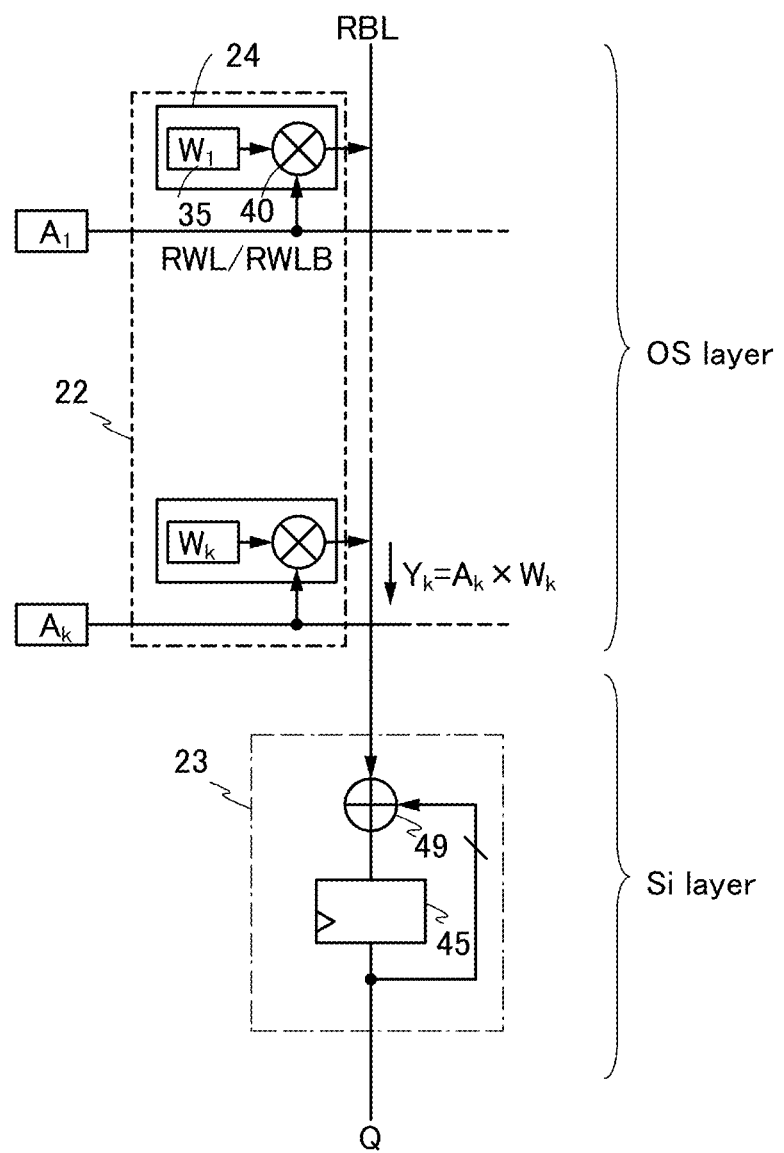
FIG. 23 is a diagram illustrating a structure example of a semiconductor device.

FIG. 23 is a schematic view illustrating the memory unit 22 including the plurality of memory circuits 24 and the arithmetic circuit 23 in the semiconductor device 100B of the present invention. As described above, each of the memory circuits 24 in the memory unit 22 includes the storage unit 35 and a multiplication unit 40. Weight data $W_1$ to $W_k$ (k is a natural number greater than or equal to 2) are stored in the storage units 35, and output signals ($Y_k = A_k \times W_k$) that are 1-bit digital signals based on multiplication of the weight data $W_1$ to $W_k$ and input data $A_1$ to $A_k$ input through the read word lines RWL and the read inverting word lines RWLB are supplied to the arithmetic circuit 23. Each transistor in the memory unit 22 is preferably an OS transistor because the memory unit 22 can be stacked with the arithmetic circuit 23.

The arithmetic circuit 23 illustrated in FIG. 23 includes an accumulator 49 and the encoding circuit 45. The arithmetic circuit 23 can generate the signal Q by performing a product-sum operation in which the multiplied output signals are added.

Figure 24:
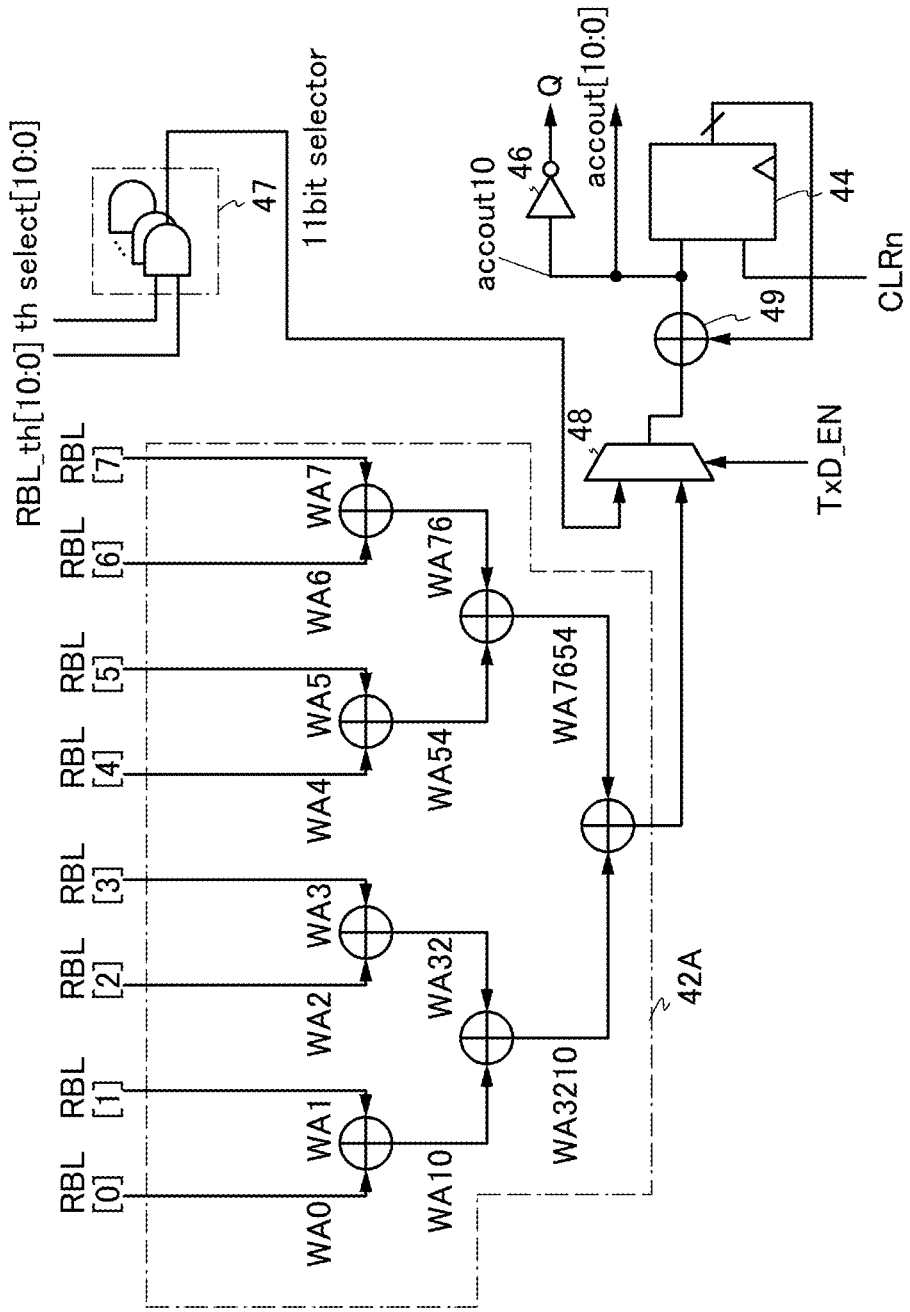
FIG. 24 is a diagram illustrating a structure example of a semiconductor device.

FIG. 24 illustrates a detailed structure example of the structure of the arithmetic circuit 23 illustrated in FIG. 23. FIG. 24 illustrates a structure example in which addition of signals of eight bits (WA[0] to WA[7]) is performed and the 1-bit output signal Q and the 11-bit output signal (accout [10:0]) are output. In the structure example in FIG. 24, a product-sum operation and a sum operation for batch normalization are switched. In FIG. 24, one row is selected in one clock in memory access, so that calculation of addition of M products (=1 bit×M rows) is executed in M clocks. In the arithmetic circuit in FIG. 24, the same calculation of addition of M products can be executed by eight parallel operations×1 bit×M/8 rows, and thus M/8 clocks are needed. Accordingly, in the structure in FIG. 24, arithmetic operation time can be shortened by executing a product-sum operation in parallel, whereby arithmetic efficiency can be improved.

In FIG. 24, a bit adder 42A includes adders to which the signals of eight bits (WA[0] to WA[7]) are input. As shown in FIG. 24, sums of the 1-bit signals are denoted as WA10, WA32, WA54, and WA76, and their sums are denoted as WA3210 and WA7654.

In FIG. 24, the accumulator 49 functioning as an adder outputs, to the latch circuit 44, the sum of a signal of the bit adder 42A and the output signal of the latch circuit 44. Note that in FIG. 24, a signal input to the accumulator 49 includes a selector 48 that can perform switching in accordance with the control signal TxD_EN. When the control signal TxD_EN is 0 (TxD_EN=0), the sum of the signal of the bit adder 42A and the output signal of the latch circuit 44 is output to the latch circuit 44. When the control signal TxD_EN is 1 (TxD_EN=1), the sum of the signal of the logic circuit 47 (11-bit selector) and the output signal of the latch circuit 44 is output to the latch circuit 44. The product-sum operation and the sum operation for batch normalization can be switched by the selector 48.

In FIG. 24, after completion of the product-sum operation of the signals WA0 to WA7, the logic circuit 47 formed using an AND circuit adds data for batch normalization, specifically, the signal RBL_th[10:0] while the switching signals (th select[10:0]) are changed. Note that the signal RBL_th [10:0] corresponds to the weight data retained in the memory circuit 24. Batch normalization is an operation for adjusting the distribution of output data of each layer in a neural network to fit in a certain range. For example, as for image data frequently used in the arithmetic operation in a neural network, the distribution of data used in learning is likely to vary, and thus is different from the distribution of estimated data (input data) in some cases. In batch normalization, the distribution of input data to an intermediate layer of the neural network is normalized to Gaussian distribution with the mean 0 and the variance 1, whereby the learning accuracy in the neural network can be increased. In Binary Neural Network (BNN), an output result of each layer is binarized by activation; thus, when unbalanced data distribution with respect to the threshold value is inhibited, appropriate activation, i.e., data classification can be performed.

The latch circuit 44 retains the output signal (accout[10: 0]) of the accumulator 49. The latch circuit 44 is reset by a signal CLRn. By batch normalization, binary data to be transferred to a layer (NN layer) in the next neural network becomes the most significant bit of the product-sum operation result retained in the latch circuit 44. In the output signal (accout[10:0]), a signal of the most significant bit (accout10) denotes a sign of latch data obtained by an arithmetic operation with the two's complement, and in order to transfer a positive data thereof as 1 and a negative data as 0 to the next NN layer, the signal is inverted in the inverter circuit 46 functioning as an encoding circuit and output as the output signal Q. Since the signal Q is an output of the intermediate layer, the signal Q is temporarily retained in a buffer memory (also referred to as an input buffer) in the accelerator 20 and then used in an arithmetic operation in the next layer.

Figure 25A:
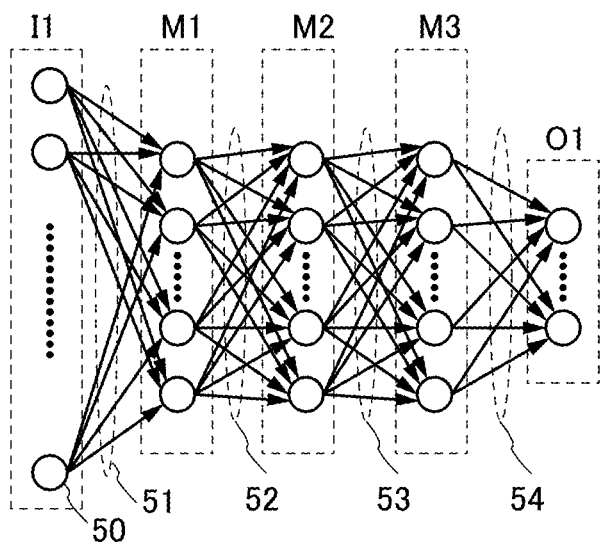
FIG. 25A and FIG. 25B are diagrams each illustrating a structure example of a semiconductor device.

FIG. 25A illustrates a hierarchical neural network based on the Binary Neural Network (BNN) architecture. FIG. 25A illustrates a fully connected neural network including neurons 50, one input layer (I1), three intermediate layers (M1 to M3), and one output layer (O1). Given that the number of neurons in the input layer I1 is 786, the number of neurons in each of the intermediate layers M1 to M3 is 256, and the number of neurons in the output layer O1 is 10, the number of connections in layers (a layer 51, a layer 52, a layer 53, and a layer 54) is (784×256)+(256×256)+(256× 256)+(256×10), i.e., 334336 in total. That is, the weight parameter required for the neural network calculation is approximately 330 K bits in total, whereby the memory capacity is adequate for a small system.

Figure 25B:
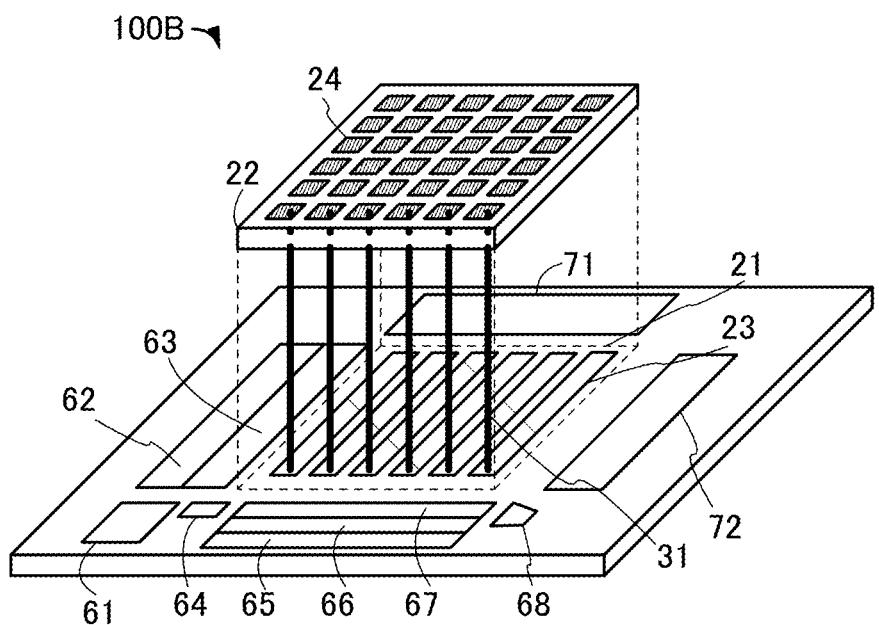

Next, FIG. 25B is a detailed block diagram of the semiconductor device 100B capable of the arithmetic operation of the neural network illustrated in FIG. 25A.

FIG. 25B illustrates structure examples of peripheral circuits for driving the structures illustrated in FIG. 18A and FIG. 18B, in addition to the arithmetic processing unit 21, the arithmetic circuit 23, the memory unit 22, the memory circuit 24, and the wiring 31 illustrated in FIG. 18A and FIG. 18B.

FIG. 25B illustrates the controller 61, the row decoder 62, the word line driver 63, the column decoder 64, the write driver 65, the precharge circuit 66, the sense amplifier 67, the selector 68, the input buffer 71, and the arithmetic control circuit 72.

Figure 26A:
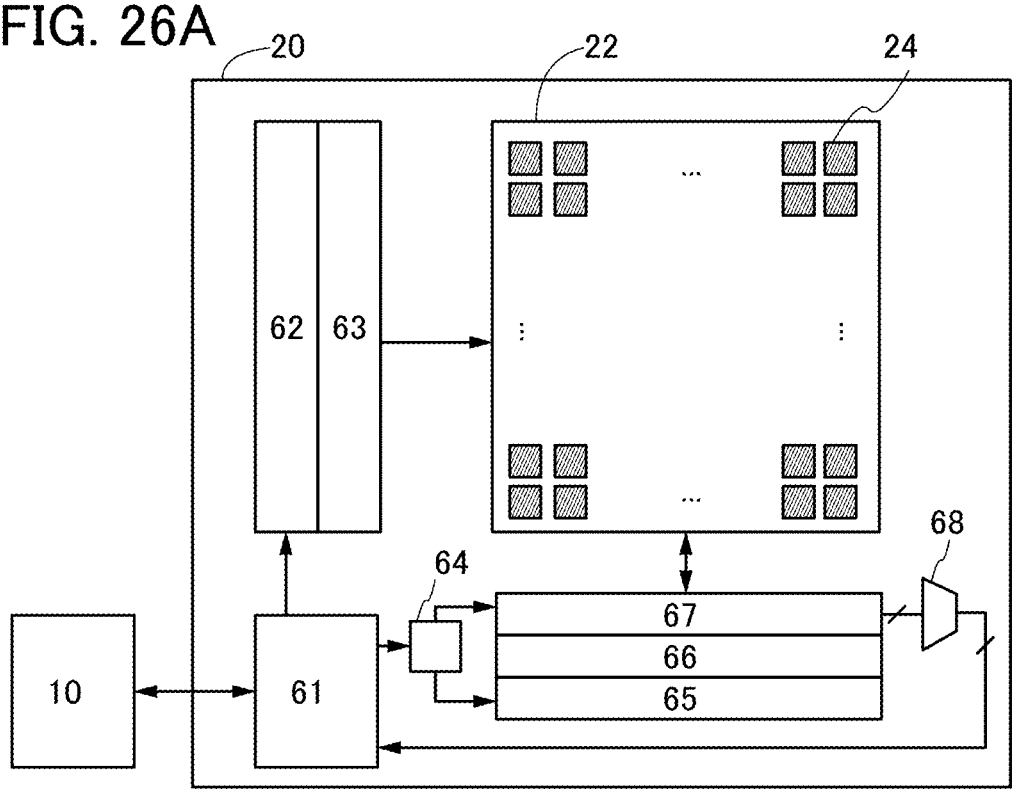
FIG. 26A and FIG. 26B are diagrams each illustrating a structure example of a semiconductor device.

FIG. 26A is a diagram of blocks for controlling the memory unit 22, which are extracted from the structure illustrated in FIG. 25B. FIG. 26A illustrates the controller 61, the row decoder 62, the word line driver 63, the column decoder 64, the write driver 65, the precharge circuit 66, the sense amplifier 67, and the selector 68.

The controller 61 processes an input signal from the outside and generates control signals of the row decoder 62 and the column decoder 64. The input signal from the outside is a control signal for controlling the memory unit 22, such as a write enable signal or a read enable signal. The controller 61 performs input and output of data written to the memory unit 22 or data read out from the memory unit 22 between the CPU 10 and the memory unit 22 through the bus.

The row decoder 62 generates a signal for driving the word line driver 63. The word line driver 63 generates signals to be supplied to the write word line WWL and the read word line RWL. The column decoder 64 generates signals for driving the sense amplifier 67 and the write driver 65. The sense amplifier 67 amplifies the potential of the read bit line RBL. The write driver generates signals for controlling the read bit line RBL and the write bit line WBL. The precharge circuit 66 has a function of precharging the read bit line RBL or the like. The signal read out from the memory circuit 24 of the memory unit 22 is input to the arithmetic circuit 23 and can be output through the selector 68. The selector 68 can sequentially read out data corresponding to the bus width and output necessary data to the CPU 10 or the like through the controller 61.

Figure 26B:
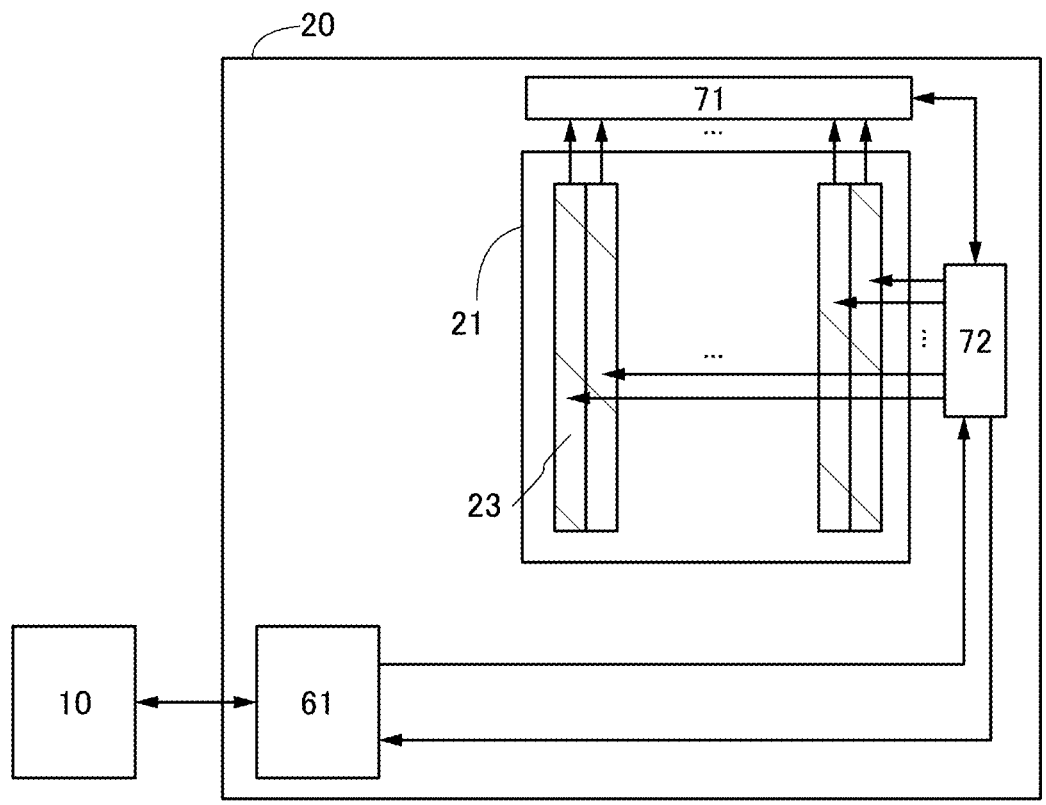

FIG. 26B is a diagram of blocks for controlling the arithmetic processing unit 21, which are extracted from the structure illustrated in FIG. 25B.

The controller 61 processes an input signal from the outside and generates a control signal of the arithmetic control circuit 72. The controller 61 generates a variety of signals for controlling the arithmetic circuit 23 included in the arithmetic processing unit 21. The controller 61 inputs and outputs data regarding the arithmetic result through the input buffer 71. With the use of the buffer memory, parallel calculation of the number of bits greater than the data bus width of the CPU is possible. Furthermore, the number of times of transferring an enormous number of weight parameters between the CPU 10 and the accelerator 20 can be reduced, whereby power consumption can be reduced.

Figure 27A:
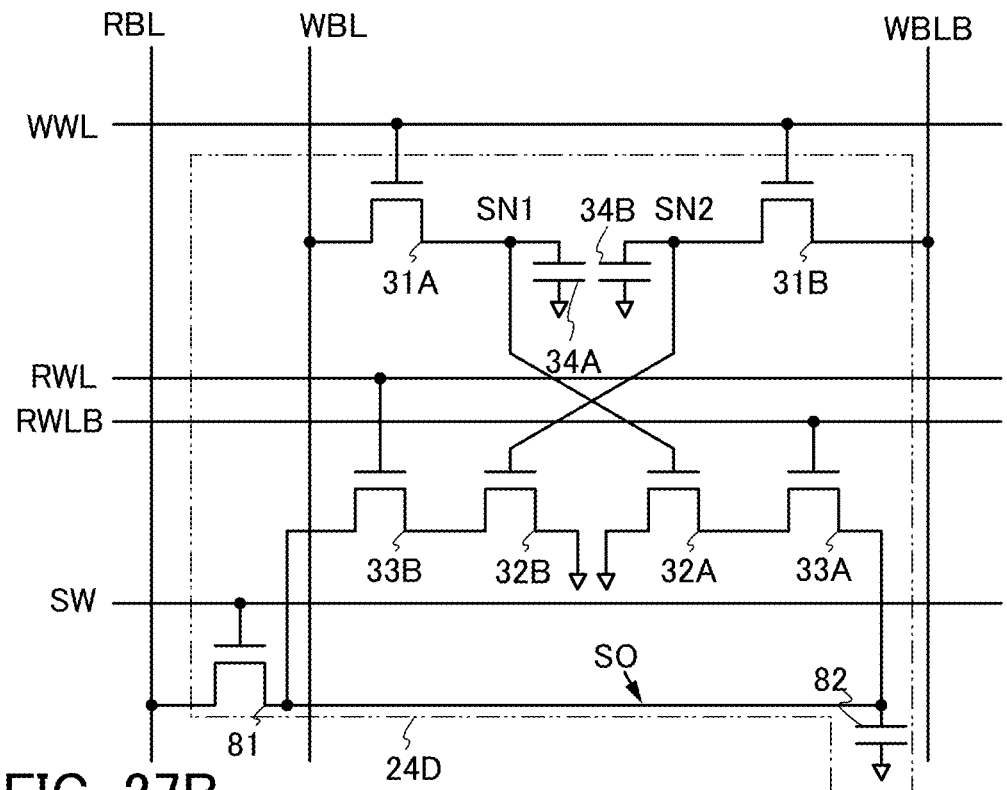
FIG. 27A and FIG. 27B are diagrams each illustrating a structure example of a semiconductor device.
Figure 27B:
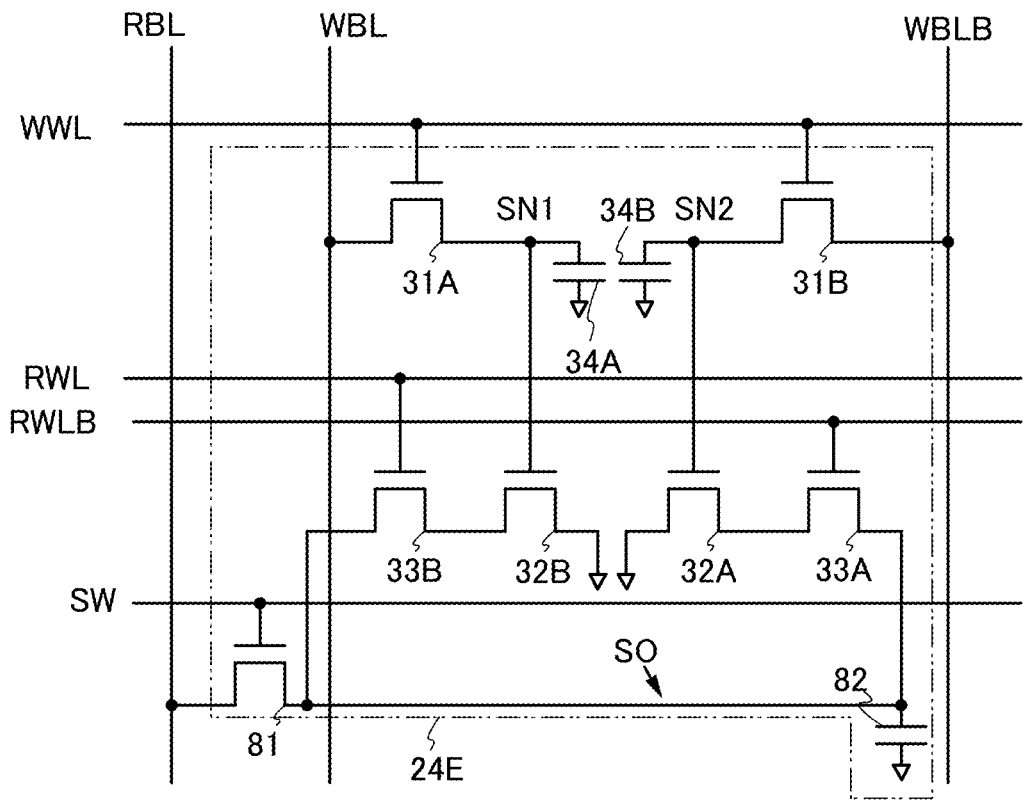

The above-described memory circuit 24 can be modified into a circuit structure in which a component such as a transistor is added. For example, a memory circuit 24D in FIG. 27A applicable to the memory circuit 24 corresponds to a structure in which a transistor 81 and a capacitor 82 are added to the structure illustrated in FIG. 19B. A node SO is also illustrated in FIG. 27A. Note that the circuit structure illustrated in FIG. 27A can be modified into a memory circuit 24E in FIG. 27B as the modification example corresponding to FIG. 21.

The transistor 81 is preferably an OS transistor. When the transistor 81 is an OS transistor, the capacitor 82, i.e., the node SO can retain electric charge corresponding to output data owing to an extremely low leakage current of the OS transistor. The output data retained in the node SO can be output to the read bit line RBL in accordance with a control signal SW connected to a gate of the transistor 81.

Figure 28A:
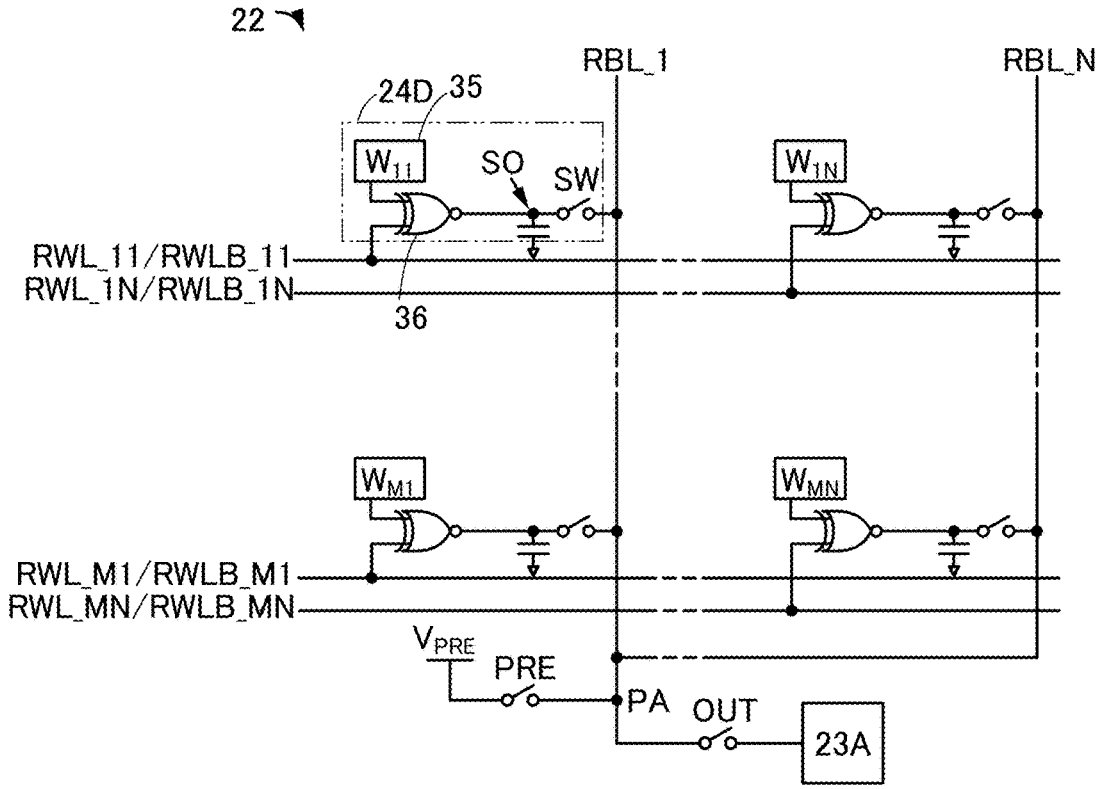
FIG. 28A and FIG. 28B are diagrams illustrating a structure example of a semiconductor device.

FIG. 28A is a schematic diagram showing an operation in which the memory circuit 24D having the structure in FIG. 27A is applied to the memory unit 22. In the memory circuit 24D illustrated in FIG. 28A, the node SO and the control signal SW for controlling a transistor functioning as a switch in FIG. 27A are illustrated in addition to the storage unit 35 and the exclusive OR unit 36 illustrated in FIG. 20B. The memory circuit 24D in the first row is connected to one of the read word lines RWL_11 to RWL_1N and one of the read inverting word lines RWLB_11 to RWLB_1N. The memory circuit 24D in the M-th row is connected to one of the read word lines RWL_M1 to RWL_MN and one of the read inverting word lines RWLB_M1 to RWLB_MN. FIG. 28A illustrates a control signal PRE for controlling a switch connected to a wiring supplied with a precharge voltage for precharging the read bit lines RBL_1 to RBL_N, a node PA of the read bit lines RBL_1 to RBL_N, and a control signal OUT for controlling a switch between the read bit lines RBL_1 to RBL_N and the arithmetic circuit 23A.

Electric charges retained in the nodes SO of the respective rows are shared by the read bit lines RBL_1 to RBL_N with the control signal SW all at once, whereby the read bit lines RBL_1 to RBL_N can be set at potentials corresponding to the sums of output data of the memory circuits 24D of the respective rows. That is, the read bit lines RBL_1 to RBL_N can be set at analog voltages corresponding to addition of electric charge corresponding to multiplication in the memory circuit 24D. Thus, in the arithmetic circuit 23A, an analog-digital converter circuit can be used instead of the adder illustrated in FIG. 23.

Figure 28B:
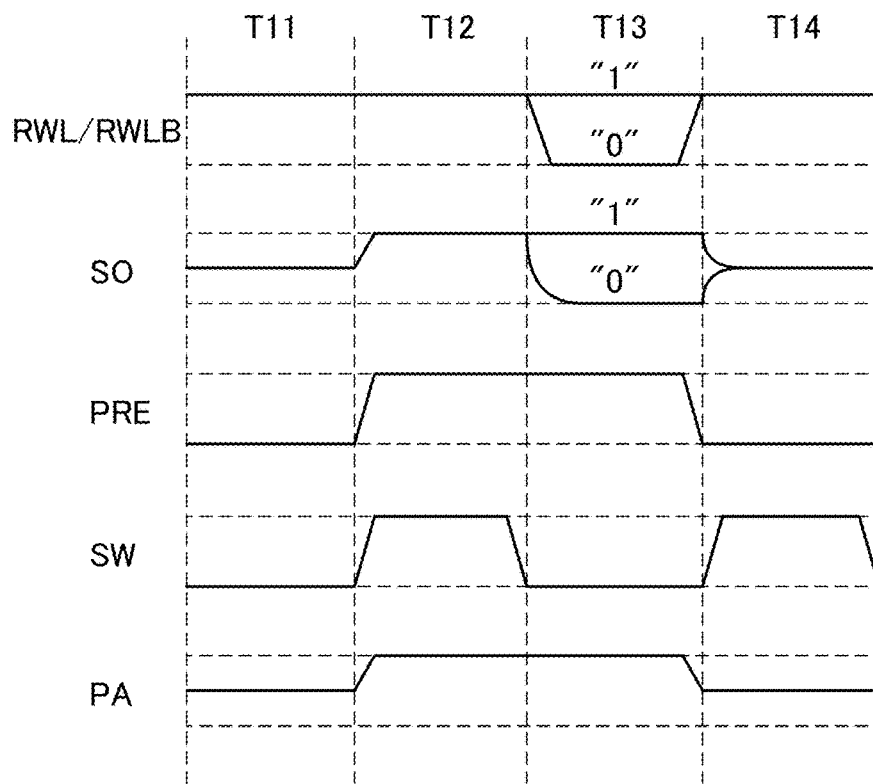

An operation of the case where data is read out to the read bit line RBL is described with reference to FIG. 28B. Note that each switch is turned on at H level and turned off at L level.

In a standby period T11, the read word line RWL and the read inverting word line RWLB are set at H level, the control signal SW and the control signal PRE are set at L level, and the node SO and the node PA are set at an intermediate potential. Then, in a precharge period T12, the read word line RWL and the read inverting word line RWLB are set at H level, the control signal SW and the control signal PRE are set at H level, and the node SO and the node PA are set at H level to be brought into an electrically floating state. Then, in a period T13 in which multiplication is performed, the read word line RWL and the read inverting word line RWLB are set to a logic "1" or "0" depending on the input data, whereby the logic of the node SO is changed to "1" or "0". In the period T13, the control signal SW is set at L level and the control signal PRE and the node PA are set at H level. Next, in a period T14 in which addition is performed, the read word line RWL and the read inverting word line RWLB are set at H level, the control signal PRE is set at L level, and the control signal SW is set at H level. The nodes SO and the node PA share charge, and the potential of the node PA can be an analog potential obtained by addition of electric charge of the nodes SO in the plurality of memory circuits obtained by multiplication. The analog potential can be read out to the arithmetic circuit 23A with the control signal OUT.

In one embodiment of the present invention, a semiconductor device functioning as an accelerator used for the AI technology or the like with an enormous amount of calculation and an enormous number of parameters can be downsized. Alternatively, in one embodiment of the present invention, the power consumption of a semiconductor device functioning as an accelerator used for the AI technology or the like with an enormous amount of calculation and an enormous number of parameters can be reduced. Alternatively, in one embodiment of the present invention, heat generation can be suppressed in a semiconductor device functioning as an accelerator used for the AI technology or the like with an enormous amount of calculation and an enormous number of parameters. Alternatively, in one embodiment of the present invention, in a semiconductor device functioning as an accelerator used for the AI technology or the like with an enormous amount of calculation and an enormous number of parameters, the number of times of data transfer between a CPU and a semiconductor device functioning as a memory can be reduced. In other words, a semiconductor device functioning as an accelerator used for the AI technology or the like with an enormous amount of calculation and an enormous number of parameters has a non-von Neumann architecture, and can perform parallel processing with extremely low power consumption as compared with a von Neumann architecture, in which power consumption increases with increasing processing speed.

Embodiment 4

In this embodiment, an example of an operation of the case where the accelerator 20 executes part of an arithmetic operation of a program executed by the CPU 10 described in the above embodiment is described.

Figure 29:
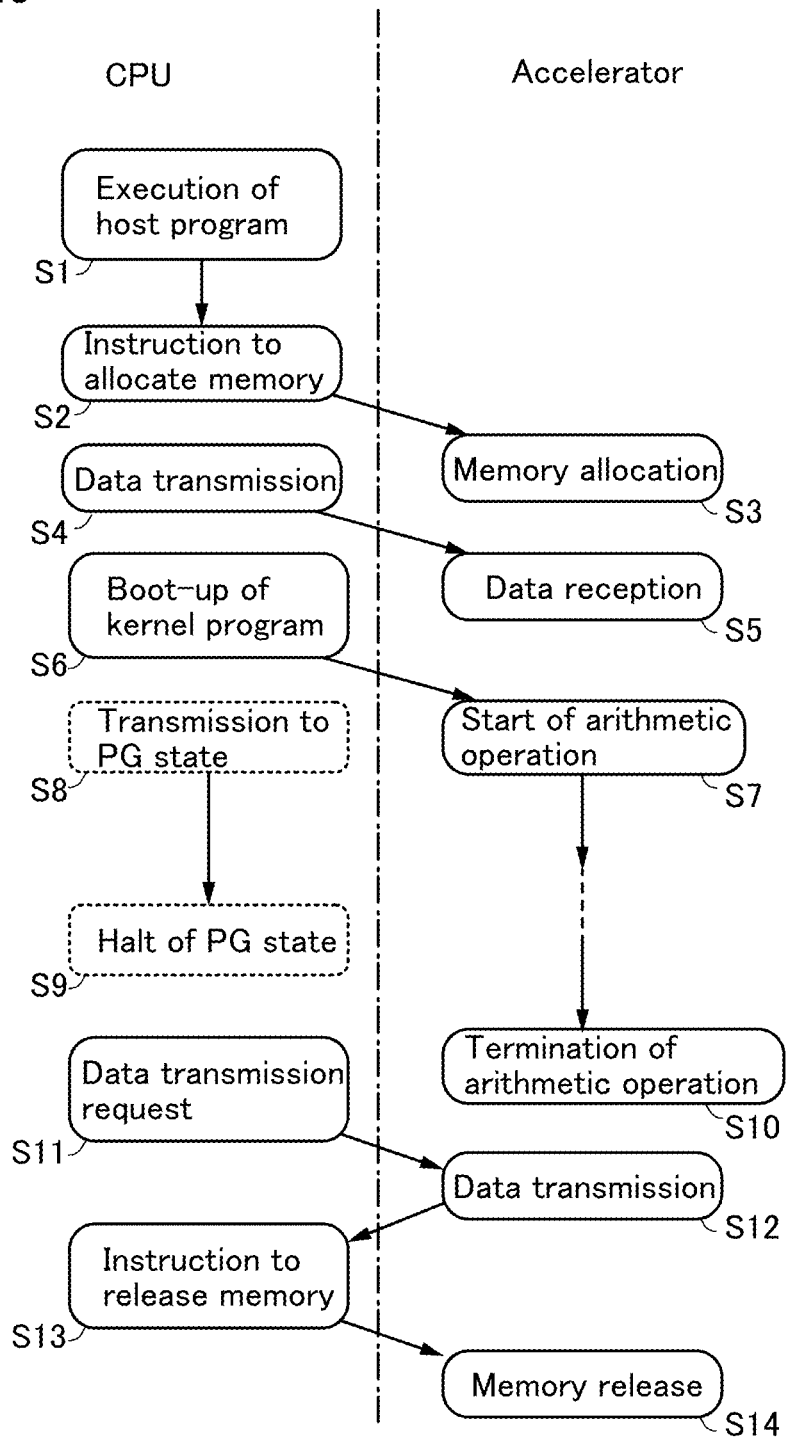
FIG. 29 is a diagram showing a structure example of a semiconductor device.

FIG. 29 illustrates an example of an operation of the case where the accelerator executes part of an arithmetic operation of a program executed by the CPU.

The host program is executed by the CPU (Step S1).

In the case where the CPU confirms an instruction to allocate, to a memory unit, a region for data needed in performing an arithmetic operation using the accelerator (Step S2), the CPU allocates the region for the data to the memory unit (Step S3).

Next, the CPU transmits input data from the main memory to the above-described memory unit (Step S4). The above-described memory unit receives the input data and stores the input data in the region allocated in Step S2 (Step S5).

In the case where the CPU confirms an instruction to boot up the kernel program (Step S6), the accelerator starts execution of the kernel program (Step S7).

Immediately after the accelerator starts the execution of the kernel program, the CPU may be switched from the state of performing an arithmetic operation to a PG state (Step S8). In that case, just before the accelerator terminates the execution of the kernel program, the CPU is switched from the PG state to a state of performing an arithmetic operation (Step S9). By bringing the CPU into a PG state during the period from Step S8 to Step S9, the power consumption and heat generation of the semiconductor device as a whole can be suppressed.

When the accelerator terminates the execution of the kernel program, output data is stored in the above-described memory unit (Step S10).

After the execution of the kernel program is terminated, in the case where the CPU confirms an instruction to transmit the output data stored in the memory unit to the main memory (Step S11), the above-described output data is transmitted to the above-described main memory and stored in the above-described main memory (Step S12).

In the case where the CPU confirms an instruction to release the region for the data allocated to the memory unit (Step S13), the region allocated to the above-described memory unit is released (Step S14).

By repeating the operations from Step S1 to Step S14 described above, part of the arithmetic operation of the program executed by the CPU can be executed by the accelerator while the power consumption and heat generation of the CPU and the accelerator are suppressed.

This embodiment can be combined with any of the other embodiments as appropriate.

Embodiment 5

In this embodiment, an example of a CPU including a CPU core capable of power gating will be described.

Figure 30:
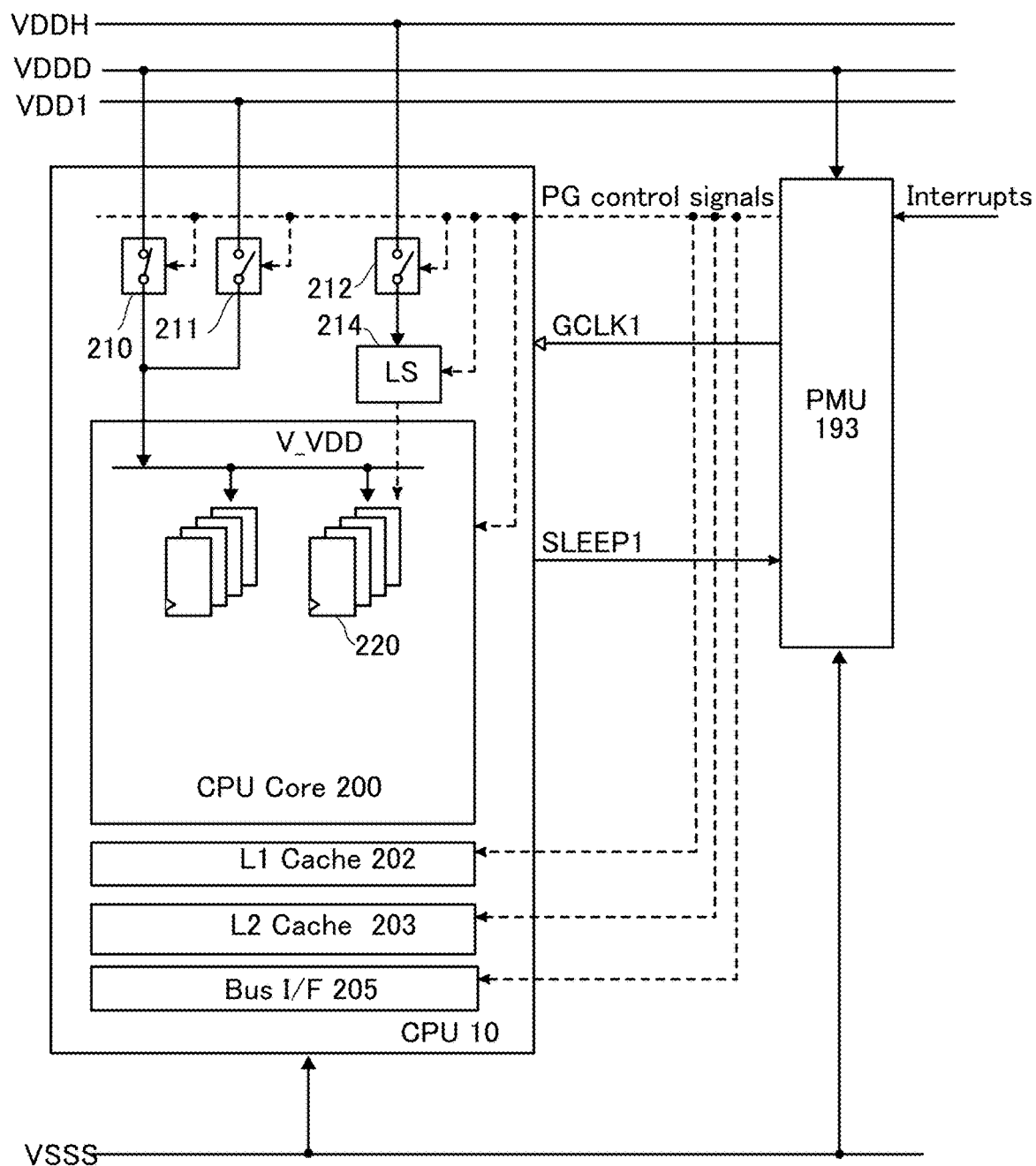
FIG. 30 is a diagram illustrating a structure example of a CPU.

FIG. 30 illustrates a structure example of the CPU 10. The CPU 10 includes a CPU core (CPU Core) 200, an L1 (level 1) cache memory device (L1 Cache) 202, an L2 cache memory device (L2 Cache) 203, a bus interface portion (Bus I/F) 205, power switches 210 to 212, and a level shifter (LS) 214. The CPU core 200 includes a flip-flop 220.

Through the bus interface portion 205, the CPU core 200, the L1 cache memory device 202, and the L2 cache memory device 203 are mutually connected to one another.

A PMU 193 generates a clock signal GCLK1 and various PG (power gating) control signals in response to signals such as an interrupt signal (Interrupts) input from the outside and a signal SLEEP1 issued from the CPU 10. The clock signal GCLK1 and the PG control signal are input to the CPU 10. The PG control signal controls the power switches 210 to 212 and the flip-flop 220.

The power switch 210 and the power switch 211 control application of a voltage VDDD and a voltage VDD1 to a virtual power supply line V_VDD (hereinafter referred to as a V_VDD line), respectively. The power switch 212 controls application of a voltage VDDH to the level shifter (LS) 214. A voltage VSSS is input to the CPU 10 and the PMU 193 without through the power switches. The voltage VDDD is input to the PMU 193 without through the power switches.

The voltages VDDD and VDD1 are drive voltages for a CMOS circuit. The voltage VDD1 is lower than the voltage VDDD and is a drive voltage in a sleep state. The voltage VDDH is a drive voltage for an OS transistor and is higher than the voltage VDDD.

The L1 cache memory device 202, the L2 cache memory device 203, and the bus interface portion 205 each include at least a power domain capable of power gating. The power domain capable of power gating is provided with one or a plurality of power switches. These power switches are controlled by the PG control signal.

The flip-flop 220 is used for a register. The flip-flop 220 is provided with a backup circuit. The flip-flop 220 is described below.

Figure 31A:
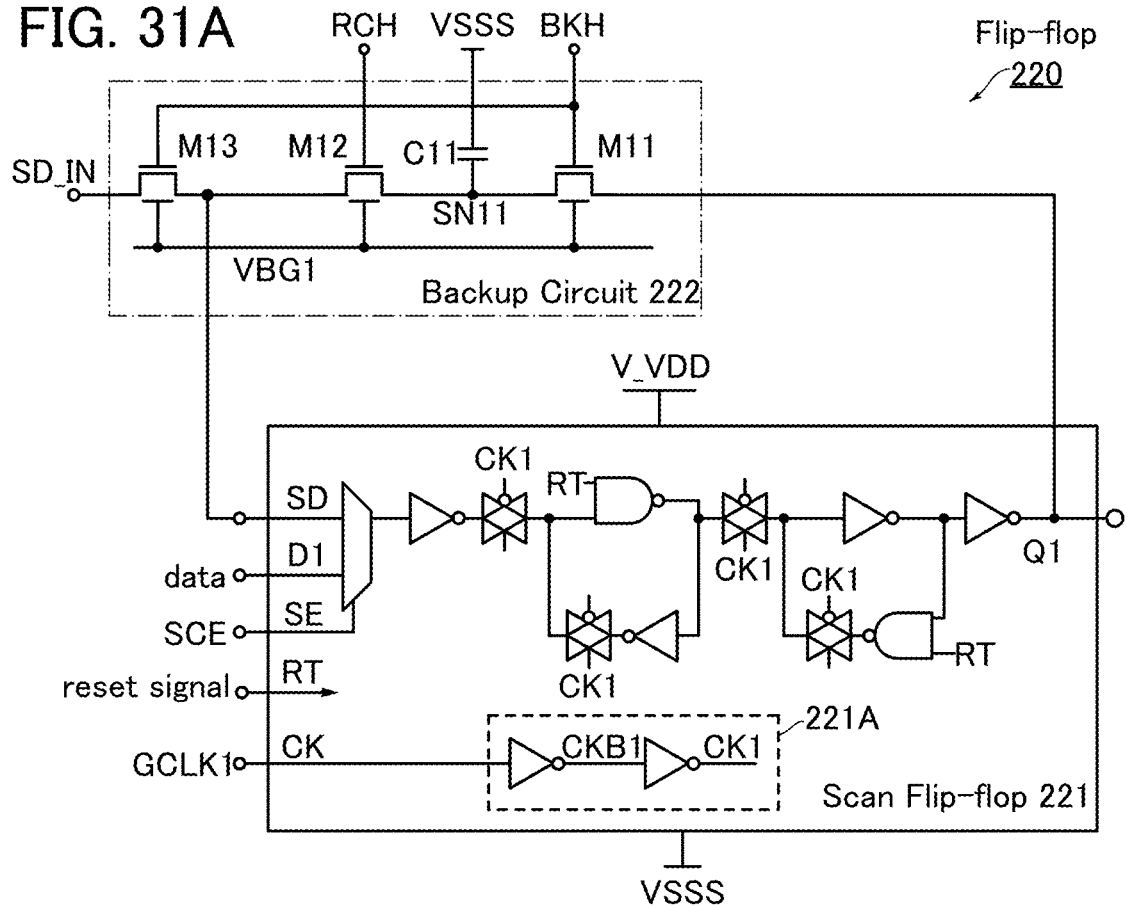
FIG. 31A and FIG. 31B are diagrams illustrating a structure example of a CPU.

FIG. 31 shows a circuit structure example of the flip-flop 220. The flip-flop 220 includes a scan flip-flop 221 and a backup circuit 222.

The scan flip-flop 221 includes nodes D1, Q1, SD, SE, RT, and CK and a clock buffer circuit 221A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 221A. Respective analog switches in the scan flip-flop 221 are connected to nodes CK1 and CKB1 of the clock buffer circuit 221A. The node RT is a reset signal input node.

The signal SCE is a scan enable signal, which is generated in the PMU 193. The PMU 193 generates signals BK and RC (not illustrated). The level shifter 214 level-shifts the signals BK and RC to generate signals BKH and RCH. The signals BK and RC are a backup signal and a recovery signal.

The circuit structure of the scan flip-flop 221 is not limited to that in FIG. 31. A scan flip-flop prepared in a standard circuit library can be applied.

The backup circuit 222 includes nodes SD_IN and SN11, transistors M11 to M13, and a capacitor C11.

The node SD_IN is a scan test data input node and is connected to the node Q1 of the scan flip-flop 221. The node SN11 is a retention node of the backup circuit 222. The capacitor C11 is a storage capacitor for retaining the voltage of the node SN11.

The transistor M11 controls continuity between the node Q1 and the node SN11. The transistor M12 controls continuity between the node SN11 and the node SD. The transistor M13 controls continuity between the node SD_IN and the node SD. The on/off of the transistors M11 and M13 is controlled by the signal BKH, and the on/off of the transistor M12 is controlled by the signal RCH.

The transistors M11 to M13 are OS transistors like the transistors 25 to 27 included in the above-described memory circuit 24. The transistors M11 to M13 have back gates in the illustrated structure. The back gates of the transistors M11 to M13 are connected to a power supply line for supplying a voltage VBG1.

At least the transistors M11 and M12 are preferably OS transistors. Because of an extremely low off-state current, which is a feature of the OS transistor, a decrease in the voltage of the node SN11 can be suppressed and almost no power is consumed to retain data; therefore, the backup circuit 222 has a nonvolatile characteristic. Data is rewritten by charging and discharging of the capacitor C11; hence, there is theoretically no limitation on rewrite cycles of the backup circuit 222, and data can be written and read out with low energy.

Figure 31B:
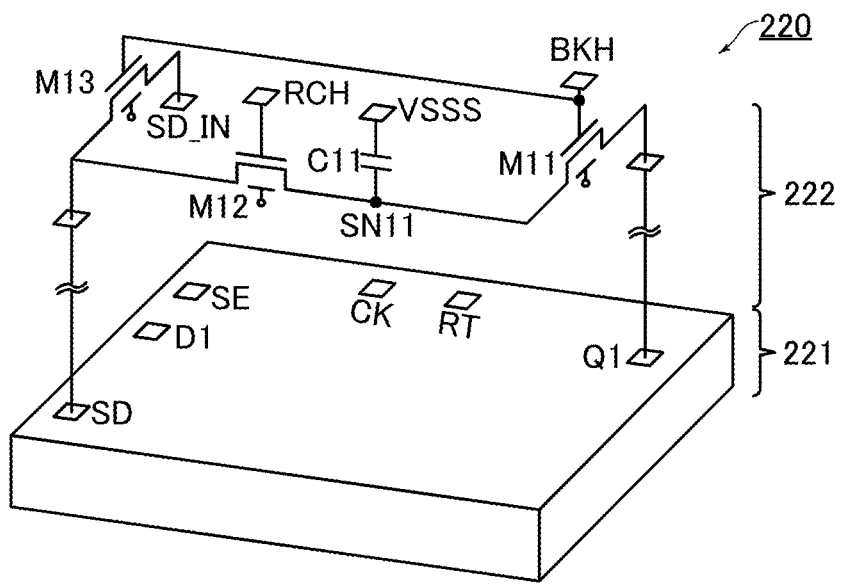

All of the transistors in the backup circuit 222 are extremely preferably OS transistors. As illustrated in FIG. 31B, the backup circuit 222 can be stacked on the scan flip-flop 221 configured with a silicon CMOS circuit.

The number of elements in the backup circuit 222 is much smaller than the number of elements in the scan flip-flop 221; thus, there is no need to change the circuit structure and layout of the scan flip-flop 221 in order to stack the backup circuit 222. That is, the backup circuit 222 is a backup circuit that has very broad utility. In addition, the backup circuit 222 can be provided in a region where the scan flip-flop 221 is formed; thus, even when the backup circuit 222 is incorporated, the area overhead of the flip-flop 220 can be zero. Thus, the backup circuit 222 is provided in the flip-flop 220, whereby power gating of the CPU core 200 is enabled. The power gating of the CPU core 200 is enabled with high efficiency owing to little energy necessary for the power gating.

When the backup circuit 222 is provided, parasitic capacitance due to the transistor M11 is added to the node Q1. However, the parasitic capacitance is lower than parasitic capacitance due to a logic circuit connected to the node Q1; thus, there is no influence of the parasitic capacitance on the operation of the scan flip-flop 221. That is, even when the backup circuit 222 is provided, the performance of the flip-flop 220 does not substantially decrease.

The CPU core 200 can be set to a clock gating state, a power gating state, or a resting state as a low power consumption state. The PMU 193 selects the low power consumption mode of the CPU core 200 on the basis of the interrupt signal, the signal SLEEP1, and the like. For example, in the case of transition from a normal operation state to a clock gating state, the PMU 193 stops generation of the clock signal GCLK1.

For example, in the case of transition from a normal operation state to a resting state, the PMU 193 performs voltage and/or frequency scaling. For example, when the voltage scaling is performed, the PMU 193 turns off the power switch 210 and turns on the power switch 211 to input the voltage VDD1 to the CPU core 200. The voltage VDD1 is a voltage at which data in the scan flip-flop 221 is not lost. When the frequency scaling is performed, the PMU 193 reduces the frequency of the clock signal GCLK1.

In the case where the CPU core 200 transitions from a normal operation state to a power gating state, data in the scan flip-flop 221 is backed up to the backup circuit 222. When the CPU core 200 is returned from the power gating state to the normal operation state, recovery operation of writing back data in the backup circuit 222 to the scan flip-flop 221 is performed.

Figure 32:
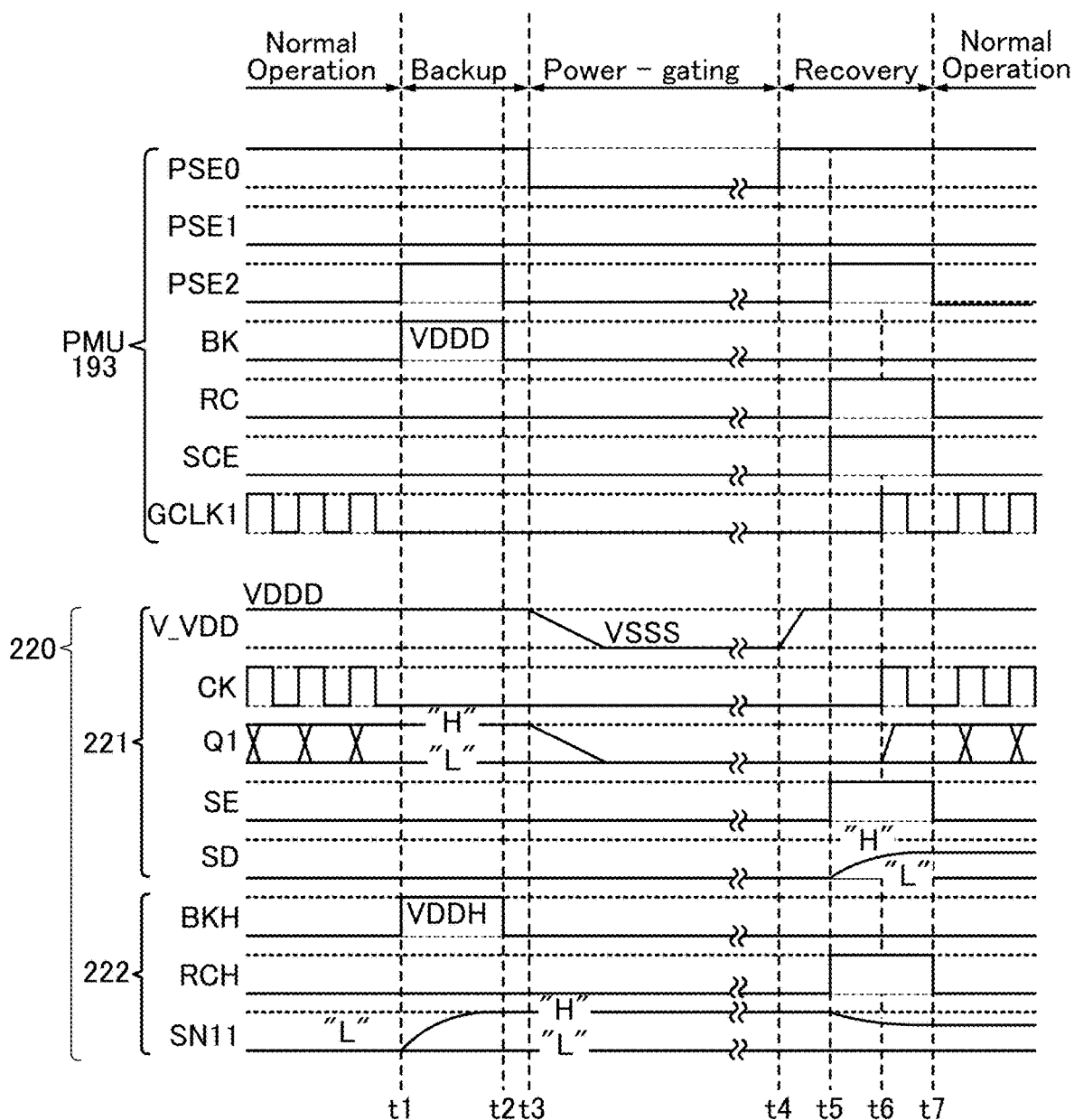
FIG. 32 is a diagram illustrating a structure example of a CPU.

FIG. 32 illustrates an example of the power gating sequence of the CPU core 200. Note that in FIG. 32, t1 to t7 represent the time. Signals PSE0 to PSE2 are control signals of the power switches 210 to 212, which are generated in the PMU 193. When the signal PSE0 is at "H"/"L", the power switch 210 is on/off. The same applies also to the signals PSE1 and PSE2.

Until time t1, a normal operation is performed. The power switch 210 is on, and the voltage VDDD is input to the CPU core 200. The scan flip-flop 221 performs the normal operation. At this time, the level shifter 214 does not need to be operated; thus, the power switch 212 is off and the signals SCE, BK, and RC are each at "L". The node SE is at "L"; thus, the scan flip-flop 221 stores data in the node D1. Note that in the example of FIG. 32, the node SN11 of the backup circuit 222 is at "L" at time t1.

A backup operation is described. At time t1, the PMU 193 stops the clock signal GCLK1 and sets the signals PSE2 and BK at "H". The level shifter 214 becomes active and outputs the signal BKH at "H" to the backup circuit 222.

The transistor M11 in the backup circuit 222 is turned on, and data in the node Q1 of the scan flip-flop 221 is written to the node SN11 of the backup circuit 222. When the node Q1 of the scan flip-flop 221 is at "L", the node SN11 remains at "L", whereas when the node Q1 is at "H", the node SN11 becomes "H".

The PMU 193 sets the signals PSE2 and BK at "L" at time t2 and sets the signal PSE0 at "L" at time t3. The state of the CPU core 200 transitions to a power gating state at time t3. Note that at the timing when the signal BK falls, the signal PSE0 may fall.

A power-gating operation is described. When the signal PSE0 is set at "L, data in the node Q1 is lost because the voltage of the V_VDD line decreases. The node SN11 retains data that is stored in the node Q1 at time t3.

A recovery operation is described. When the PMU 193 sets the signal PSE0 at "H" at time t4, the power gating state transitions to a recovery state. Charging of the V_VDD line starts, and the PMU 193 sets the signals PSE2, RC, and SCE at "H" in a state where the voltage of the V_VDD line becomes VDDD (at time t5).

The transistor M12 is turned on, and electric charge in the capacitor C11 is distributed to the node SN11 and the node SD. When the node SN11 is at "H", the voltage of the node SD increases. The node SE is at "H", and thus, data in the node SD is written to a latch circuit on the input side of the scan flip-flop 221. When the clock signal GCLK1 is input to the node CK at time t6, data in the latch circuit on the input side is written to the node Q1. That is, data in the node SN11 is written to the node Q1.

When the PMU 193 sets the signals PSE2, SCE, and RC at "L" at time t7, the recovery operation is terminated.

The backup circuit 222 using an OS transistor is extremely suitable for normally-off computing because both dynamic power consumption and static power consumption are low. Even when the flip-flop 220 is mounted, a decrease in the performance and an increase in the dynamic power of the CPU core 200 can be made hardly to occur.

Note that the CPU core 200 may include a plurality of power domains capable of power gating. In the plurality of power domains, one or a plurality of power switches for controlling voltage input are provided. In addition, the CPU core 200 may include one or a plurality of power domains where power gating is not performed. For example, the power domain where power gating is not performed may be provided with a power gating control circuit for controlling the flip-flop 220 and the power switches 210 to 212.

Note that the application of the flip-flop 220 is not limited to the CPU 10. In the arithmetic device, the flip-flop 220 can be used as the register provided in a power domain capable of power gating.

This embodiment can be combined with any of the other embodiments as appropriate.

Embodiment 6

In this embodiment, a structure of an integrated circuit including the components of the semiconductor device 100 described in the above embodiment is described with reference to FIG. 33 and FIG. 34.

Figure 33:
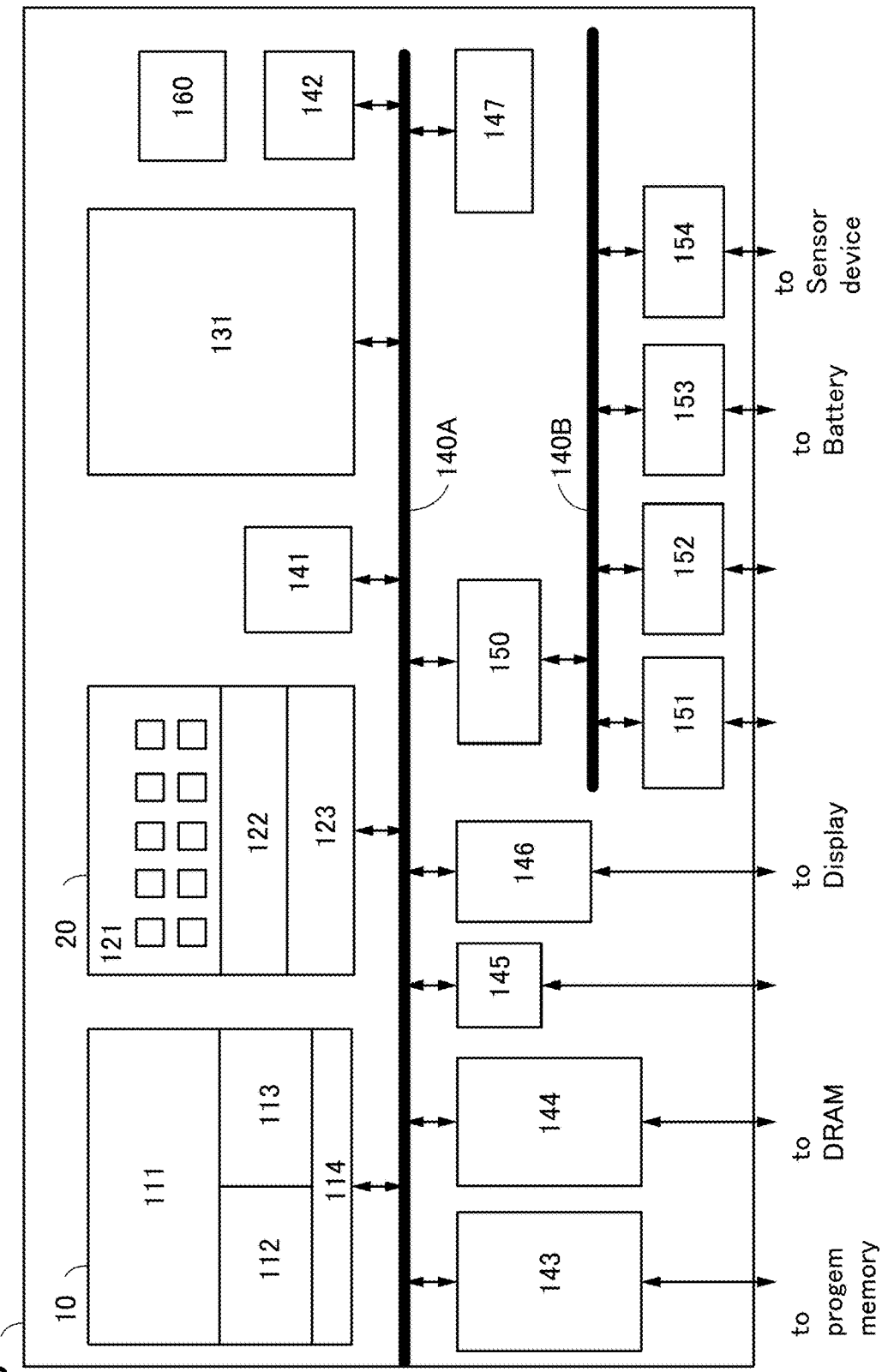
FIG. 33 is a diagram illustrating a structure example of an integrated circuit.

FIG. 33 is an example of a block diagram illustrating the structure example of the integrated circuit including the components of the semiconductor device 100.

An integrated circuit 390 illustrated in FIG. 33 includes the CPU 10, the accelerator 20, an on-chip memory 131, a DMAC (Direct Memory Access Controller) 141, a power supply circuit 160, a power management unit (PMU) 142, a security circuit 147, a memory controller 143, a DDR SDRAM (Double Data Rate Synchronous Dynamic Random Access Memory) controller 144, a USB (Universal Serial Bus) interface circuit 145, a display interface circuit 146, a bridge circuit 150, an interrupt control circuit 151, an interface circuit 152, a battery control circuit 153, and an ADC (Analog-to-digital converter)/DAC (Digital-to-analog converter) interface circuit 154.

The CPU 10 includes a CPU core 111, an instruction cache 112, a data cache 113, and a bus interface circuit 114, for example. The accelerator 20 includes a memory circuit 121, an arithmetic circuit 122, and a controller circuit 123.

The CPU core 111 includes a plurality of CPU cores. The instruction cache 112 can have a circuit structure in which an instruction executed by the CPU core 111 is temporarily stored. The data cache 113 can have a circuit structure in which data processed by the CPU core 111 or data obtained by the processing is temporarily stored. The bus interface circuit 114 can have a circuit structure that can transmit and receive signals such as data and an address to and from a bus for connecting the CPU 10 and another circuit in the semiconductor device.

The memory circuit 121 corresponds to the memory circuit 24 described in Embodiment 1. The memory circuit 121 can have a circuit structure in which data processed by the accelerator 20 is stored. The arithmetic circuit 122 corresponds to the arithmetic circuit 23 described in Embodiment 1. The arithmetic circuit 122 can have a circuit structure in which an arithmetic operation of data retained in the memory circuit 121 is performed. The controller circuit 123 can have a circuit structure as illustrated in FIG. 5B, which controls the circuits in the accelerator 20.

A high-speed bus 140A is a bus for transmitting and receiving at high speed various signals between the CPU 10, the accelerator 20, the on-chip memory 131, the DMAC 141, the power management unit 142, the security circuit 147, the memory controller 143, the DDR SDRAM controller 144, the USB interface circuit 145, and the display interface circuit 146. As an example, an AMBA (Advanced Microcontroller Bus Architecture)-AHB (Advanced High-performance Bus) can be used as a bus.

The on-chip memory 131 has a circuit structure for storing data or a program that is input into and output from the circuit included in the integrated circuit 390, for example, the CPU 10 or the accelerator 20.

The DMAC 141 is a direct memory access controller. With the DMAC 141, a peripheral device other than the CPU 10 can access the on-chip memory 131 without through the CPU 10.

The power management unit 142 has a circuit structure for controlling power gating of circuits such as the CPU core included in the integrated circuit 390.

The security circuit 147 has a circuit structure for improving confidentiality of signals in such a manner that signals are transmitted and received between the integrated circuit 390 and an external circuit after being encrypted.

The memory controller 143 has a circuit structure for writing or reading out a program to be executed by the CPU 10 or the accelerator 20 from a program memory outside the integrated circuit 390.

The DDR SDRAM controller 144 has a circuit structure for writing or reading out data to or from a main memory, such as a DRAM, outside the integrated circuit 390.

The USB interface circuit 145 has a circuit structure for transmitting and receiving data to and from a circuit outside the integrated circuit 390 through a USB port.

The display interface circuit 146 has a circuit structure for transmitting and receiving data to and from a display device outside the integrated circuit 390.

The power supply circuit 160 is a circuit for generating a voltage used in the integrated circuit 390. For example, it is a circuit that generates a negative voltage supplied to a back gate of an OS transistor for stabilizing electrical characteristics.

A low-speed bus 140B is a bus for transmitting and receiving at low speed various signals between the interrupt control circuit 151, the interface circuit 152, the battery control circuit 153, and the ADC/DAC interface circuit 154. As an example, an AMBA-APB (Advanced Peripheral Bus) can be used as the bus. Transmission and reception of various signals between the high-speed bus 140A and the low-speed bus 140B are performed through the bridge circuit 150.

The interrupt control circuit 151 has a circuit structure for performing interrupt processing in response to a request received from a peripheral device.

The interface circuit 152 has a circuit structure for operating an interface such as a UART (Universal Asynchronous Receiver/Transmitter), an I2C (Inter-Integrated Circuit), or an SPI (Serial Peripheral Interface).

The battery control circuit 153 has a circuit structure for transmitting and receiving data related to charging and discharging of a battery outside the integrated circuit 390.

The ADC/DAC interface circuit 154 has a circuit structure for transmitting and receiving data to and from a device outside the integrated circuit 390 that outputs an analog signal, such as a MEMS (Micro Electro Mechanical Systems) device.

Figure 34A:
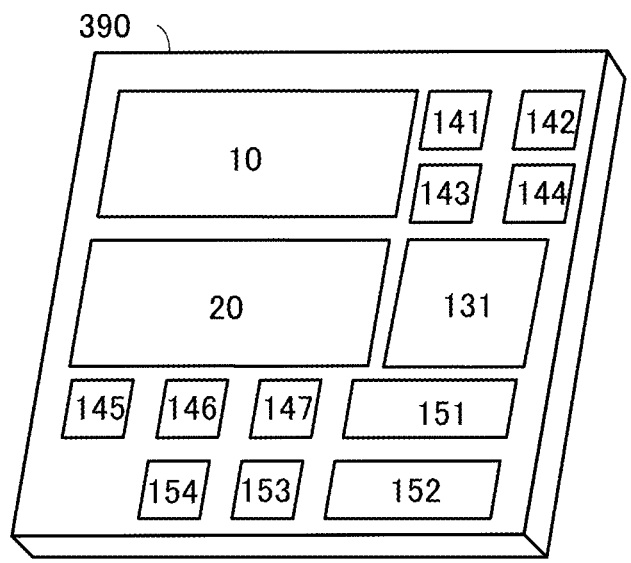
FIG. 34A and FIG. 34B are diagrams each illustrating a structure example of an integrated circuit.
Figure 34B:
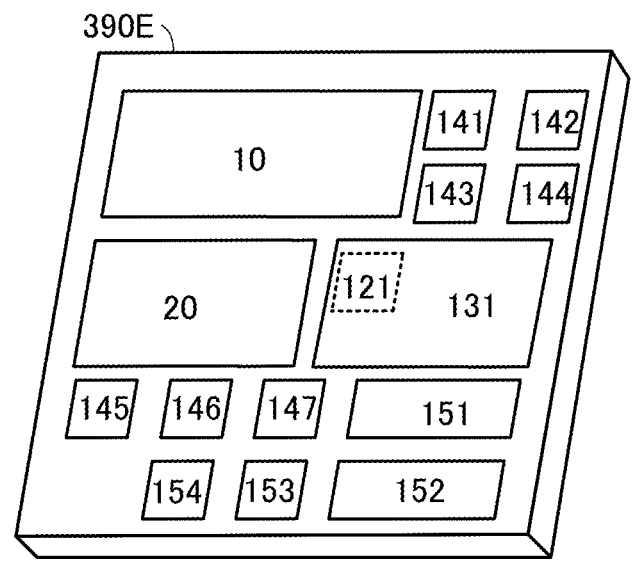

FIGS. 34A and 34B are diagrams each illustrating an arrangement example of the circuit blocks when they are made into an SoC. As in the integrated circuit 390 illustrated in FIG. 34A, the components illustrated in the block diagram of FIG. 33 can be arranged on a chip by being divided into regions.

Note that the on-chip memory 131 illustrated in FIG. 33 can be configured with a storage circuit including an OS memory, for example, a NOSRAM. That is, the on-chip memory 131 and the memory circuit 121 have the same circuit structures. Therefore, when the SoC is made, the on-chip memory 131 and the memory circuit 121 can be arranged in the same region by being integrated as in an integrated circuit 390E illustrated in FIG. 34B.

According to one embodiment of the present invention described above, a novel semiconductor device and electronic device can be provided. Alternatively, according to one embodiment of the present invention, a semiconductor device and an electronic device having low power consumption can be provided. Alternatively, according to one embodiment of the present invention, a semiconductor device and an electronic device capable of suppressing heat generation can be provided.

This embodiment can be combined with any of the other embodiments as appropriate.

Embodiment 7

In this embodiment, an electronic device, a moving object, and an arithmetic system to which the integrated circuit 390 described in the above embodiment can be applied will be described with reference to FIG. 35 to FIG. 38.

Figure 35B:
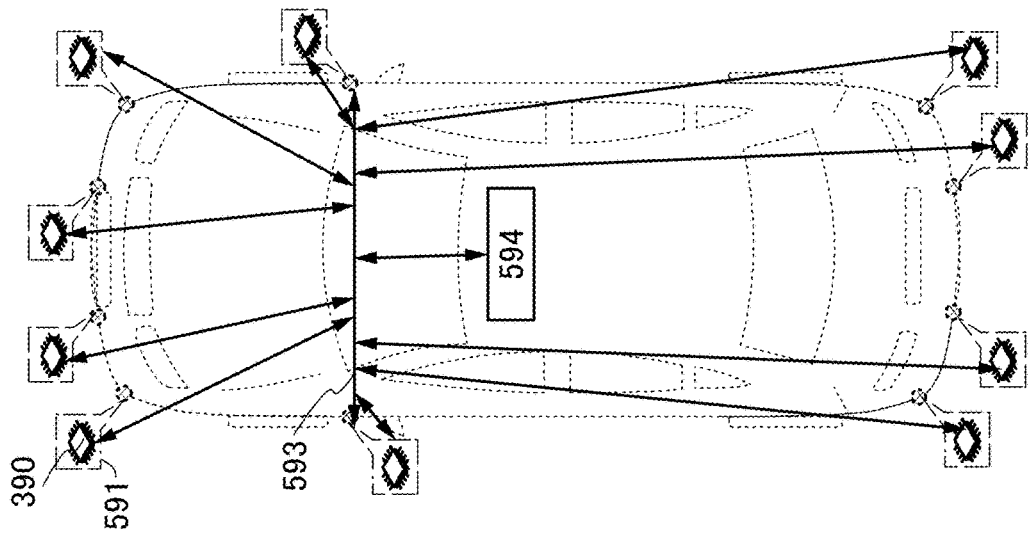
FIG. 35A and FIG. 35B are diagrams illustrating an application example of an integrated circuit.
Figure 35A:
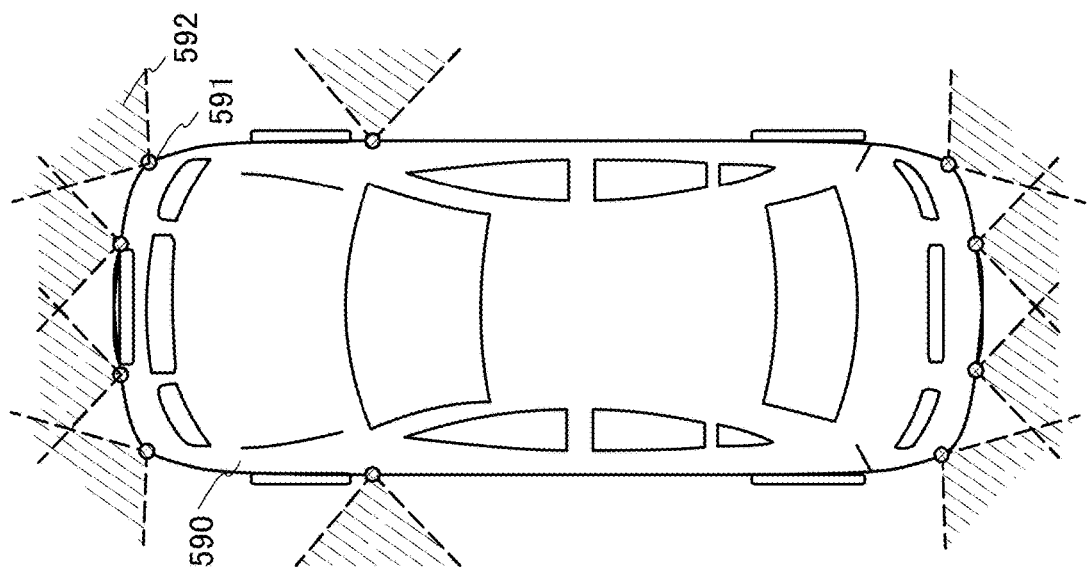

FIG. 35A shows an external diagram of an automobile as an example of a moving object. FIG. 35B is a simplified diagram illustrating data transmission in the automobile. An automobile 590 includes a plurality of cameras 591 and the like. The automobile 590 also includes various sensors such as an infrared radar, a millimeter wave radar, and a laser radar (not illustrated) and the like.

In the automobile 590, the above-described integrated circuit 390 can be used for the camera 591 and the like. The automobile 590 can perform autonomous driving by judging surrounding traffic information such as the presence of a guardrail or a pedestrian in such a manner that the camera 591 processes a plurality of images taken in a plurality of imaging directions 592 with the integrated circuit 390 described in the above embodiment and the plurality of images are analyzed together with a host controller 594 and the like through a bus 593 and the like. The integrated circuit 390 can be used for a system for navigation, risk prediction, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Note that although an automobile is described above as an example of a moving object, moving objects are not limited to an automobile. Examples of moving objects also include a train, a monorail train, a ship, and a flying object (a helicopter, an unmanned aircraft (a drone), an airplane, and a rocket), and these moving objects can include a system utilizing artificial intelligence when equipped with the semiconductor device of one embodiment of the present invention.

Figure 36A:
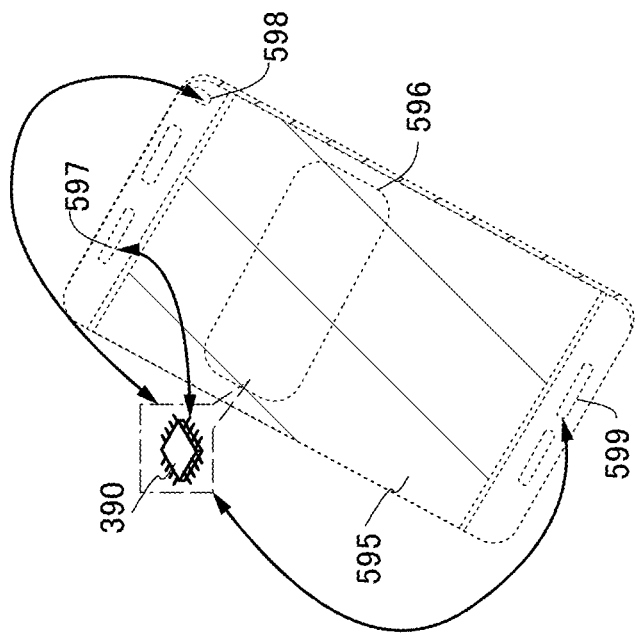
FIG. 36A and FIG. 36B are diagrams illustrating an application example of an integrated circuit.
Figure 36B:
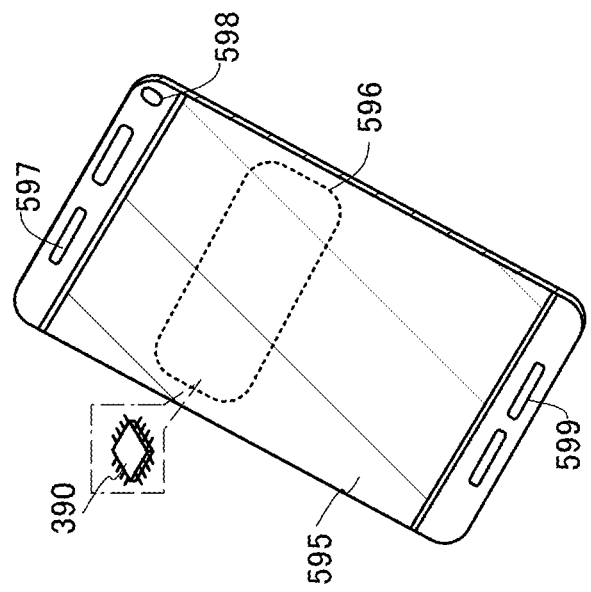

FIG. 36A is an external diagram illustrating an example of a portable electronic device. FIG. 36B is a simplified diagram illustrating data transmission in the portable electronic device. A portable electronic device 595 includes a printed wiring board 596, a speaker 597, a camera 598, a microphone 599, and the like.

In the portable electronic device 595, the printed wiring board 596 can be provided with the above-described integrated circuit 390. The portable electronic device 595 processes and analyzes a plurality of pieces of data obtained from the speaker 597, the camera 598, the microphone 599, and the like with the integrated circuit 390 described in the above embodiment, whereby the user's convenience can be improved. The integrated circuit 390 can be used for a system for voice guidance, image search, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Figure 37A:
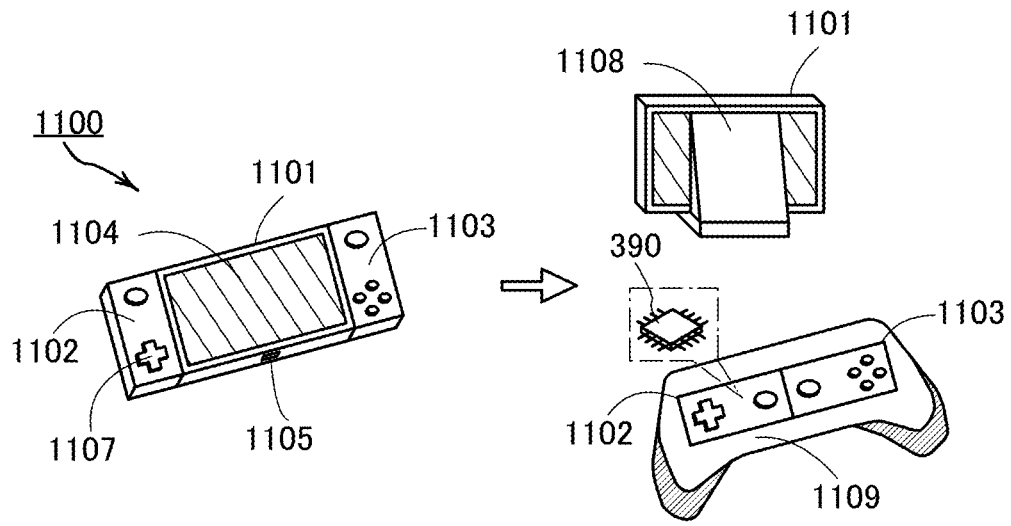
FIG. 37A, FIG. 37B, and FIG. 37C are diagrams each illustrating an application example of an integrated circuit.

A portable game machine 1100 illustrated in FIG. 37A includes a housing 1101, a housing 1102, a housing 1103, a display portion 1104, a connection portion 1105, operation keys 1107, and the like. The housing 1101, the housing 1102, and the housing 1103 can be detached. When the connection portion 1105 provided in the housing 1101 is attached to a housing 1108, an image to be output to the display portion 1104 can be output to another video device. Alternatively, the housing 1102 and the housing 1103 are attached to a housing 1109, whereby the housing 1102 and the housing 1103 are integrated and function as an operation portion. The integrated circuit 390 described in the above embodiment can be incorporated into a chip provided on a substrate in the housing 1102 and the housing 1103, for example.

Figure 37B:
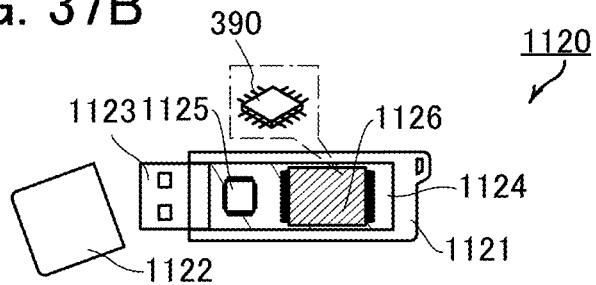

FIG. 37B is a USB connection stick type electronic device 1120. The electronic device 1120 includes a housing 1121, a cap 1122, a USB connector 1123, and a substrate 1124. The substrate 1124 is held in the housing 1121. For example, a memory chip 1125 and a controller chip 1126 are attached to the substrate 1124. The integrated circuit 390 described in the above embodiment can be incorporated into the controller chip 1126 or the like of the substrate 1124.

Figure 37C:
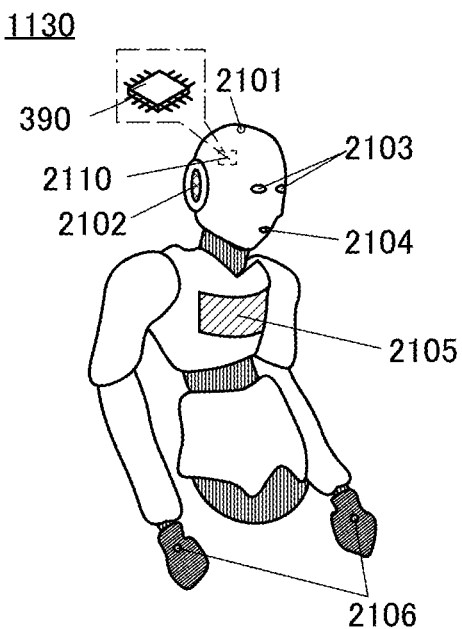

FIG. 37C is a humanoid robot 1130. The robot 1130 includes sensors 2101 to 2106 and a control circuit 2110. For example, the integrated circuit 390 described in the above embodiment can be incorporated into the control circuit 2110.

Figure 38:
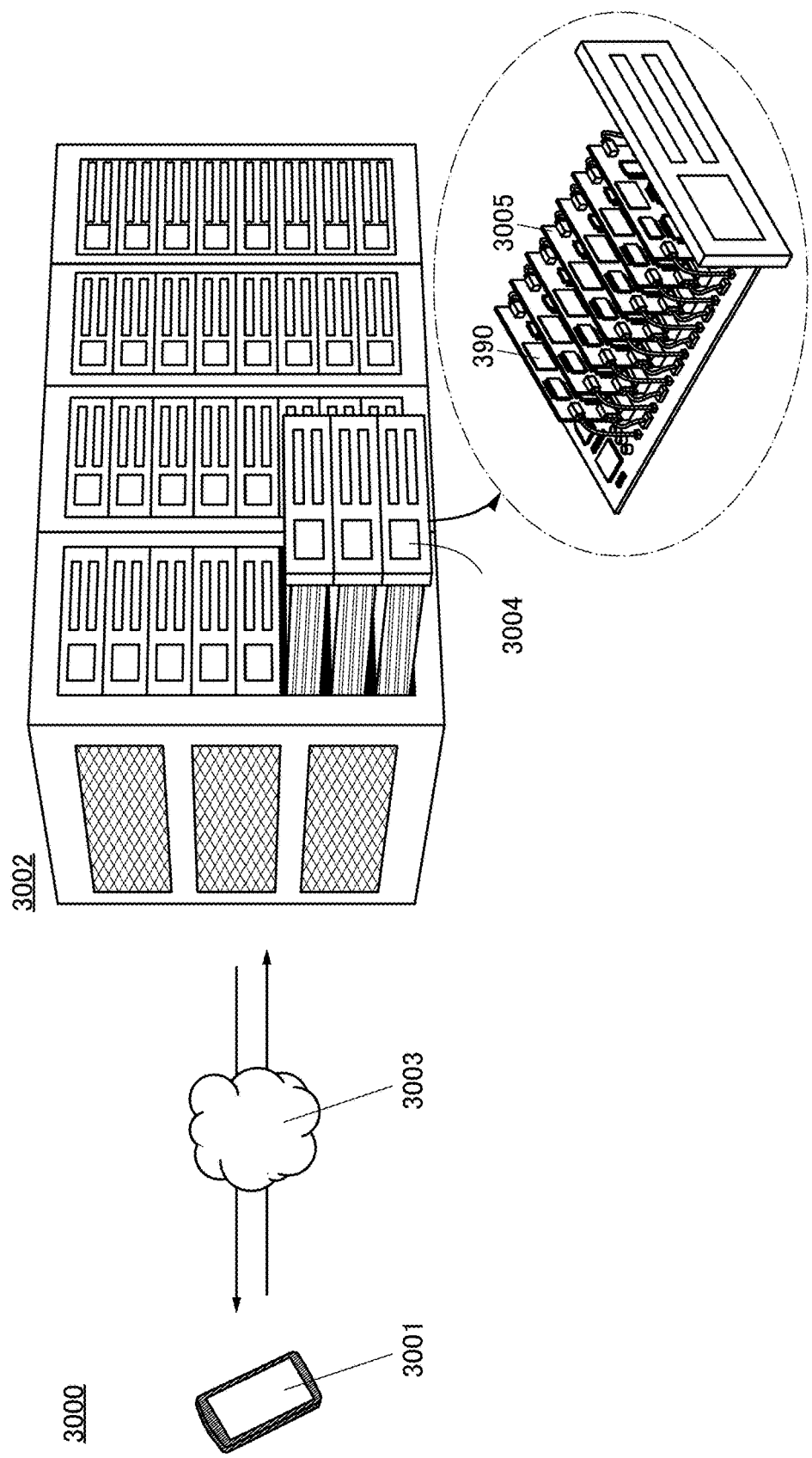
FIG. 38 is a diagram illustrating an application example of an integrated circuit.

The integrated circuit 390 described in the above embodiment can be used for a server that communicates with the electronic devices instead of being incorporated into the electronic devices. In that case, the arithmetic system is configured with the electronic devices and a server. FIG. 38 shows a configuration example of a system 3000.

The system 3000 includes an electronic device 3001 and a server 3002. Communication between the electronic device 3001 and the server 3002 can be performed through Internet connection 3003.

The server 3002 includes a plurality of racks 3004. The plurality of racks are provided with a plurality of substrates 3005, and the integrated circuit 390 described in the above embodiment can be mounted on each of the substrates 3005. Thus, a neural network is configured in the server 3002. The server 3002 can perform an arithmetic operation of the neural network using data input from the electronic device 3001 through the Internet connection 3003. The result of the arithmetic operation executed by the server 3002 can be transmitted as needed to the electronic device 3001 through the Internet connection 3003. Accordingly, a burden of the arithmetic operation in the electronic device 3001 can be reduced.

This embodiment can be combined with any of the other embodiments as appropriate.

(Supplementary Notes on the Description in this Specification and the Like)

The description of the above embodiments and each structure in the embodiments are noted below.

One embodiment of the present invention can be constituted by combining, as appropriate, the structure described in each embodiment with the structures described in the other embodiments and Example. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, content described in the embodiment is content described using a variety of diagrams or content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values, or the like shown in the drawings. For example, variation in signal, voltage, or current due to noise, variation in signal, voltage, or current due to difference in timing, or the like can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

EXAMPLE

As an example of the semiconductor device of one embodiment of the present invention, a Binary AI Processor using a Si transistor (also referred to as a "Si-FET") and a transistor including an In—Ga—Zn oxide in a semiconductor layer where a channel is formed (also referred to as an "IGZO-FET") was fabricated. In this example, the structure and operation simulation result of the fabricated Binary AI Processor are described. The fabricated Binary AI Processor is a semiconductor device capable of Noff computing to be described later.

Technologies such as IoT (Internet of Things) and AI have attracted attention recently. For devices used in the field of IoT (IoT devices), high arithmetic performance is required in AI processing while low power consumption is required.

A power-gating (PG) technique in which power supply to a circuit in a standby state is stopped to reduce power consumption is known. Furthermore, as a technique for realizing low-power IoT devices and the like, Normally-off (Noff) computing in which a memory and the PG technique are combined has been proposed.

In Noff computing, although the whole system operates, data of a circuit that does not need to operate temporarily is stored in a memory, and then power supply to the circuit is stopped. A nonvolatile memory such as an ReRAM (resistance random access memory), an MRAM (magnetic memory), or a PCM (phase-change memory) is considered as the memory used in Noff computing.

An OS memory is suitable as the memory used in Noff computing because it consumes less energy in data writing than an ReRAM, an MRAM, and a PCM. Note that an OS transistor can also be used in an ReRAM, an MRAM, a PCM, or the like.

The fabricated Binary AI Processor Chip (hereinafter also referred to as "BAP 900") includes a processing element (PE) formed through a 130-nm Si CMOS process and an OS memory formed through a 60-nm IGZO process over the PE.

The BAP 900 has a structure in which an OS memory using an IGZO-FET is used as a memory (W-MEM) for storing a weight parameter of an AI Accelerator, and a read line of the memory is directly connected to the processing element.

Figure 39A:
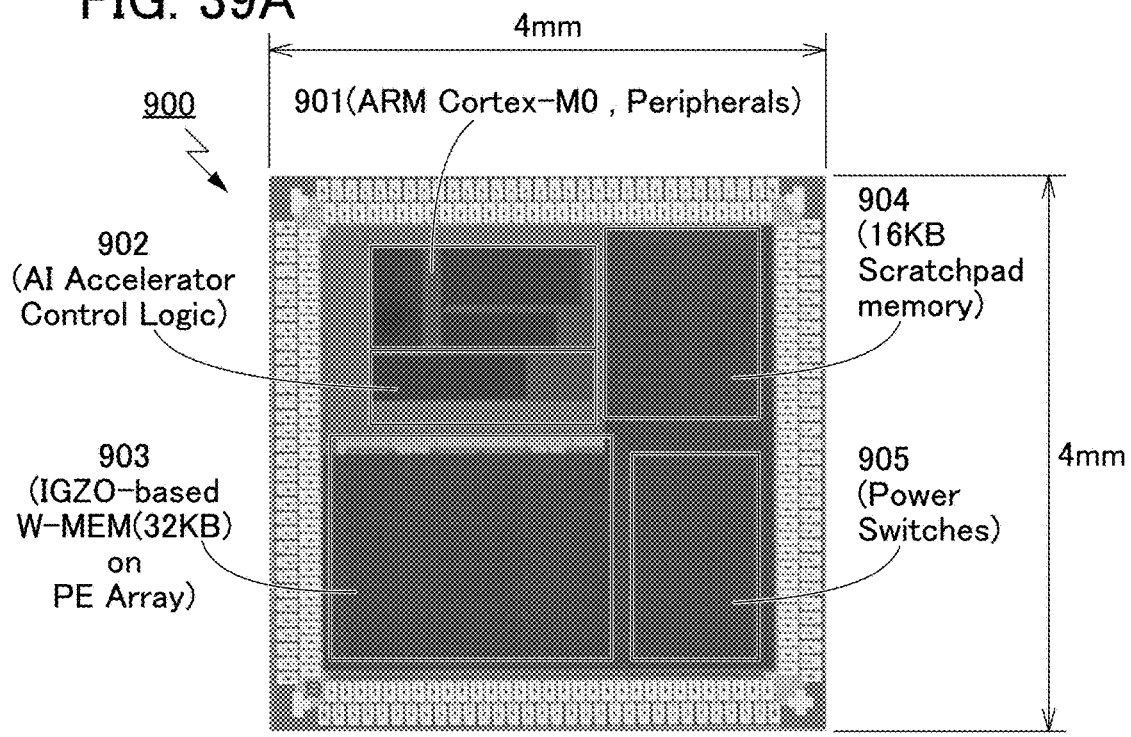
FIG. 39A is a photograph showing the appearance of a semiconductor device.
Figure 39B:
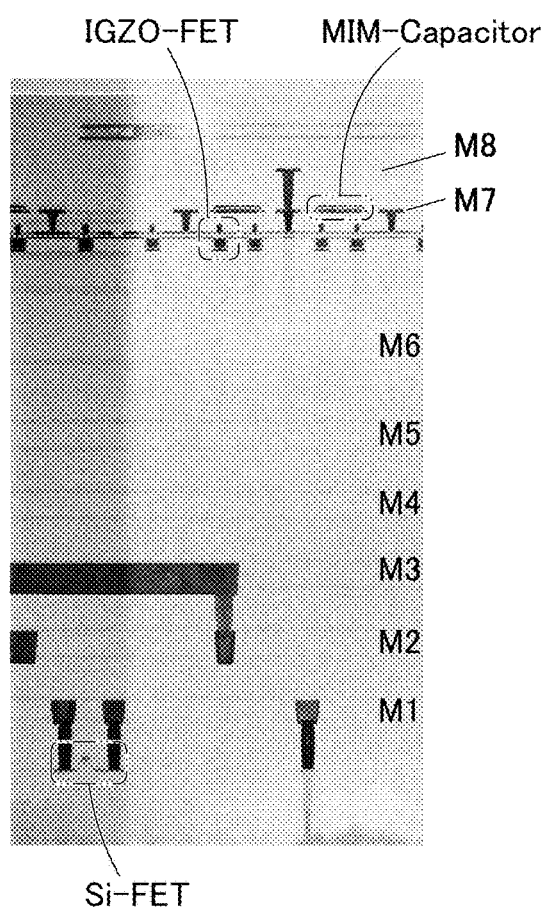
FIG. 39B is a cross-sectional TEM image of the semiconductor device.

FIG. 39A is a photograph showing the appearance of the fabricated BAP 900. FIG. 39B is an enlarged cross-sectional TEM image of part of the BAP 900. The BAP 900 includes a layer M1 to a layer M8. Note that the layer M1 to the layer M8 are layers including conductors such as wirings or electrodes. It is found from FIG. 39B that the IGZO-FET and a capacitor having an MIM (Metal-Insulator-Metal) structure (MIM-Capacitor) are provided above the Si-FET. Table 8 shows the main specifications of the BAP 900.

TABLE 8

| Technology | | 130 nm Si CMOS, 60 nm IGZO-FET (BEOL) |
|---|---|---|
| Supply voltage | | 1.2 V, 3.3 V |
| CPU | | ARM Cortex-M0 |
| AI Accelerator Subsystem | Weight memory | 32 KB |
| | # of PE | 128 |
| Scratchpad memory | | 16 KB |

The BAP 900 includes a circuit portion 901 to a circuit portion 905. The circuit portion 901 includes a 32-bit ARM Cortex-M0 CPU and its peripherals. The circuit portion 902 includes an AI accelerator Control Logic. The circuit portion 903 includes a 32-KB W-MEM formed through the IGZO process on a PE array (IGZO-based W-MEM (32 KB) on PE Array). The circuit portion 904 includes a 16 KB scratchpad memory. The circuit portion 905 includes Power Switches.

Figure 40:
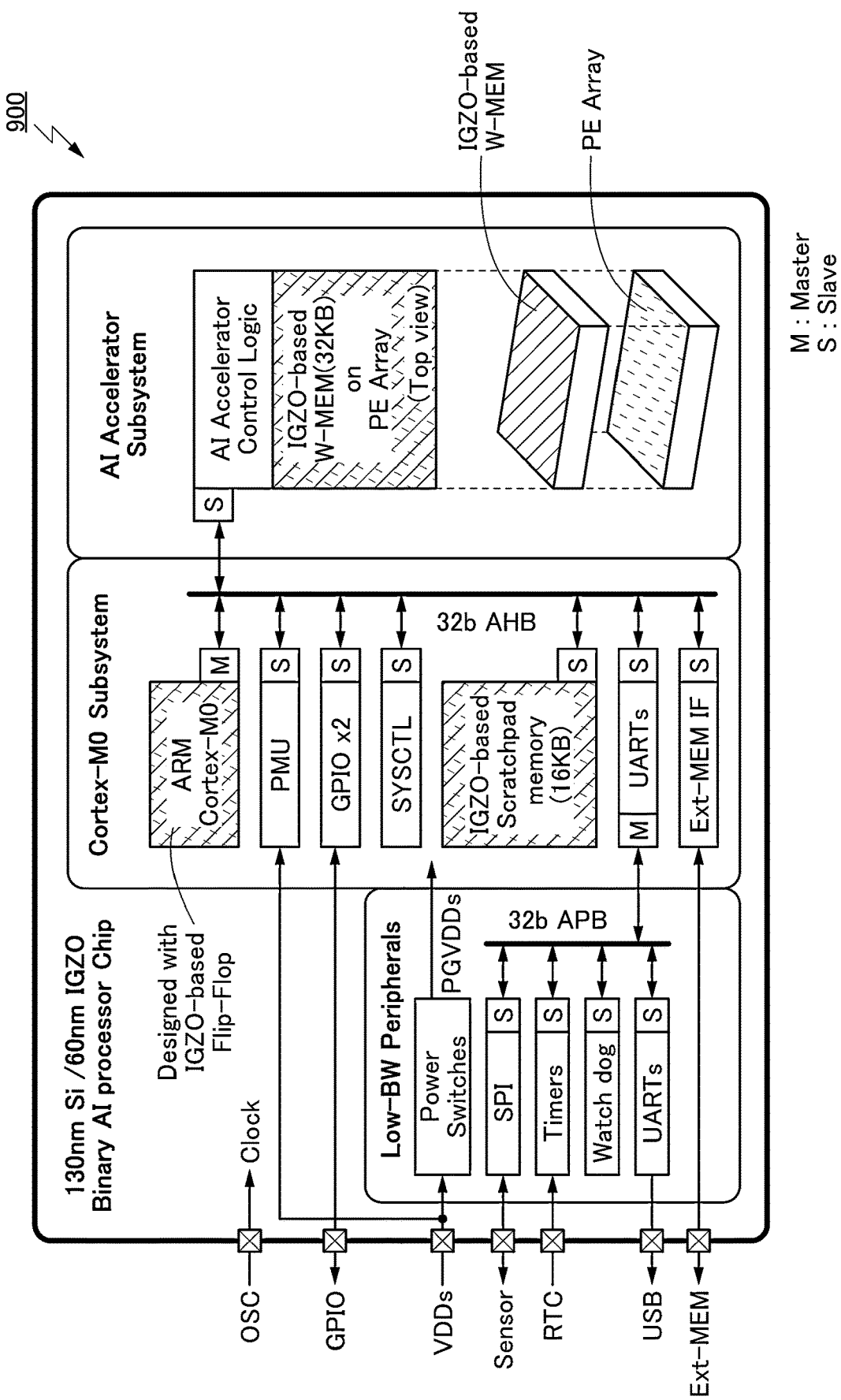
FIG. 40 is a block diagram illustrating a system structure of a semiconductor device.

FIG. 40 is a block diagram illustrating the detailed system structure of the BAP 900. The BAP 900 includes a Cortex-M0 Subsystem, an AI Accelerator Subsystem, and Low-BW (Band Width) Peripherals having a lower operation frequency than the Cortex-M0 Subsystem.

The Cortex-M0 Subsystem includes the 32-bit ARM Cortex-M0 CPU, a Power Management Unit (PMU), two GPIOs (General purpose input/output), SYSCTL, an IGZO-based 16-Kbyte Scratchpad memory, UARTs (Universal Asynchronous Receiver/Transmitter), and an external memory interface (Ext-MEM IF). They are connected to each other through a 32-bit AHB bus line (32b AHB).

The AI Accelerator Subsystem includes the AI Accelerator Control Logic, the PE Array, and the 32-Kbyte W-MEM provided on the PE array. The PE Array includes 128 PEs.

The Low-BW Peripherals include Power Switches, an SPI (Serial Peripheral Interface), Timers, a Watch dog, and the UARTs. The Power Switches, the SPI, the Timers, the Watch dog, and the UARTs are connected through a 32-bit APB bus line (32b APB). The Power Switches have a function of controlling power supply to the Cortex-M0 Subsystem.

The BAP 900 includes an OSC node, a GPIO node, a VDDs node, a Sensor node, an RTC node, an USB node, and an Ext-MEM node. Signals are input and output through these nodes. For example, a clock signal (Clock) is input from the outside through the OSC node. Note that in FIG. 40, "M" denotes Master and "S" denotes Slave.

There are two power domains: a power source VDDs that continuously supplies power from the outside through the VDDs node and a power source PGVDDs capable of PG. The PMU has a function of controlling power supply in accordance with the operation mode. In the case of a standby mode operation, power consumption is reduced in such a manner that the PMU performs PG on a circuit capable of PG. When the AI Accelerator Subsystem is used in AI processing (product-sum operation), AI processing can be performed at higher speed and more efficiently than an arithmetic operation using a CPU.

Since the BAP 900 is capable of PG, power consumption of the whole system can be reduced in a period where the AI processing is not performed. On the other hand, when a signal is input from the Sensor node, the BAP 900 returns to the original system state instantaneously and can perform AI processing immediately.

Figure 41A:
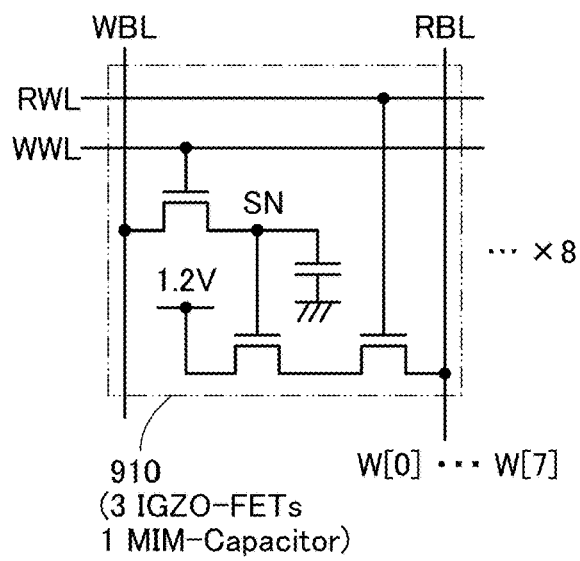
FIG. 41A is a circuit diagram of a memory cell.

FIG. 41A is a circuit diagram of a memory cell 910 included in the W-MEM. The memory cell 910 is a memory cell including three IGZO-FETs and one capacitor. The capacitor is a capacitor having a MIM (Metal-Insulator-Metal) structure. The power supply voltage of the memory cell 910 is 3.3 V. The memory cell 910 is a memory that retains electric charge at a node SN, so that data is not lost even when power supply is stopped.

One memory cell 910 retains 1-bit weight data W. The weight data W is written to the node SN through the wiring WBL. The weight data W written to the node SN is read out through the wiring RBL. With the use of eight memory cells, 8-bit weight data W composed of weight data W[0] to weight data W[7] (also referred to as "W[7:0]") can be retained.

Figure 41B:
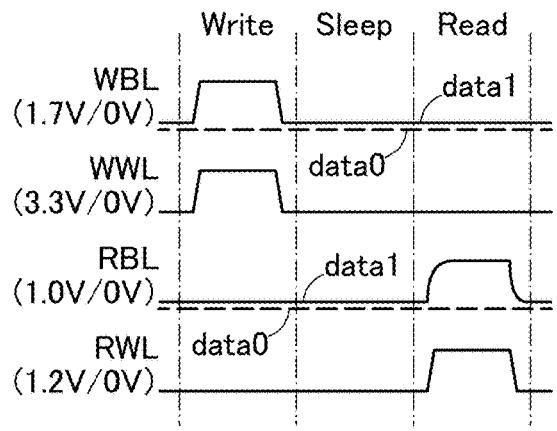
FIG. 41B is a timing chart showing an operation example of the memory cell.

FIG. 41B is a timing chart showing an operation example of the memory cell shown in FIG. 41A. FIG. 41B shows potential changes in the wiring WBL, the wiring WWL, the wiring RBL, and the wiring RWL in a writing mode (Write), a standby mode (Sleep), and a reading mode (Read). The wiring WBL is supplied with 1.7 V or 0 V. The wiring WWL is supplied with 3.3 V or 0 V. The wiring RBL is supplied with 1.0 V or 0 V. The wiring RWL is supplied with 1.2 V or 0 V. FIG. 41B also shows a potential change in the case where the node SN is supplied with data0 and a potential change in the case where the node SN is supplied with data1.

Figure 41C:
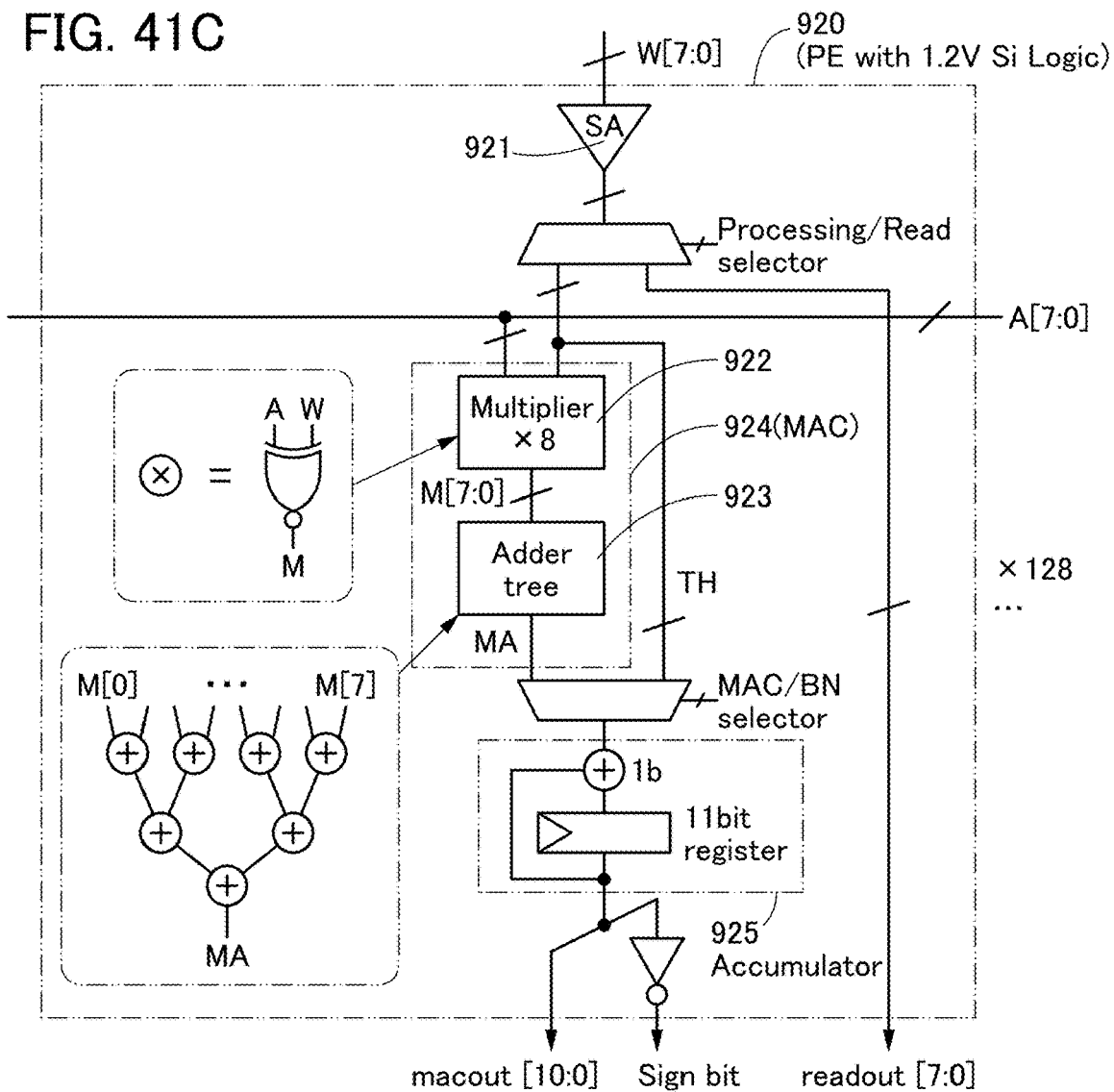
FIG. 41C is a block diagram illustrating a structure of a processing element.

FIG. 41C is a block diagram illustrating a structure of a PE 920. The PE 920 was fabricated with a Si logic cell having a power supply voltage of 1.2 V. The PE 920 includes a sense amplifier 921 (SA), a binary product-sum operation unit 924 (MAC) including a multiplier circuit 922 (Multiplier) and an adder circuit 923 (Adder tress), and an accumulator 925 (Accumulator). The accumulator 925 includes a 1-bit (1b) threshold adder for batch normalization and an 11-bit register.

Eight wirings RBL are connected to one PE 920 in parallel and 8-bit weight data W[7:0] is input. After amplified by the sense amplifier (SA), the input weight data W[7:0] is used in a product-sum operation or read out directly without being used in a product-sum operation. A Processing/Read selector signal determines which processing is to be performed. In the case of being used in a product-sum operation, the weight W[7:0] is multiplied by a signal A[7:0] in the multiplier circuit to be converted into a product signal M[7:0]. In the case of being read out directly, the weight W[7:0] is output as a signal readout[7:0].

The product signal M[7:0] is added in the Adder tree circuit to be converted into a product-sum signal MA. A MAC/BN selector signal determines which of signals, the product-sum signal MA or a threshold signal TH, is input to the accumulator. The accumulator has a function of outputting an 11-bit signal macout[10:0] and a function of outputting a Sign bit signal through an inverter circuit.

Figure 42A:
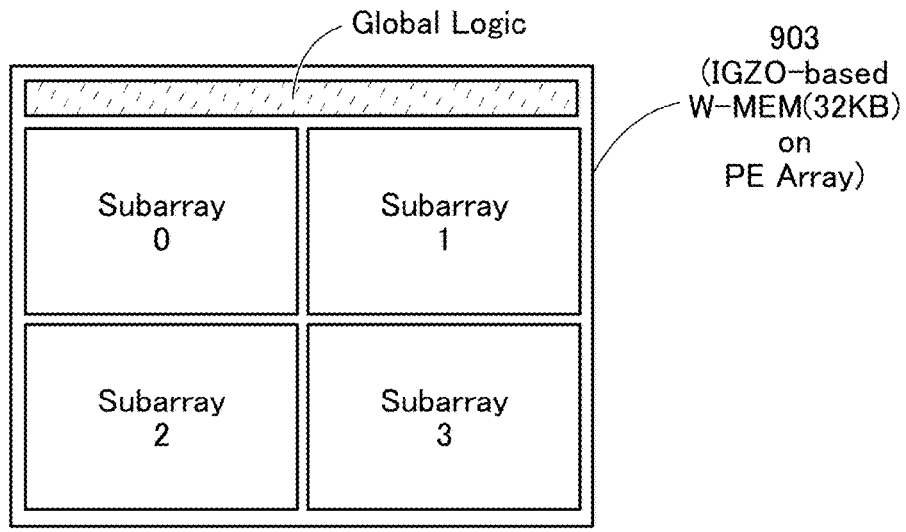
FIG. 42A and FIG. 42B are block diagrams illustrating a structure of a semiconductor device.

FIG. 42A is a block diagram illustrating a structure of the circuit portion 903 (IGZO-based W-MEM (32 KB) on PE Array). The circuit portion 903 includes one Global Logic circuit and four Subarray circuits (Subarray 0 to Subarray 3).

Figure 42B:
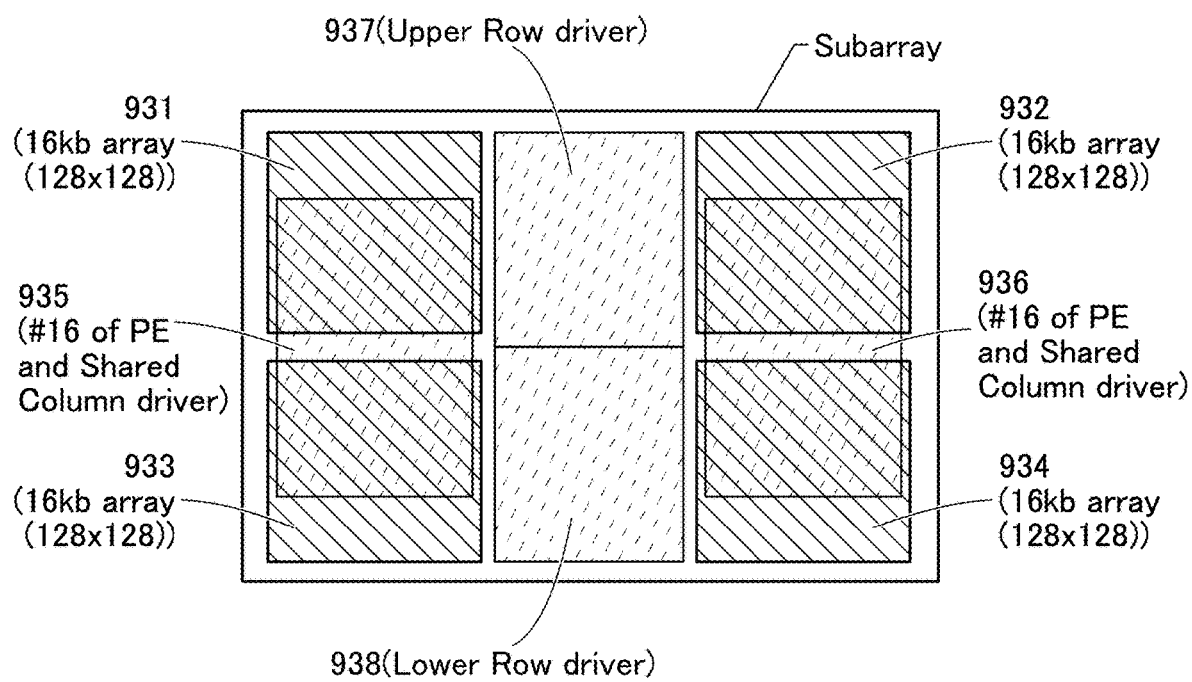

FIG. 42B is a block diagram illustrating a structure of one Subarray circuit. One Subarray circuit includes a circuit portion 931 to a circuit portion 938. The circuit portion 931 to the circuit portion 934 each function as a memory cell array that includes 128×128 memory cells 910 and has a storage capacity of 16 kbit (16 kb array (128×128)). One memory cell array includes 128 wirings RBL (read bit lines). In addition, 128 memory cells are connected to one wiring RBL.

The circuit portion 935 and the circuit portion 936 each include 16 PEs 920 and a column driver (#16 of PE and Shared Column driver). The column driver included in the circuit portion 935 drives the circuit portion 931 and the circuit portion 933. The column driver included in the circuit portion 936 drives the circuit portion 932 and the circuit portion 934. The circuit portion 937 includes a row driver (Upper Row driver) for driving the circuit portion 931 and the circuit portion 932. The circuit portion 938 includes a row driver (Lower Row driver) for driving the circuit portion 933 and the circuit portion 934.

Thus, in the whole circuit portion 903, 1024 wirings RBL are connected to the PE array in parallel. Data read out from the 1024 wirings RBL are subjected to a parallel arithmetic operation. Furthermore, the row drivers are provided to overlap with the memory cell arrays, whereby energy used for data reading and the chip area can be reduced.

Figure 43A:
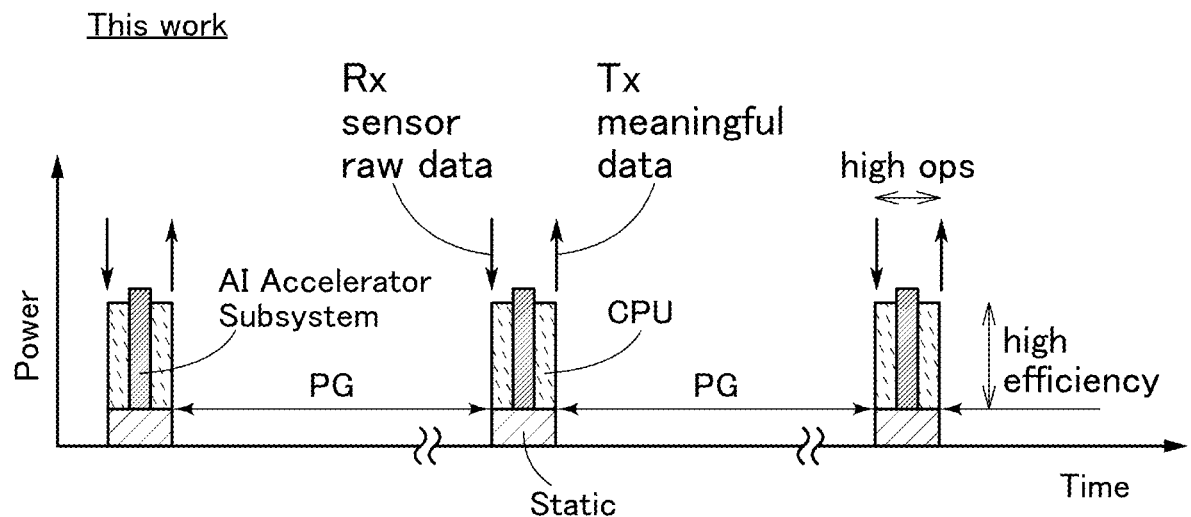

FIG. 43A is a conceptual diagram of a change in power consumed by the fabricated BAP 900 in an operation period and a PG period (This work). As a comparison example, FIG. 43B is a conceptual diagram of a change in power consumption in a conventional operation period (where PG is not performed) (Conventional). In both FIG. 43A and FIG. 43B, the vertical axis represents power consumption (Power) and the horizontal axis represents elapsed time (Time).

In the conventional operation, weight data and data of a neural network structure or the like are lost when power supply is stopped; therefore, these data need to be read out from a ROM or the like and be written to a RAM in restart (ROM/RAM access). Consequently, arithmetic processing time is difficult to shorten. Moreover, in proportion to the arithmetic processing time, static power consumption (Static) is also increased in addition to the power consumption in memory access and the power consumption of the CPU.

The BAP 900 fabricated this time starts when a startup signal Rx (sensor raw data) of the BAP 900 is input from the sensor node, and raw data is transferred from the CPU to the AI Accelerator Subsystem. The raw data is subjected to arithmetic processing in the AI Accelerator Subsystem and an arithmetic result is output as a signal Tx (meaningful data). After that, PG is performed. Parallel processing is performed in the AI Accelerator Subsystem; thus, arithmetic operation time is shorter (high ops) and power consumption is lower than those of the conventional example. Accordingly, highly efficient arithmetic processing is possible (high efficiency).

Figure 44A:
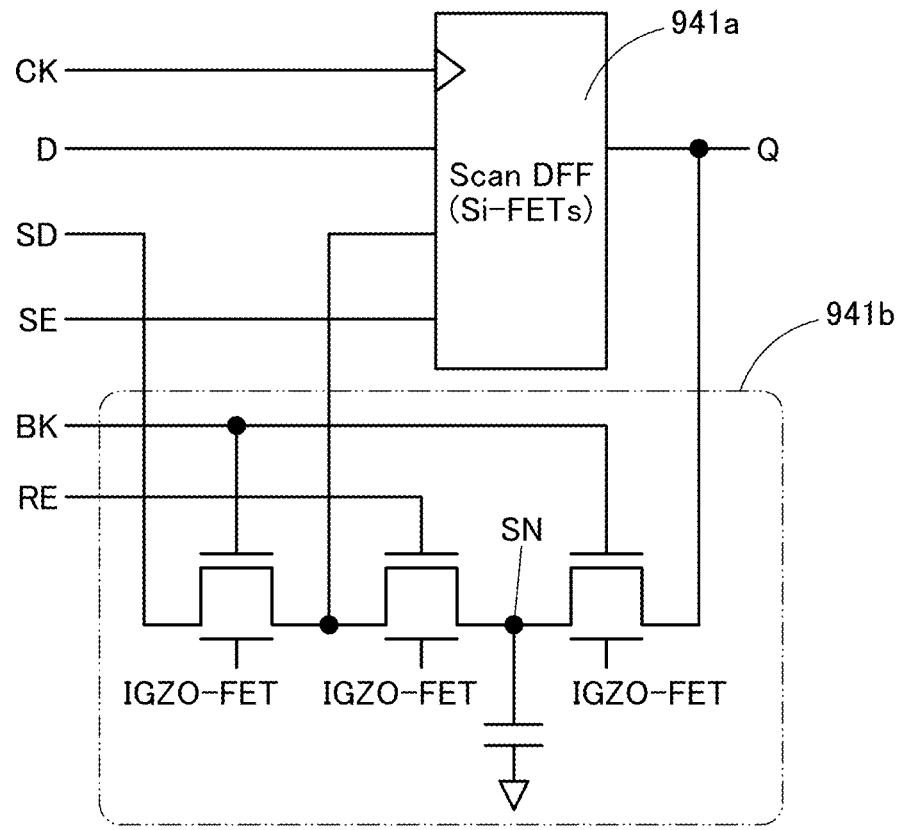
FIG. 44A and FIG. 44B are circuit diagrams of data retention circuits.
Figure 44B:
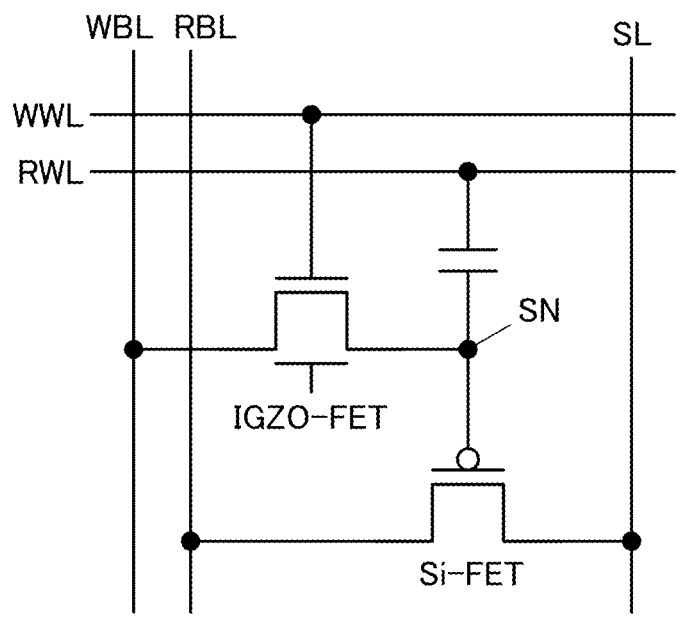

In the BAP 900 fabricated this time, data needed in restoration, such as weight data, is retained just before start of PG. An OS memory is preferably used for retaining such data. FIG. 44A and FIG. 44B illustrate examples of data retention circuits used in the BAP 900.

A data retention circuit 941 illustrated in FIG. 44A has a structure in which an OS memory 941b including IGZO-FETs is combined with a scan D flip-flop 941a (Scan DFF) formed through a Si process (Si-FET).

The scan D flip-flop 941a is electrically connected to a terminal CK, a terminal D, a terminal SE, and a terminal Q. The scan D flip-flop 941a is electrically connected to the terminal Q through the IGZO-FETs. The OS memory 941b is electrically connected to a terminal BK, a terminal RE, and the terminal Q.

A data retention circuit 942 illustrated in FIG. 44B is a 1Tr1C scratchpad memory cell (IGZO-based Scratchpad memory cell) formed using a Si-FET, an IGZO-FET, and a capacitor. The data retention circuit 942 is electrically connected to the wiring WWL, the wiring RWL, the wiring WBL, the wiring RBL, and a wiring SL.

In each of the data retention circuit 941 and the data retention circuit 942, data needed in restoration can be retained in the node SN.

The operation of the BAP 900 was examined using circuit simulation software. As the circuit simulation software, SmartSpice produced by Silvaco, Inc. was used.

The following operation was examined in the simulation. First, weight data that had already been leaned was stored in the W-MEM (Write trained W-MEM), and then power supply was stopped (PG). Next, power supply was restarted, binary image data with a resolution of 28×28 was input through the SPI (Input 28×28 binary image data from SPI), and an inference operation was performed (AI operation). After that, an inference result was output to the SPI (Output inference result to SPI), and power supply was stopped again.

Figure 45A:
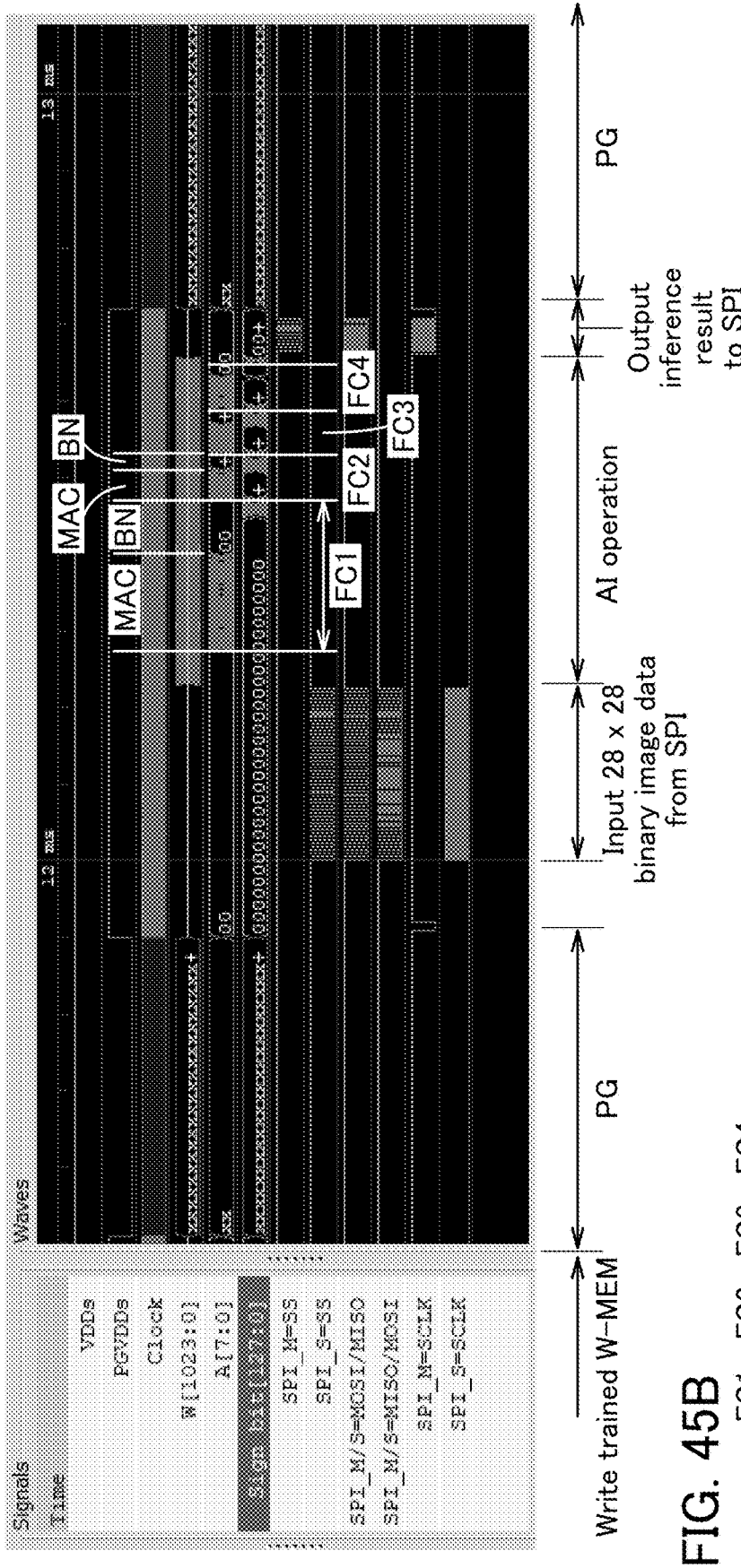
FIG. 45A is a diagram showing operation waveforms after simulation starts.
Figure 45B:
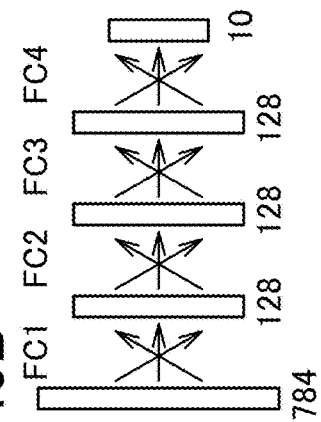
FIG. 45B is a diagram illustrating a neural network model assumed in the simulation.

FIG. 45A shows an example of operation waveforms after execution of the simulation. FIG. 45B shows a fully connected neural network model assumed in the simulation. In the neural network model assumed in the simulation, three hidden layers each including 128 neurons were set between an input layer including 784 neurons and an output layer including 10 neurons. Note that in FIG. 45A and FIG. 45B, full connection of the input layer and the first hidden layer is denoted by FC1, full connection of the first hidden layer and the second hidden layer is denoted by FC2, full connection of the second hidden layer and the third hidden layer is denoted by FC3, and full connection of the third hidden layer and the output layer is denoted by FC4. Through the simulation, it was confirmed that the above-described operation was performed without any problem.

Table 9 shows arithmetic efficiency, consumption energy, and the like estimated from the simulation.

TABLE 9

| Memory Read energy: W-MEM cell | 1.4 pJ/bit |
|---|---|
| Computation energy: 1 PE | 2.46 pJ |
| Energy efficiency (w/AI Accelerator control Logic) | 0.54 TOPS/W |
| Performance | 0.82 GOPS |
| W-MEM retention time | >1 hour @ 85° C. |

The simulation revealed that the arithmetic performance of the BAP 900 using the AI Accelerator Subsystem was 0.82 GOPS. The obtained arithmetic performance is approximately 215 times higher than the arithmetic performance of the BAP 900 of the case where the AI Accelerator Subsystem was not used in another simulation, which is not described in this example. The arithmetic efficiency was found to be 0.54 TOPS/W.

The IGZO-FET is compatible with an event-driven system that requires extremely low power consumption and high-speed restoration and thus can be favorably used for AI application in IoT devices and edge devices.

REFERENCE NUMERALS

10: CPU, 20: accelerator, 21: arithmetic processing unit, 22: memory unit, 23: arithmetic circuit, 24: memory circuit, 29: semiconductor layer, 30: bus, 31: wiring, 100: semiconductor device.

The invention claimed is:
1. A semiconductor device comprising:
a CPU; and
an accelerator,
wherein the accelerator comprises a first memory circuit, a driver circuit, and an arithmetic circuit,
wherein the first memory circuit comprises a first transistor,
wherein the first transistor comprises a semiconductor layer comprising a metal oxide in a channel formation region,
wherein the driver circuit comprises a writing circuit and a reading circuit,
wherein the writing circuit is configured to switch data to be written to the first memory circuit to a binary or ternary voltage value in accordance with a switching signal, a writing control signal, and a data signal and outputting the voltage value,
wherein the reading circuit is configured to switch the voltage value to binary or ternary data corresponding to the voltage level retained in the first memory circuit in accordance with a first reference voltage and a second reference voltage and reading out the data,
wherein the driver circuit and the arithmetic circuit each comprise a second transistor,
wherein the second transistor comprises a semiconductor layer comprising silicon in a channel formation region, and
wherein the first transistor is stacked over the second transistor.

2. The semiconductor device according to claim 1, wherein the arithmetic circuit performs a product-sum operation.

3. The semiconductor device according to claim 1, wherein the metal oxide comprises In, Ga, and Zn.

4. The semiconductor device according to claim 1,
wherein the first transistor is electrically connected to a read bit line, and
wherein the read bit line is electrically connected to the arithmetic circuit through a wiring substantially perpendicular to a substrate with the second transistor.

5. A semiconductor device comprising:
a CPU; and
an accelerator,
wherein the accelerator comprises a first memory circuit and an arithmetic circuit,
wherein the first memory circuit comprises a first transistor,
wherein the first transistor comprises a semiconductor layer comprising a metal oxide in a channel formation region,
wherein the arithmetic circuit comprises a second transistor,
wherein the second transistor comprises a semiconductor layer comprising silicon in a channel formation region,
wherein the CPU comprises a CPU core comprising a flip-flop with a backup circuit,
wherein the backup circuit comprises a third transistor,
wherein the third transistor comprises a semiconductor layer comprising a metal oxide in a channel formation region, and
wherein the first transistor is stacked over the second transistor.

6. The semiconductor device according to claim 5, wherein the backup circuit is configured to retain data retained in the flip-flop in a state where supply of a power supply voltage is stopped when the CPU does not operate.

7. The semiconductor device according to claim 5, wherein the arithmetic circuit performs a product-sum operation.

8. The semiconductor device according to claim 5,
wherein the first transistor is electrically connected to a read bit line, and
wherein the read bit line is electrically connected to the arithmetic circuit through a wiring substantially perpendicular to a substrate with the second transistor.

9. A semiconductor device comprising:
a CPU; and
an accelerator,
wherein the accelerator comprises a first memory circuit, a driver circuit, and an arithmetic circuit,
wherein the first memory circuit comprises a first transistor,
wherein the first transistor comprises a semiconductor layer comprising a metal oxide in a channel formation region,
wherein the driver circuit comprises a writing circuit and a reading circuit, wherein the writing circuit is configured to switch data to be written to the first memory circuit to a binary or ternary voltage value in accordance with a switching signal, a writing control signal, and a data signal and outputting the voltage value, wherein the reading circuit is configured to switch the voltage value to binary or ternary data corresponding to the voltage level retained in the first memory circuit in accordance with a first reference voltage and a second reference voltage and reading out the data, wherein the arithmetic circuit comprises a second transistor, wherein the second transistor comprises a semiconductor layer comprising silicon in a channel formation region, wherein the CPU comprises a CPU core comprising a flip-flop with a backup circuit, wherein the backup circuit comprises a third transistor, wherein the third transistor comprises a semiconductor layer comprising a metal oxide in a channel formation region, and wherein the first transistor is stacked over the second transistor.

10. The semiconductor device according to claim 9, wherein the backup circuit is configured to retain data retained in the flip-flop in a state where supply of a power supply voltage is stopped when the CPU does not operate.

11. The semiconductor device according to claim 9, wherein the arithmetic circuit performs a product-sum operation.

12. The semiconductor device according to claim 9, wherein the first transistor is electrically connected to a read bit line, and wherein the read bit line is electrically connected to the arithmetic circuit through a wiring substantially perpendicular to a substrate with the second transistor.

13. The semiconductor device according to claim 1, wherein the CPU and the accelerator are electrically connected to each other through a bus.

14. The semiconductor device according to claim 5, wherein the CPU and the accelerator are electrically connected to each other through a bus.

15. The semiconductor device according to claim 9, wherein the CPU and the accelerator are electrically connected to each other through a bus.

* * * * *